(12) United States Patent
Takatani et al.

(10) Patent No.: US 9,064,704 B2
(45) Date of Patent: Jun. 23, 2015

(54) INTEGRATED CIRCUITS WITH ESD PROTECTION DEVICES

(71) Applicant: WIN Semiconductors Corp., Tao Yuan Shien (TW)

(72) Inventors: Shinichiro Takatani, Tao Yuan Shien (TW); Jung-Tao Chung, Tao Yuan Shien (TW); Chih-Wei Wang, Tao Yuan Shien (TW); Cheng-Guan Yuan, Tao Yuan Shien (TW); Shih-Ming Joseph Liu, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 147 days.

(21) Appl. No.: 13/768,263

(22) Filed: Feb. 15, 2013

(65) Prior Publication Data

US 2014/0231875 A1 Aug. 21, 2014

(51) Int. Cl.
*H02H 3/22* (2006.01)
*H01L 27/02* (2006.01)
*H01L 23/60* (2006.01)
*H01L 23/64* (2006.01)

(52) U.S. Cl.
CPC ............ *H01L 27/0266* (2013.01); *H01L 23/60* (2013.01); *H01L 23/642* (2013.01); *H01L 23/647* (2013.01)

(58) Field of Classification Search
USPC .................................................... 361/56, 111
See application file for complete search history.

(56) References Cited

U.S. PATENT DOCUMENTS

| 6,642,578 | B1 * | 11/2003 | Arnold et al. ................. 257/341 |
| 2008/0043388 | A1 * | 2/2008 | Kohama .......................... 361/56 |
| 2008/0074814 | A1 * | 3/2008 | Bhattacharya et al. ......... 361/56 |
| 2014/0084347 | A1 * | 3/2014 | Salcedo et al. ................ 257/195 |
| 2014/0146425 | A1 * | 5/2014 | Kim et al. ....................... 361/56 |

* cited by examiner

*Primary Examiner* — Danny Nguyen
(74) *Attorney, Agent, or Firm* — Muncy, Geissler, Olds & Lowe, P.C.

(57) ABSTRACT

An integrated circuit with ESD protection comprises at least one ESD protection circuit block, which comprises a DC blocking capacitor connected in parallel with at least one compound semiconductor enhancement mode FET as an ESD protection device. The ESD protection circuit block that is built in an integrated circuit provides ESD protection while minimizing the generation of unwanted nonlinear signals resulting from the ESD protection. An integrated circuit comprises a high frequency circuit, a switching element, and two ESD protection circuit blocks, in which the high frequency circuit is connected between a first terminal and a second terminal for inputting or outputting the RF signals, the first ESD protection circuit block is connected from a branch node between the first terminal and the high frequency circuit to the switching element, and the second ESD protection circuit block is connected from the switching element to the ground.

20 Claims, 49 Drawing Sheets

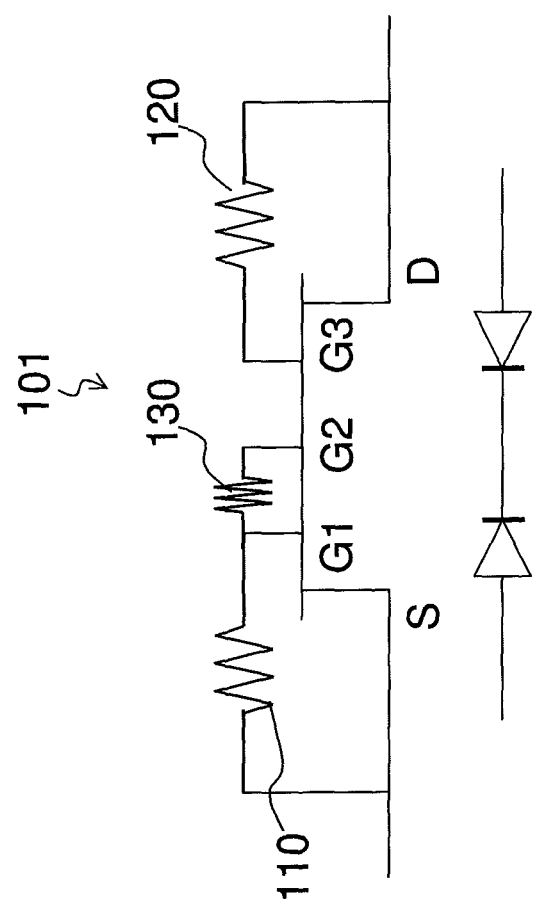

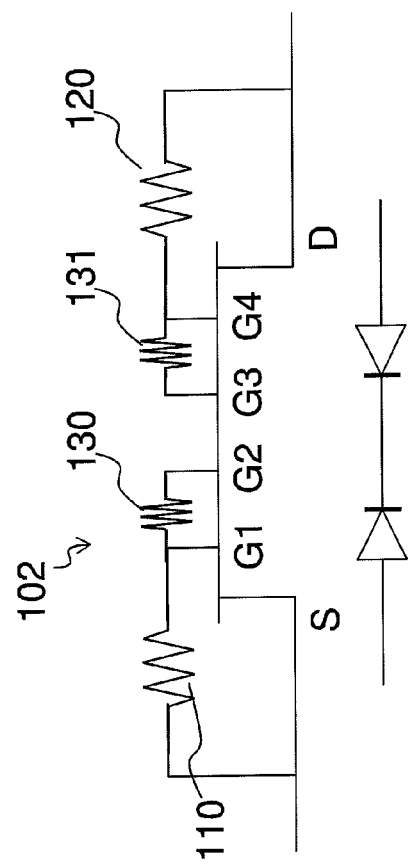
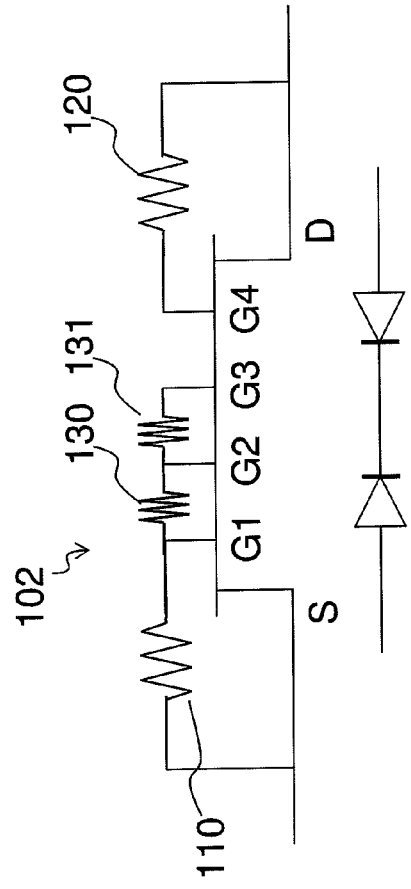
FIG. 3D
FIG. 3E

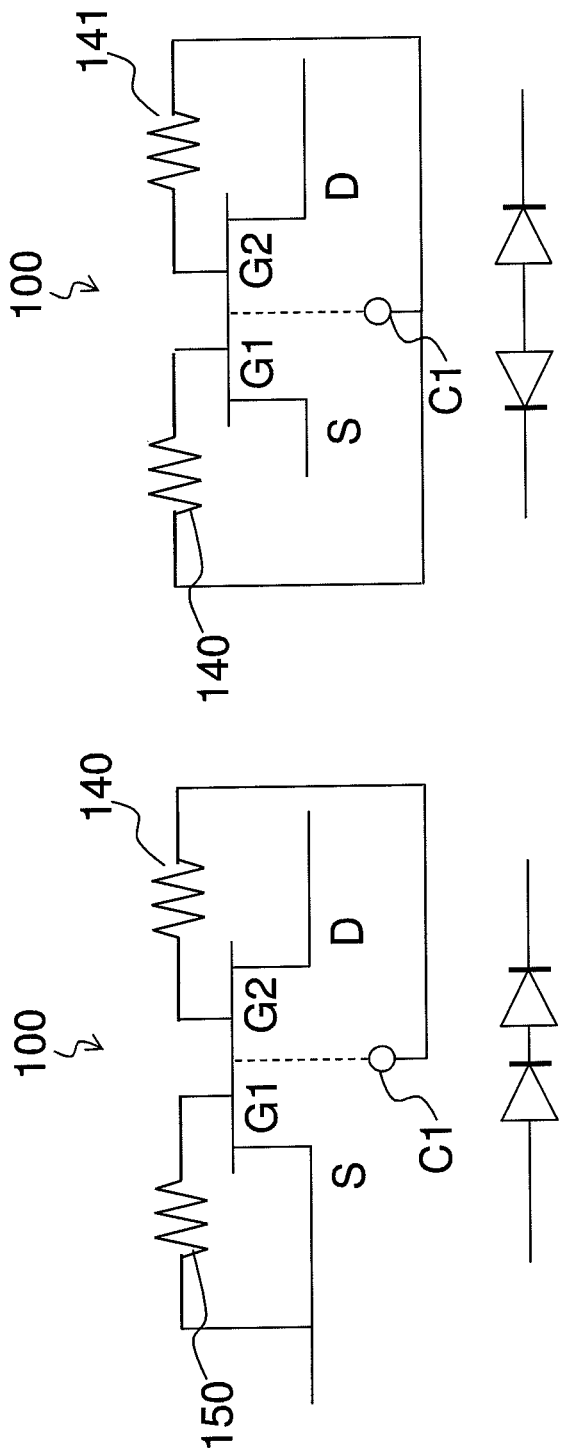

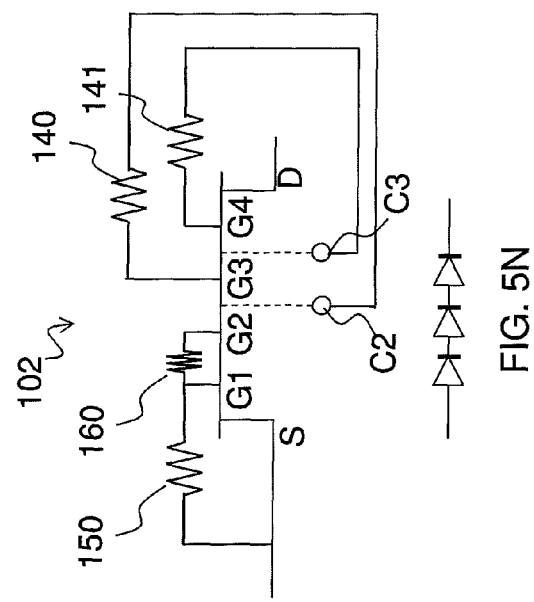
FIG. 5N
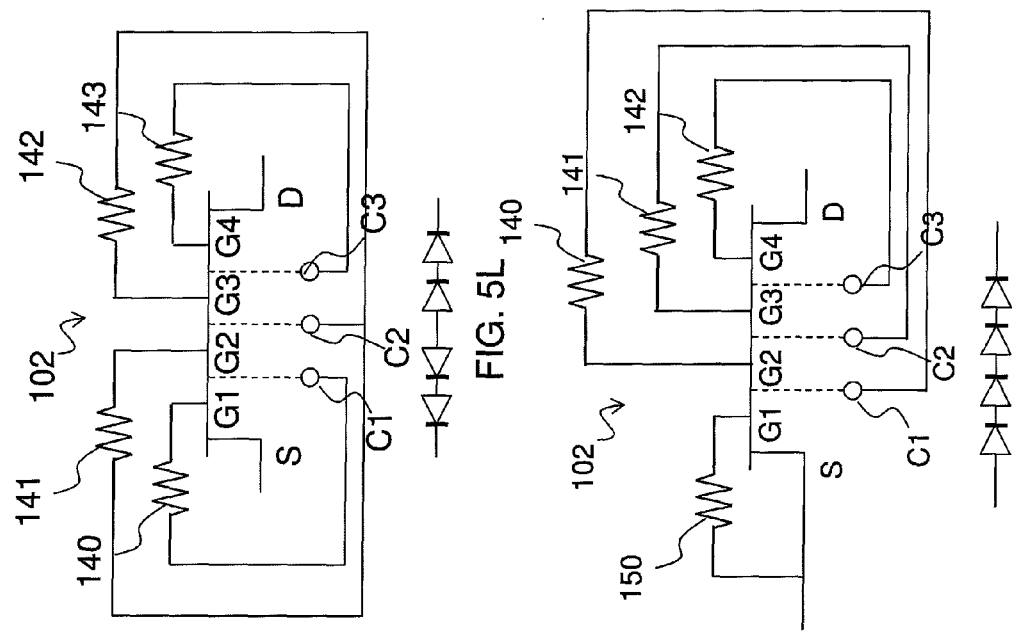
FIG. 5L
FIG. 5M

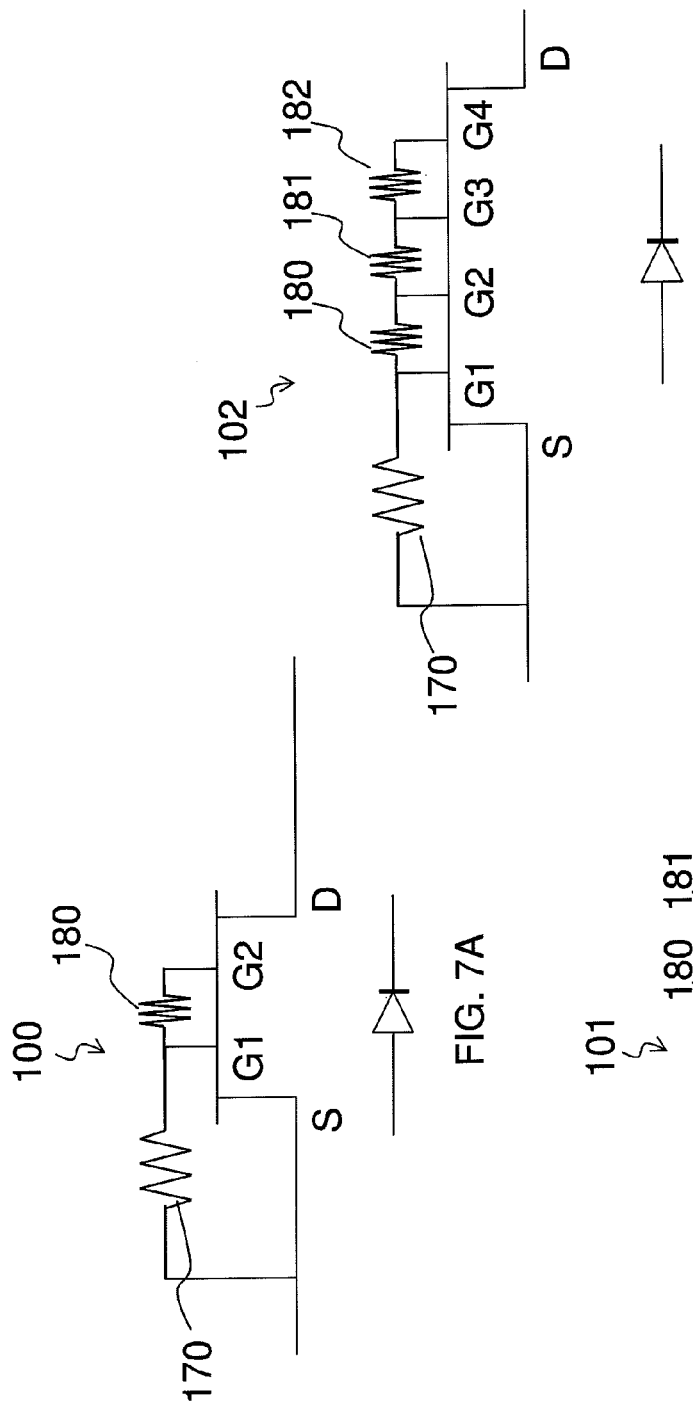

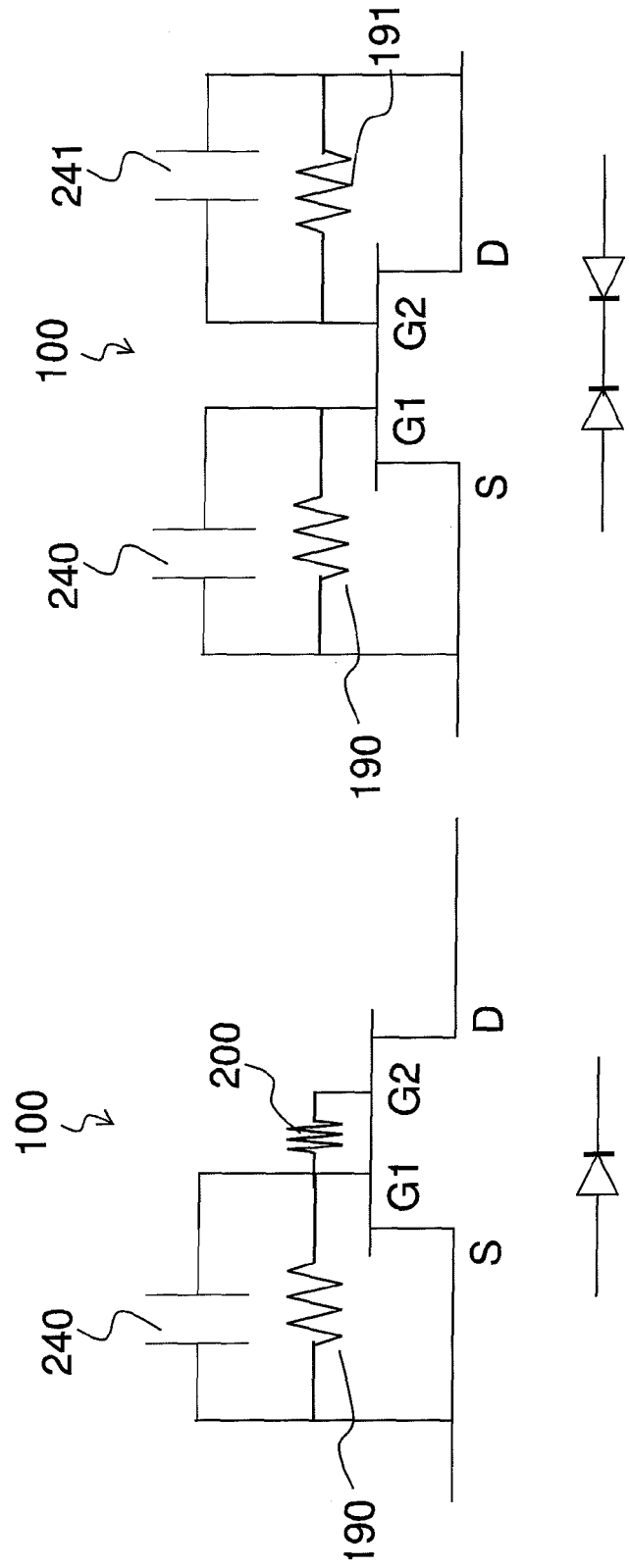

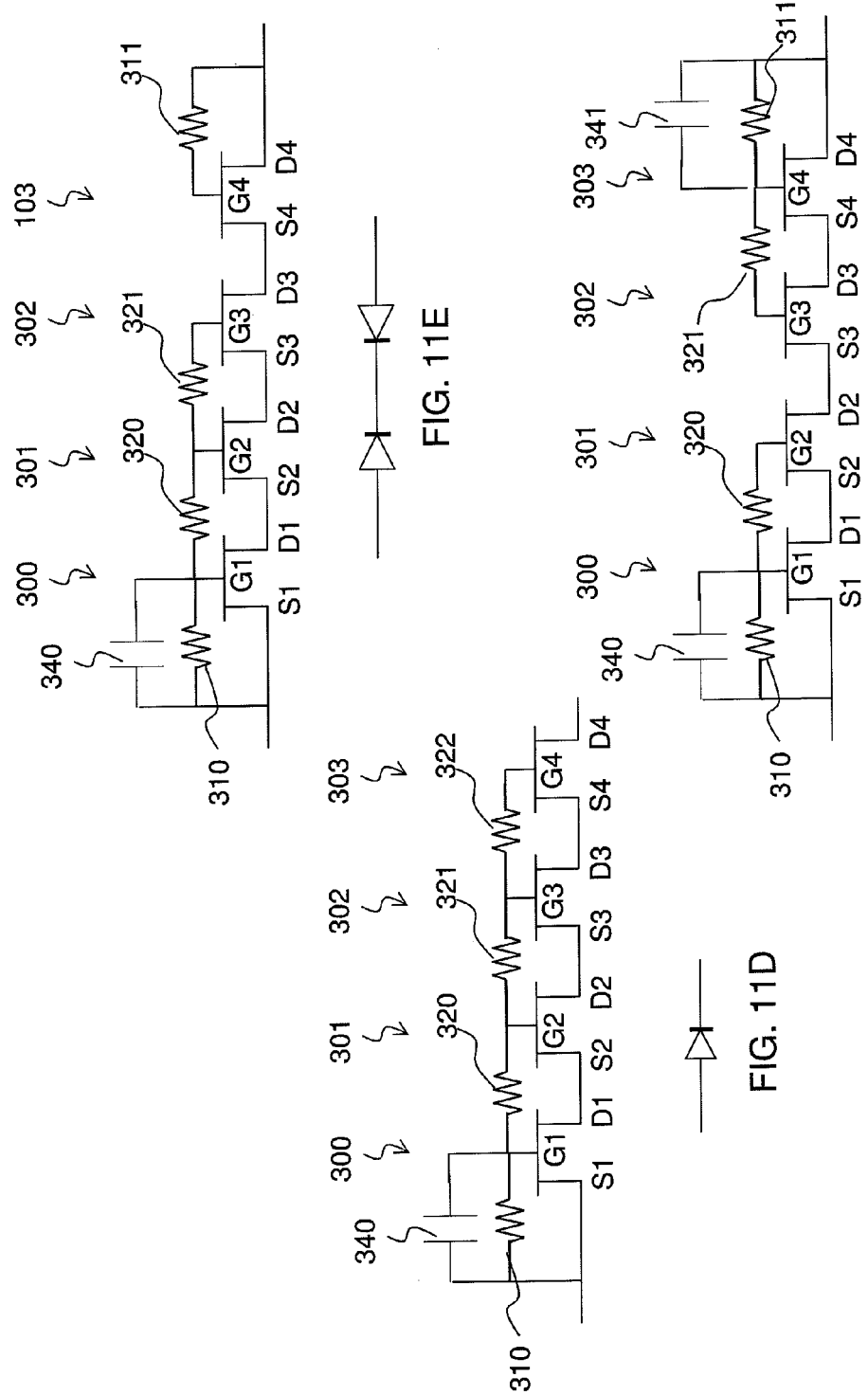

Series connected E-FET with the same opposite

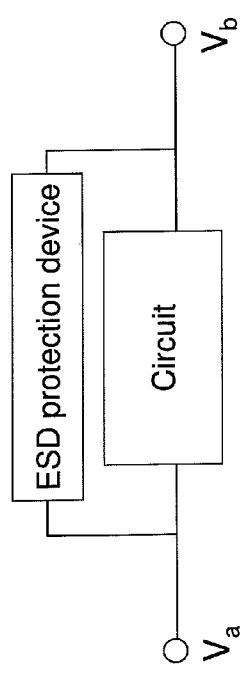
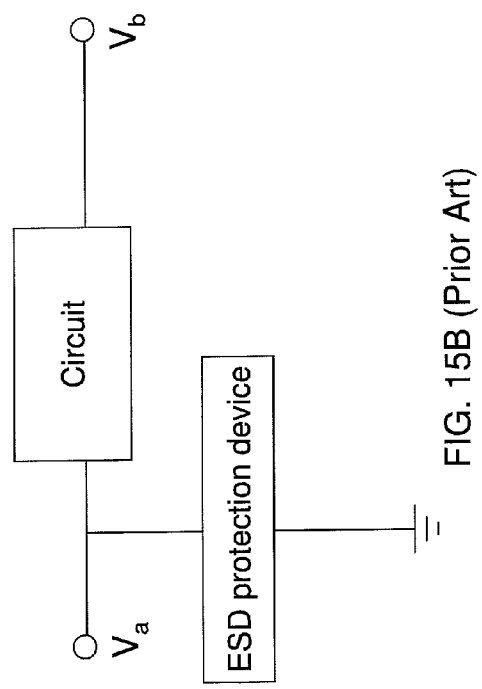
FIG. 15A (Prior Art)
FIG. 15B (Prior Art)

INTEGRATED CIRCUITS WITH ESD PROTECTION DEVICES

FIELD OF THE INVENTION

The present invention relates to integrated circuits with electrostatic discharge (ESD) protection devices, and more particularly, to compound semiconductor monolithic microwave and millimeter wave high frequency circuits using compound semiconductor ESD protection devices.

BACKGROUND OF THE INVENTION

An integrated circuit (IC) connected to external terminals is vulnerable to electrostatic discharge (ESD) pulses from the operating environment and peripherals such as human bodies or machines. An ESD event may produce high current or high voltage pulses within a few nanoseconds, leading to device degradation or damage. In order to protect the vulnerable IC from ESD damaging pulses, an ESD protection circuit has to be connected to the external terminals of main. IC elements.

Compound semiconductor devices have been widely used in the radio frequency (RF) circuits market. For example, compound semiconductor high electron mobility transistor (HEMT) switch have been widely applied in 3G cell phone applications in recent year for their high performance in RF range. However, the lack of good ESD protection devices has become a major drawback in HEMT switch applications. Conventionally, ESD protection circuits are made of series-connected diodes. A single enhancement-mode FET (E-FET) with the gate connected to the source with a resistor can act as an E-FET diode with different turn-on voltage for forward and reverse bias voltage $V_{on\_forward}$ and $V_{on\_reverse}$, as shown in FIG. 14A. The $V_{on\_forward}$ is small and is equal to the pinch-off voltage of the E-FET, and the $V_{on\_reverse}$ is large and is determined by the voltage drop across the resistor due to the reverse gate leakage current. The $V_{on\_reverse}$ can be adjusted to some extent by using a resistor with different resistance. An E-FET with its gate connected to the source by a resistor can thus be used as an ESD protection device. As shown in FIG. 14B, the positive and negative turn-on voltages ($V_{on\_p}$ and $V_{on\_n}$) can be multiplied by series connection of more than two E-FET diodes in the same direction. If two diodes are connected in opposite directions, both the positive and negative turn-on voltages ($V_{on\_p}$ and $V_{on\_n}$) are determined by the reverse turn-on voltage of the single diode as shown in FIG. 14C. By applying series connected E-FET diodes for each direction, both of the overall positive and negative turn-on voltage can be adjusted (FIG. 14D).

Consider a circuit with an ESD protection device using E-FET diodes, as shown in FIG. 15A. For the ESD protection device to remain turned off during the circuit operation, $V_{on\_P}$ and $V_{on\_N}$ must satisfy the equations below at any instance:

$$V_{on\_N} < V_b - V_a < V_{on\_P},$$

where $V_a$ and $V_b$ are voltages at the two terminals of the circuit under operation. For the case shown in FIG. 15B, $V_{on\_P}$ and $V_{on\_N}$ must satisfy the equations below at any instance:

$$V_{on\_N} < V_a < V_{on\_P}.$$

To meet the above conditions, the number of series connected E-FET diodes needed could be large. With increasing number of diodes connected in series in the same direction and/or the opposite direction, the area occupied by the whole ESD protection device becomes large, which results in the increase in the total chip size.

Even when the above criteria are met, the ESD protection device often generates unwanted nonlinear signal and degrades the circuit performance. The reduction of nonlinear signal from the ESD protection devices is essential for circuits requiring the high linearity, such as those used for antenna switches in mobile communication systems.

SUMMARY OF THE INVENTION

The main object of the present invention is to provide ESD protection circuits with high linearity using compound semiconductor FETs. The integrated circuits can be included in a compound semiconductor high frequency circuit to reduce the overall module size.

Another object of the present invention is to provide an ESD protection circuit block, which comprises a DC blocking capacitor connected in parallel with an ESD protection device. The DC blocking capacitor passes an RF signal while blocking a DC signal. The ESD protection device provides a path for an ESD current. The ESD protection device is chosen so that the nonlinear signal generated by the RF signal across the ESD protection device is kept low.

Another object of the present invention is to provide integrated circuits with ESD protection devices using compound semiconductor multi-gate E-FET diodes. The total device area for the ESD protection circuit can be made smaller, and the chip size of the compound semiconductor high frequency circuit can be reduced.

To reach the objectives stated above, the present invention provides an integrated circuit comprising at least one ESD protection circuit block. The ESD protection circuit block comprises a DC blocking capacitor connected between a first point and a second point, and at least one compound semiconductor ESD protection device connected between the first point and the second point in parallel with the DC blocking capacitor.

The ESD protection circuit block mentioned above can be taken as a building block of an integrated circuit. It can be built in the integrated circuit and provide a path for the RF signal and ESD current while blocking a DC signal. Based on this idea, the present invention provides an integrated circuit comprising a high frequency circuit, a switching element, and two ESD protection circuit blocks, in which the high frequency circuit is connected between a first terminal and a second terminal for inputting or outputting the radio frequency signals, the first point of the first ESD protection circuit block is connected to a branch node between the first terminal and the high frequency circuit and the second point of the first ESD protection circuit block is connected to one terminal of the switching element, and the first point of the second ESD protection circuit block is connected to the other terminal of the switching element and the second point of the second ESD protection circuit block is connected to the ground. The ESD current that enters into the first terminal passes through the two ESD protection circuit blocks to the ground, so that the high frequency circuit is protected from the ESD pulses.

The present invention also provides an integrated circuit comprising a third ESD protection circuit block that is added to the aforementioned integrated circuit, in which the first point of the third ESD protection circuit block is connected to the first terminal and the second point of the third ESD protection circuit block is connected to the branch node between the first terminal and the high frequency circuit.

The RF amplitude across the ESD protection device in the ESD protection circuit block can be made small compared with the conventional case shown in FIG. 15B, in which the ESD protection device directly connects the terminal to the ground. Thus, the nonlinear signal generated as a result of ESD protection can be made smaller than the conventional ESD protection circuit design.

In the aforementioned integrated circuits, at least one of the ESD protection circuit blocks uses one of the following five types of compound semiconductor ESD protection devices for achieving the high linearity and the small chip size:

The type I compound semiconductor ESD protection device comprises a multi-gate E-FET, at least one first resistor, and at least one second resistor. The multi-gate E-FET comprises a source electrode, a drain electrode, and plural gate electrodes disposed between the source and drain electrodes. The source electrode is connected to at least one of the plural gate electrodes through the at least one first resistor, and the drain electrode is connected to at least one of the plural gate electrodes through the at least one second resistor.

The type I compound semiconductor ESD protection device described above may further include at least one third resistor connecting two gate electrodes among the plural gate electrodes. Through one of the at least one third resistor, a gate electrode is connected to another gate electrode that is directly or indirectly connected to the source or drain electrodes, so that the gate electrode can be connected to the source or drain electrodes directly or indirectly as well.

The type II compound semiconductor ESD protection device provided by the present invention comprises a multi-gate E-FET and at least one fourth resistor. The multi-gate E-FET comprises a source electrode, a drain electrode, and plural gate electrodes disposed between the source and drain electrodes. At least one of the plural gate electrodes is connected to at least one of the inter-gate regions between two adjacent gate electrodes through the at least one fourth resistor.

The type II compound semiconductor ESD protection device described above may further include at least one fifth resistor connecting at least one of the plural gate electrodes to the source or the drain electrodes.

The type II compound semiconductor ESD protection device described above may further include at least one sixth resistor connecting two gate electrodes among the plural gate electrodes. The function of the sixth resistor is the same as the third resistor. A gate electrode is connected to another gate electrode that is directly or indirectly connected to the source electrode, the drain electrode, or at least one of the inter-gate regions between two adjacent gate electrodes through one of the at least one sixth resistor, so that the gate electrode can be connected to the source electrode, the drain electrode, or at least one of the inter-gate regions between two adjacent gate electrodes directly or indirectly as well.

The type III compound semiconductor ESD protection device provided by the present invention comprises a multi-gate E-FET, at least one seventh resistor, and at least one eighth resistor. The multi-gate E-FET comprises a source electrode, a drain electrode, and plural gate electrodes disposed between the source and drain electrodes. The plural gate electrodes are connected to the source or drain electrodes through the at least one seventh resistor. The function of the eighth resistor is the same as the third resistor. A gate electrode is connected to another gate electrode that is directly or indirectly connected to the source or drain electrodes through one of the at least one eighth resistor, so that the gate electrode can be connected to the source or drain electrodes directly or indirectly as well.

The type IV compound semiconductor ESD protection device provided by the present invention comprises a multi-gate E-FET, at least one ninth resistor, and at least one gate capacitor. The multi-gate E-FET comprises a source electrode, a drain electrode, and plural gate electrodes disposed between the source and drain electrodes. Each of the plural gate electrodes is DC-connected to the source electrode, the drain electrode, or the inter-gate region between two adjacent gate electrodes through the at least one ninth resistor. At least one of the plural gate electrodes is AC-connected to the source electrode, the drain electrode, or the inter-gate region between two adjacent gate electrodes through the at least one gate capacitor.

The type IV compound semiconductor ESD protection device described above may further include at least one tenth resistor connecting two gate electrodes among the plural gate electrodes.

The type V compound semiconductor ESD protection device provided by the present invention comprises plural single-gate E-FETs, at least one eleventh resistor, and at least one gate capacitor. The plural single-gate E-FETs are connected in series. Each of the plural single-gate E-FETs comprises a source electrode, a drain electrode, and a gate electrode. The drain electrode of a single-gate E-FET is connected to the source electrode of a succeeding single-gate E-FET. The gate electrode of each of the plural single-gate E-FETs is DC-connected to the source or the drain electrodes of one of the plural single-gate E-FETs through the at least one eleventh resistor. The gate electrode of at least one of the plural single-gate E-FETs is AC-connected to the source or the drain electrodes of one of the plural single-gate E-FETs through the at least one gate capacitor.

The type V compound semiconductor ESD protection device described above may further include at least one twelfth resistor connecting two gate electrodes among the plural single-gate E-FETs.

In implementation, the source and drain electrodes are multi-finger electrodes interposed each other, and the plural gate electrodes can be multi-finger electrodes interposed each other disposed between the source and drain electrodes.

In implementation, the source and drain electrodes are multi-finger electrodes interposed each other, and the plural gate electrodes can be meandering gate electrodes disposed between the source and drain electrodes with the bend around portions of the meandering gate within the active region of the E-FET.

In implementation, the compound semiconductor ESD protection device in the ESD protection circuit block is an enhancement mode high electron mobility transistor (HEMT).

In implementation, the switching element comprises at least one depletion mode FET or HEMT.

In implementation, the circuit to be protected for ESD includes an RF switching circuit.

The present invention will be understood more fully by reference to the detailed description of the drawings and the preferred embodiments below.

BRIEF DESCRIPTION OF DRAWINGS

FIG. 3A-3E are circuit diagrams showing embodiments of the type I compound semiconductor ESD protection device provided by the present invention.

FIG. 7A-7C are circuit diagrams showing embodiments of the type III compound semiconductor ESD protection device provided by the present invention.

FIG. 11A-11G are circuit diagrams showing embodiments of the type V compound semiconductor ESD protection device provided by the present invention.

FIGS. 15A and 15B are schematics showing circuits with ESD protection devices using E-FET diodes.

DETAILED DESCRIPTIONS OF PREFERRED EMBODIMENTS

Figure 1A:
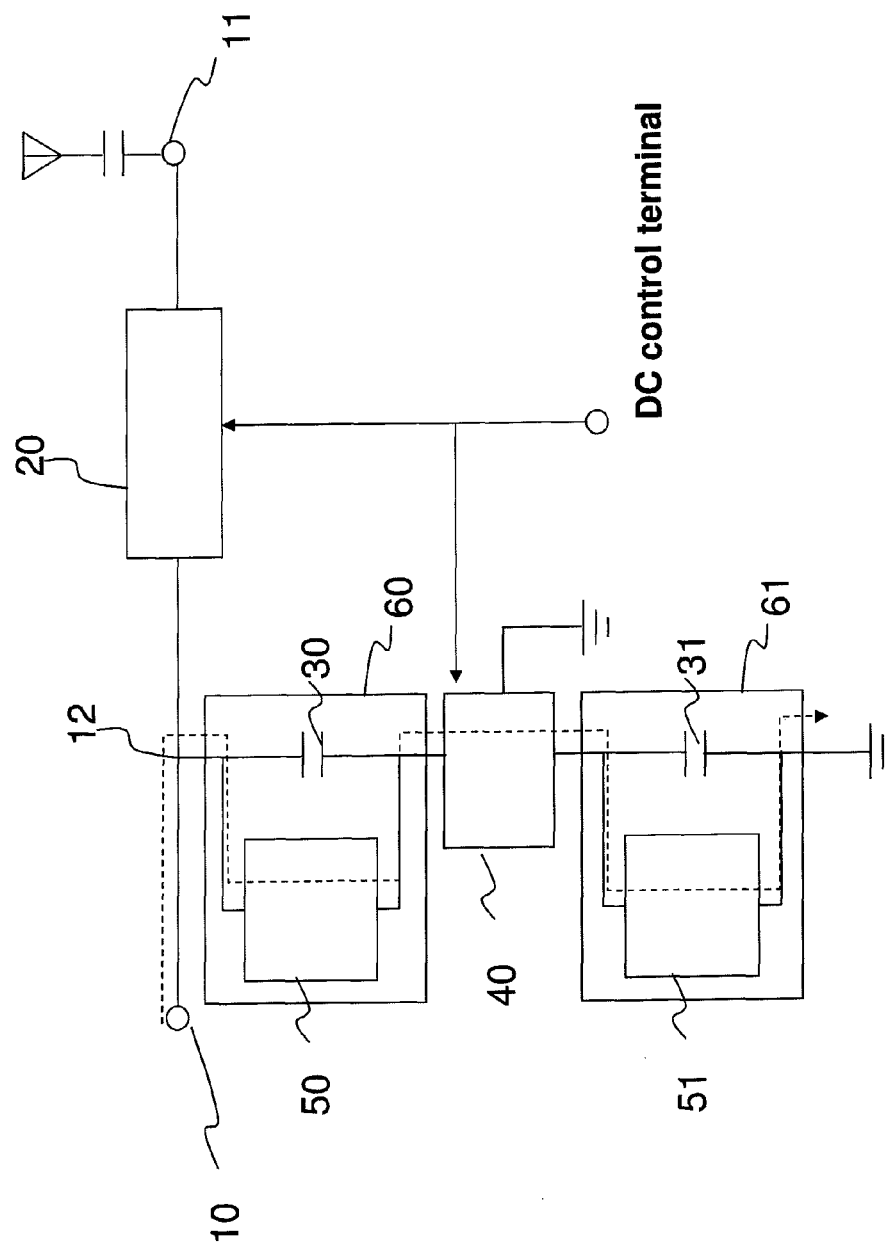
FIG. 1A is a circuit diagram showing an embodiment of an integrated circuit with ESD protection devices provided by the present invention.
Figure 1B:
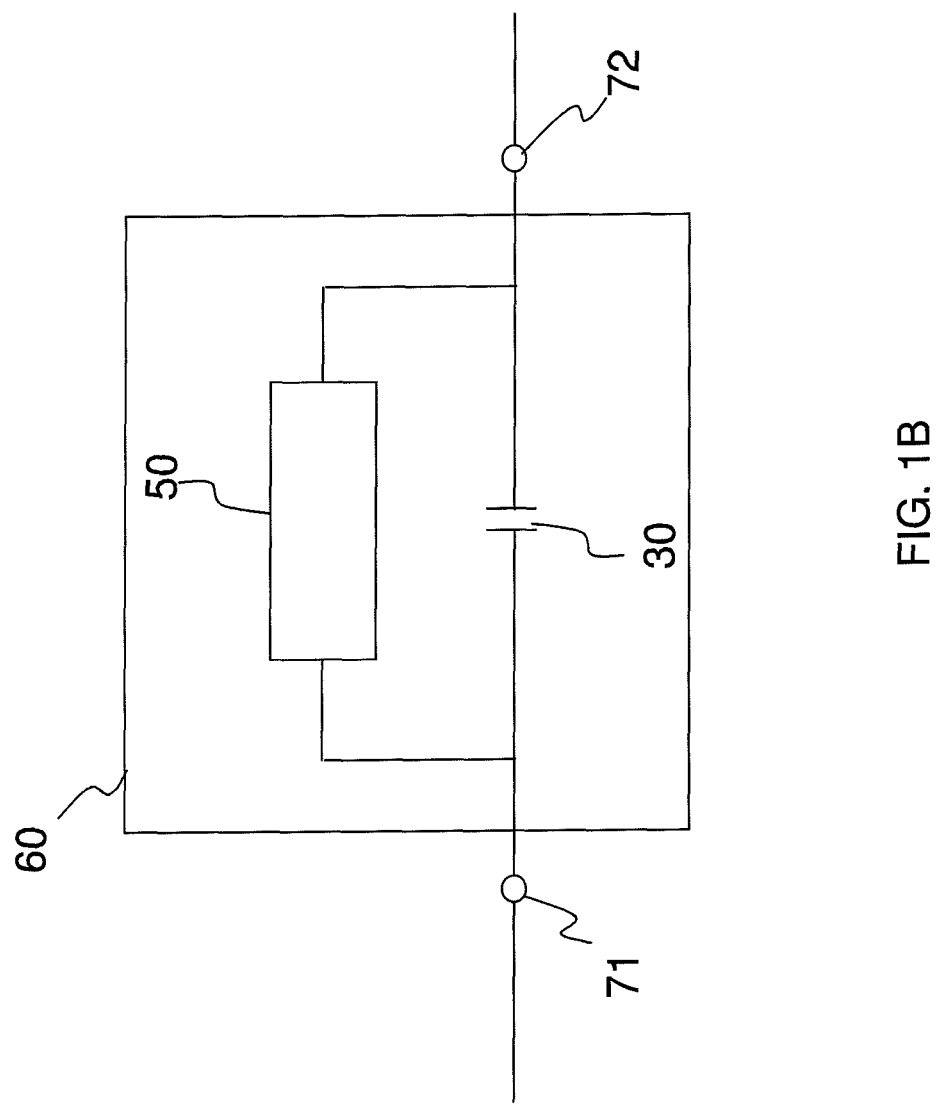
FIG. 1B is a circuit diagram showing an embodiment of an integrated circuit with ESD protection devices provided by the present invention.

FIG. 1B is a circuit diagram showing an embodiment of an ESD protection circuit block provided by the present invention. The integrated circuit comprises an ESD protection circuit block 60, which comprises a DC blocking capacitor 30 connected between a first point 71 and a second point 72, and at least one compound semiconductor ESD protection device 50 connected between the first point 71 and the second point 72 in parallel with the DC blocking capacitor 30.

FIG. 1A is a circuit diagram showing an embodiment of an integrated circuit with ESD protection devices provided by the present invention. The circuit comprises a high frequency circuit 20, a switching element 40, a first ESD protection circuit block 60, and a second ESD protection circuit block 61. The first ESD protection circuit block 60 comprises a first DC blocking capacitor 30 and a first compound semiconductor ESD protection device 50. The second ESD protection circuit block 61 comprises a second DC blocking capacitor 31 and a second compound semiconductor ESD protection device 51. The high frequency circuit 20 is connected between a first terminal 10 and a second terminal 11 for inputting or outputting the radio frequency signals. The first point of the first ESD protection circuit block 60 is connected to a branch node 12 between the first terminal 10 and the high frequency circuit 20, and the second point of the first ESD protection circuit block 60 is connected to one terminal of the switching element 40. The first point of the second ESD protection circuit block 61 is connected to the other terminal of the switching element 40, and the second point of the second ESD protection circuit block 31 is connected to the ground. The ESD current that enters into the I/O port passes through the first and second ESD protection devices and the switching element in the branch to the ground, as shown by the dashed arrow in FIG. 1A, so that the high frequency circuit is protected from the ESD current. Since a DC bias voltage is blocked by the DC blocking capacitor 30 and 31, the DC bias voltage of the RF line in the switching element 40 can be independently controlled, for example, by a bias voltage applied to the DC control terminal shown in FIG. 1A. Thus, the bias condition of the switching element 40 can be more freely designed. The second terminal 11 may be connected to an antenna for the case in which the high frequency circuit 20 is a series switch in an antenna switch circuit. The switching element 40 serves as a shunt switch, which is in the on-state when the series switch 20 in the off-state (both controlled by a bias voltage applied to the DC control terminal shown in FIG. 1A), thereby shunting the leakage RF signal from the series switch 20 to the ground.

Figure 2:
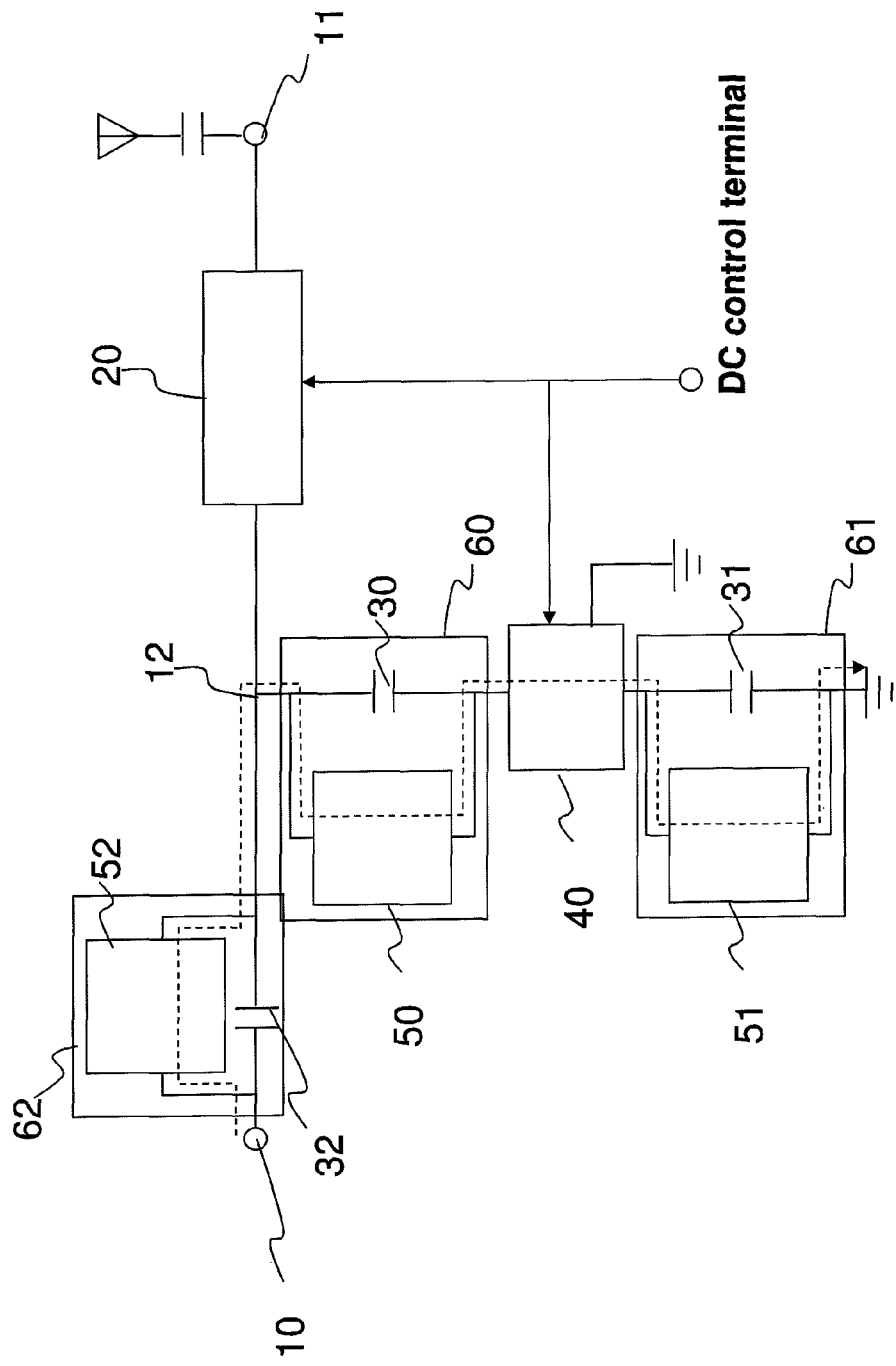
FIG. 2 is a circuit diagram showing another embodiment of an integrated circuit with ESD protection devices provided by the present invention.

FIG. 2 is a circuit diagram showing another embodiment of an integrated circuit with ESD protection devices provided by the present invention, which includes a third ESD protection circuit block 62 in the integrated circuit shown in FIG. 1A. The third ESD protection circuit block 62 comprises a third DC blocking capacitor 32 and a third compound semiconductor ESD protection device 52. The first point of the third ESD protection circuit block is connected to the first terminal 10, and the second point of the third ESD protection circuit block is connected to the branch node 12 between the first terminal 10 and the high frequency circuit 20. The ESD current enters into the I/O port passes through the first, second, and third ESD protection devices and the switching element in the branch to the ground, as shown by the dashed arrow in FIG. 2, so that the high frequency circuit is protected from the ESD current. In this embodiment, since the DC bias voltage is blocked by the DC blocking capacitor 32, the DC bias voltage of the RF line in the high frequency circuit 20 can be independently controlled, for example, by a bias voltage applied to the DC control terminal shown in FIG. 2.

The RF amplitude across the ESD protection devices 50, 51, and 52 in the ESD protection circuit blocks 60, 61, and 62, respectively, can be made small compared with the conventional case shown in FIG. 15B, in which the ESD protection device directly connects the terminal to the ground. Thus, the nonlinear signal generated as a result of ESD protection can be made smaller than the conventional ESD protection circuit design.

In the aforementioned integrated circuits, at least one of the first, second, and third ESD protection circuit block uses one of the following five types of compound semiconductor ESD protection devices for achieving the high linearity and the small chip size:

Type I Compound Semiconductor ESD Protection Device

FIG. 3A~3E are circuit diagrams showing embodiments of the type I compound semiconductor ESD protection device provided by the present invention. The type I compound semiconductor ESD protection device is equivalent to a circuit having two diodes connected in opposite directions. The type I compound semiconductor ESD protection device comprises a multi-gate E-FET (100~402), at least one first resistor 110, and at least one second resistor 120. The multi-gate E-FET comprises a source electrode S, a drain electrode D, and plural gate electrodes (G1~G4) disposed between the source and drain electrodes. The source electrode S is connected to at least one of the plural gate electrodes through the at least one first resistor 110, and the drain electrode is connected to at least one of the plural gate electrodes through the at least one second resistor 120. In these embodiments, the type I ESD compound semiconductor protection device may further include one or more third resistors (130~131) for connecting two gate electrodes. The electrical connection of any two objects described throughout the specification includes a direct connection and an indirect connection, for instance, a gate electrode can be electrically connected to the source electrode directly by a first resistor or indirectly by connecting to another gate electrode that is directly connected to the source electrode by a first resistor.

Figure 3A:
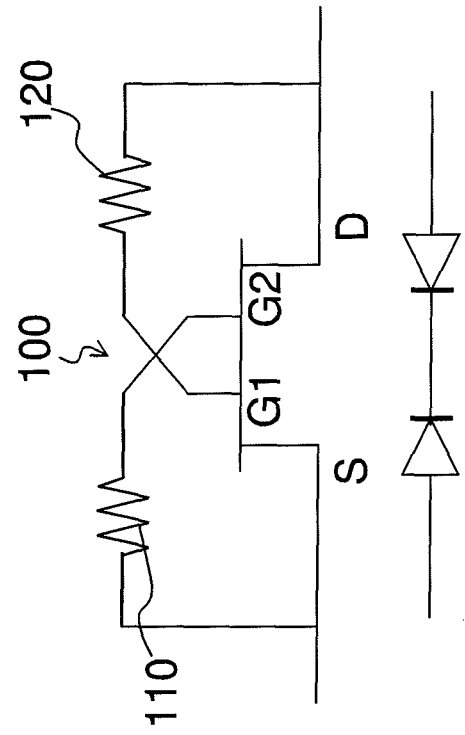
Figure 3B:
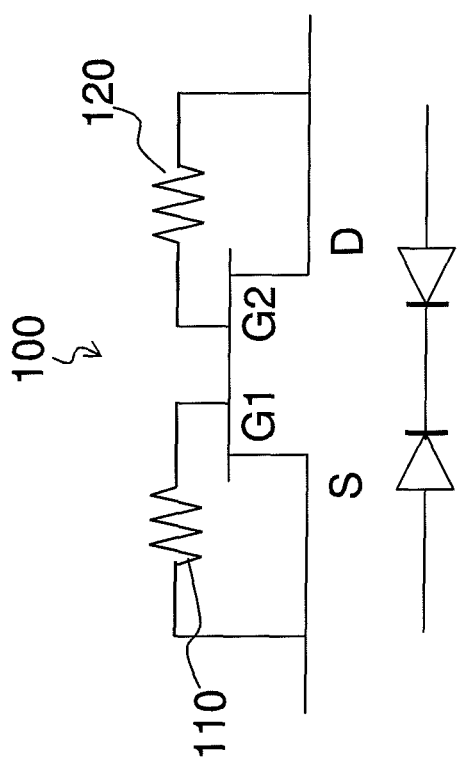

FIGS. 3A and 3B are circuit diagrams showing embodiments of the type I compound semiconductor ESD protection device using a dual-gate E-FET 100 provided by the present invention. In FIG. 3A, the source electrode S is connected to the gate electrode G1 through the first resistor 110, and the drain electrode D is connected to the gate electrode G2 through the second resistor 120. In FIG. 3B, the connections shown in FIG. 3A are over crossed: the source electrode S is connected to the distant gate electrode G2 instead through the first resistor 110, and the drain electrode D is connected to the gate electrode G1 instead through the second resistor 120. FIG. 3C is a circuit diagram showing an embodiment of the type I compound semiconductor ESD protection device using a triple-gate E-FET 101 provided by the present invention. The source electrode S is connected to the gate electrodes G1 through the first resistor 110, and to the gate electrodes G2 through the first resistor 110 and the third resistor 130. The drain electrode D is connected to the gate electrode G3 through the second resistor 120. FIGS. 3D and 3E are circuit diagrams showing embodiments of the type I compound semiconductor ESD protection device using a quadruple-gate E-FET 102 provided by the present invention. In FIG. 3D, the source electrode S is connected to the gate electrodes G1 through the first resistor 110, and to the gate electrodes G2 through the first resistor 110 and the third resistor 130. The drain electrode D is connected to the gate electrode G4 through the second resistor 120, and to the gate electrode G3 through the second resistor 120 and the third resistor 131. In FIG. 3E, the source electrode S is connected to the gate electrodes G1 through the first resistor 110, to the gate electrodes G2 through the first resistor 110 and the third resistor 130, and to the gate electrodes G3 through the first resistor 110 and the third resistor 130 and 131. The drain electrode D is connected to the gate electrode G4 through the second resistor 120.

Figure 4A:
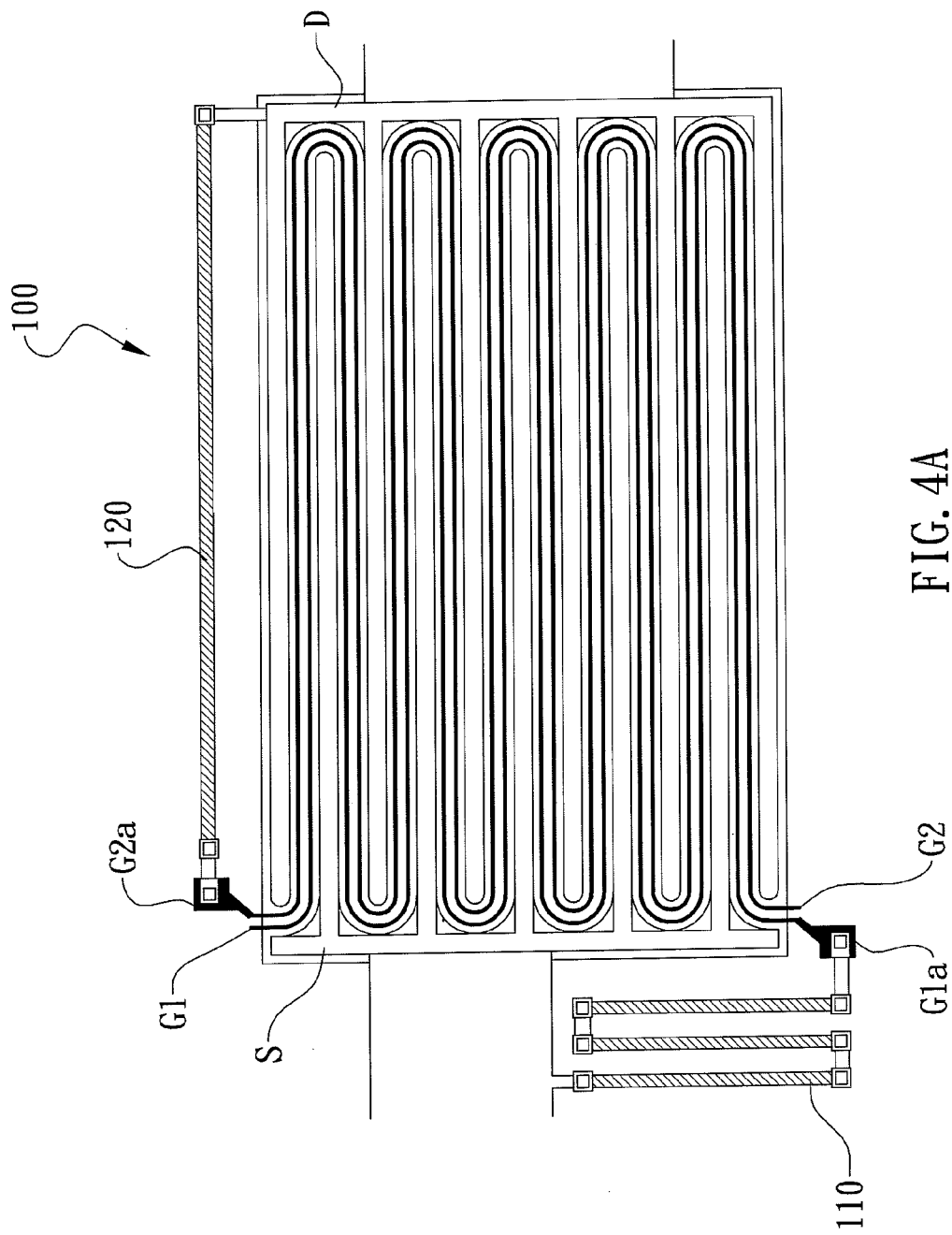
FIG. 4A-4D are schematics showing the plan view of embodiments of the circuit diagrams selected form those shown in FIG. 3A-3E provided by the present invention.

An implementation of the circuit diagram shown in FIG. 3A is shown in FIG. 4A. In this implementation, the source electrode S and the drain electrode D are multi-finger electrodes with their fingers interposed each other. The dual gates electrodes are meandering gate electrodes disposed on the space between each pair of the source and drain electrode fingers. An electrode pad wider than the width of a gate electrode may be disposed at the end of each of the gate electrodes for the electrical connection to other electrical elements. In this implementation, gate electrode pads G1a and G2a are disposed at one end of gate electrodes G1 and G2, respectively. The first resistor 110 is connected to the gate electrode pad G1a and the source electrode S. The second resistor 120 is connected to the gate electrode pad 131a and the drain electrode D.

Figure 4B:
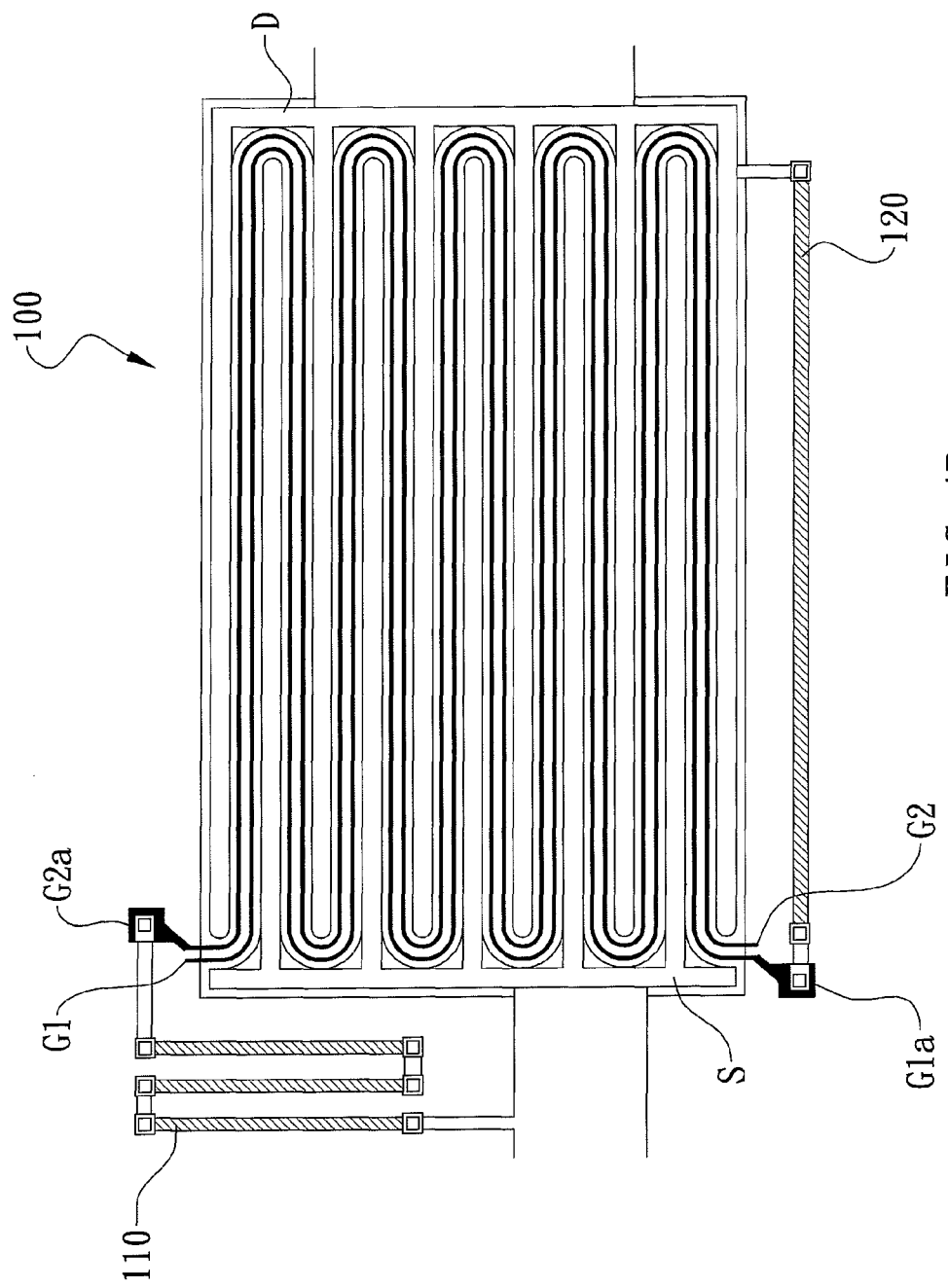
Figure 4C:
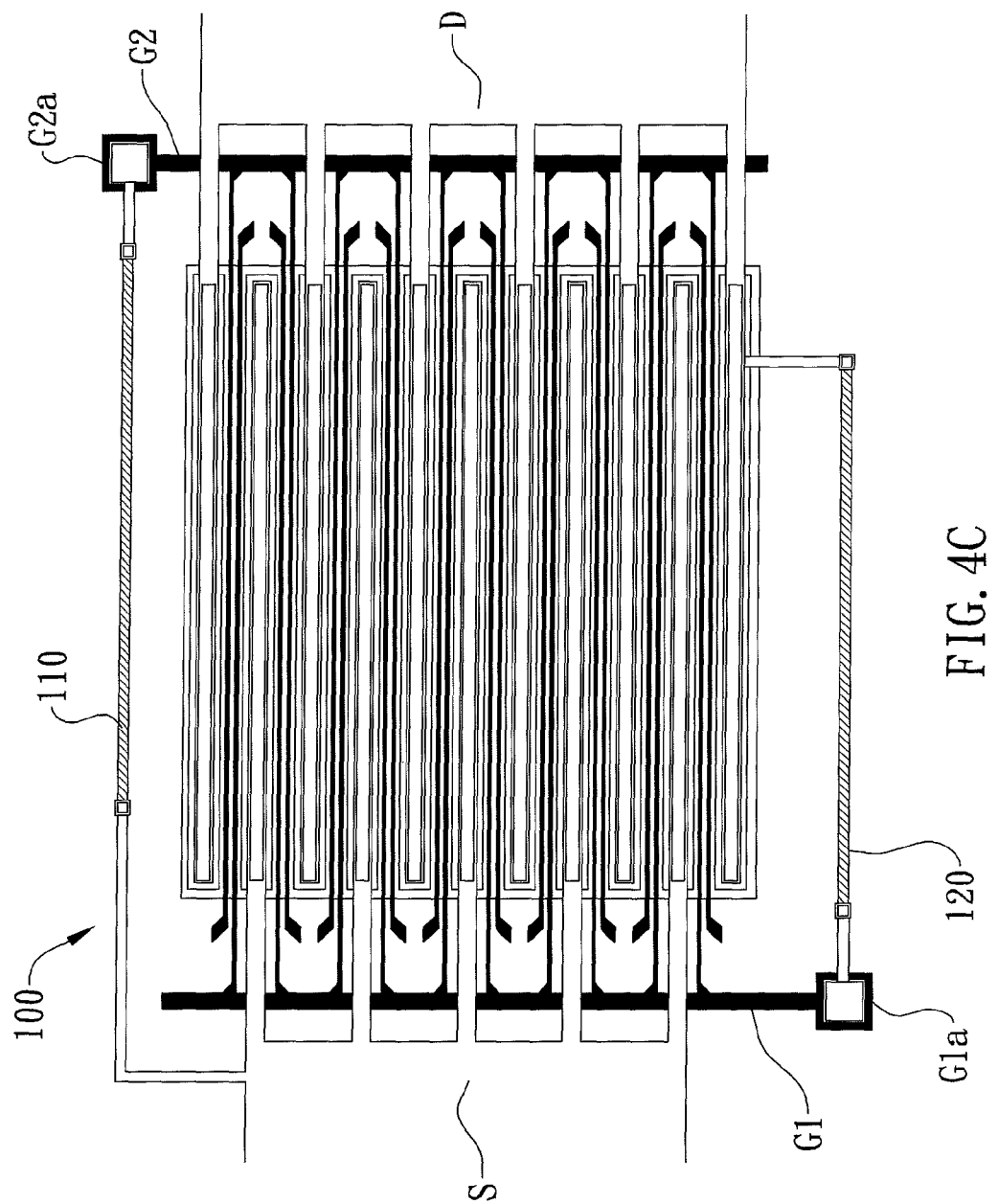

FIG. 4B shows an implementation of the circuit diagram shown in FIG. 3B, which has the similar scheme to the implementation shown in FIG. 4A. FIG. 4C shows another implementation of the circuit diagram shown in FIG. 3B. The source electrode S and the drain electrode D are multi-finger electrodes with their fingers interposed each other. The dual gates electrodes G1 and G2 are multi-finger electrodes interposed each other disposed between each pair of a source and a drain electrode fingers. The gate electrode pads G1a and G2a are provided at one end of the gate electrodes G1 and G2, respectively. The first resistor 110 is connected to the gate electrode pad G2a and the source electrode S. The second resistor 120 is connected to the gate electrode pad G1a and the drain electrode D.

Figure 4D:
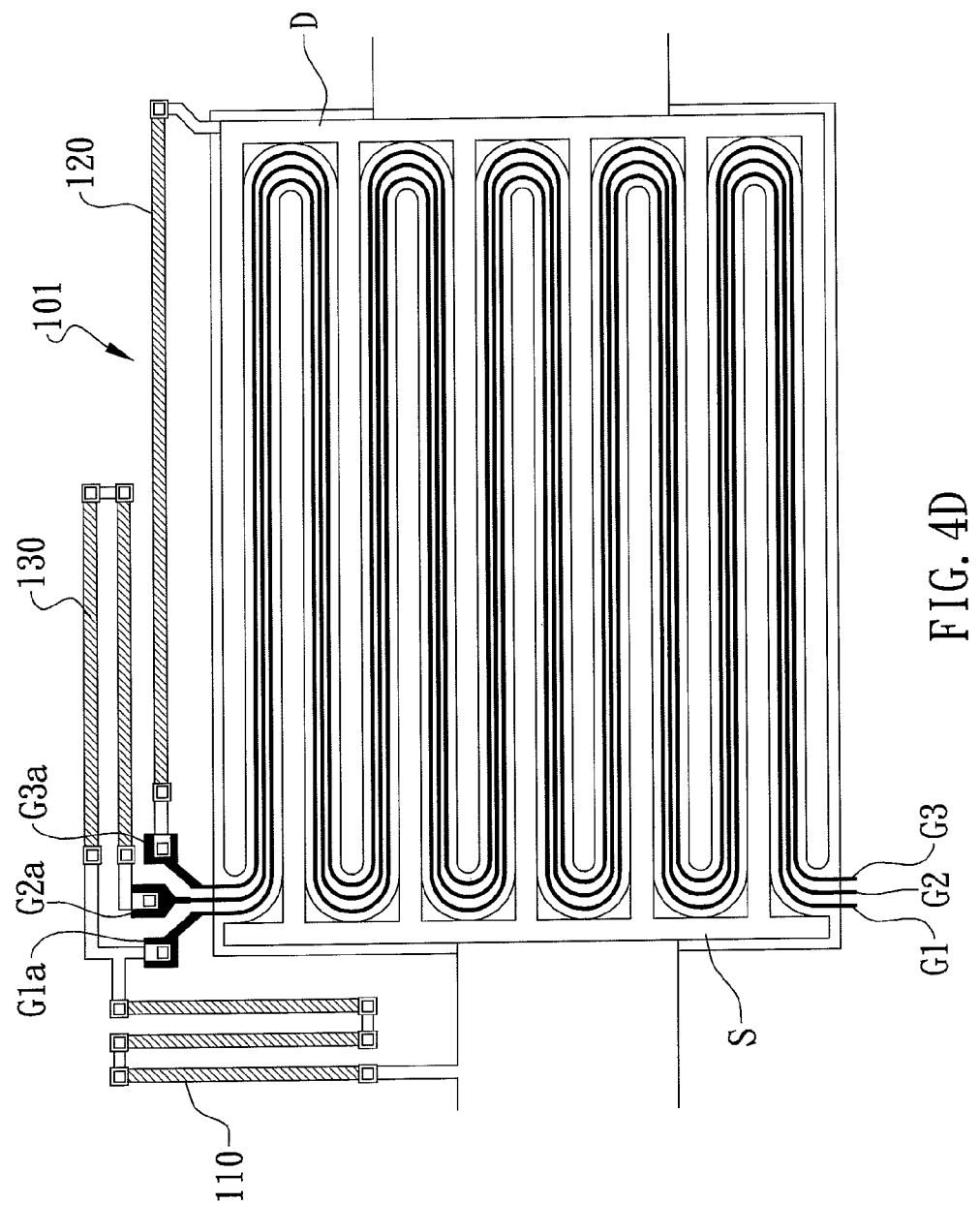

FIG. 4D shows an implementation of the circuit diagram shown in FIG. 3C, which has the similar scheme to the implementation shown in FIG. 4A, except that the E-FET is a triple-gate E-FET. Gate electrode pads G1a, G2a, and G3a are disposed at one end of the gate electrodes G1, G2, and G3, respectively. The first resistor 110 is connected to the gate electrode pad G1a and the source electrode S. The second resistor 120 is connected to the gate electrode pad G3a and the drain electrode D. The third resistor 130 is connected between the gate electrode pads G1a and G2a.

Type II ESD Compound Semiconductor Protection Device

FIG. 5A~5N are circuit diagrams showing embodiments of the type II compound semiconductor ESD protection device provided by the present invention. An equivalent circuit of diodes is provided at the bottom of each figure. The type II compound semiconductor ESD protection device comprises a multi-gate E-FET (100~102) and at least one fourth resistor (140~143). The multi-gate E-FET comprises a source electrode S, a drain electrode D, and plural gate electrodes (G1~G4) disposed between the source and drain electrodes. At least on of the plural gate electrodes are connected to at least one of the inter-gate regions between two adjacent gate electrodes through the at least one fourth resistor. In these embodiments, the type II ESD compound semiconductor protection device may further include one or more fifth resistors (150 and 151) connecting at least one of the plural gate electrodes to the source or drain electrodes. Moreover, the type II ESD compound semiconductor protection device may further include one or more sixth resistors (160 and 161) connecting two gate electrodes, so that a gate electrode can be connected indirectly through the one or more sixth resistors and a fourth or a fifth resistor to the source electrode, the drain electrode, or an inter-gate regions between two adjacent gate electrodes.

FIGS. 5A and 5B are circuit diagrams showing embodiments of the type II compound semiconductor ESD protection device using a dual-gate E-FET 100 provided by the present invention. In FIG. 5A, the gate electrode G1 is connected to the source electrode S through the fifth resistor 150, and the gate electrode G2 is connected to a connection node C1, disposed on the inter-gate region between gate electrodes G1 and G2 through the fourth resistor 140. In FIG. 5B, both gate electrodes G1 and G2 are connected to a connection node C1 disposed on the inter-gate region between gate electrodes G1 and G2 through the fourth resistors 140 and 141, respectively.

Figure 5E:
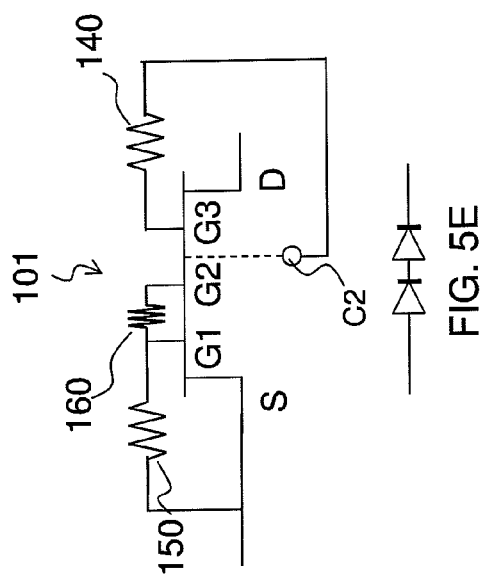
FIG. 5A-5N are circuit diagrams showing embodiments of the type II compound semiconductor ESD protection device provided by the present invention.
Figure 5C:
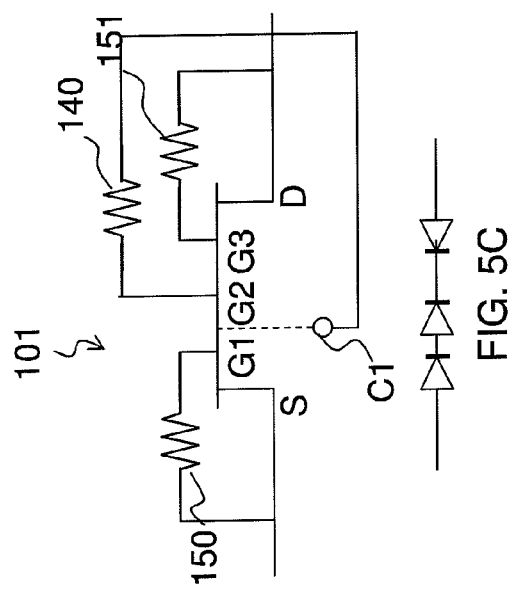
Figure 5D:
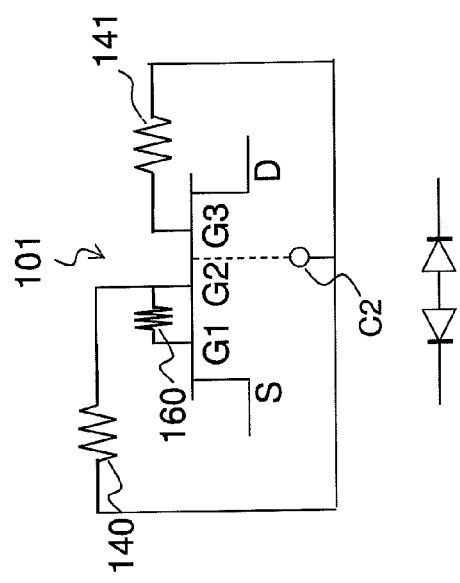
Figure 5G:
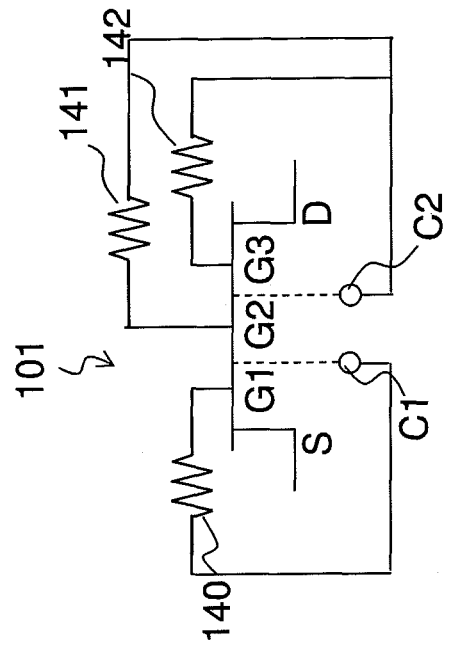
Figure 5F:
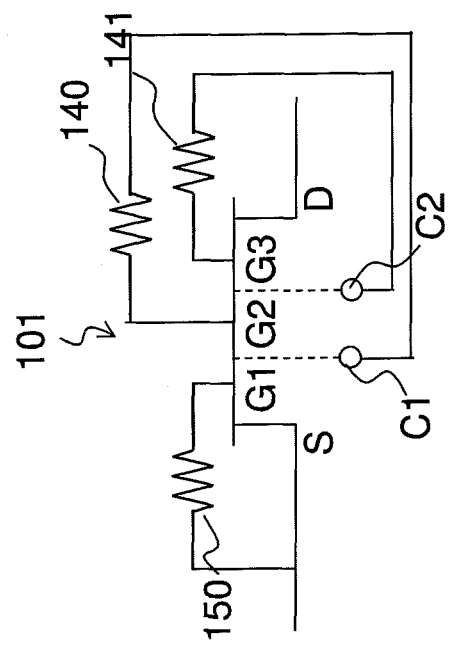

FIG. 5C~5G are circuit diagrams showing embodiments of the type II compound semiconductor ESD protection device using a triple-gate E-FET 101 provided by the present invention. In FIG. 5C, the gate electrode G1 is connected to the source electrode S through the fifth resistor 150, the gate electrode G3 is connected to the drain electrode D through the fifth resistor 151, and the gate electrode G2 is connected to a connection node C1 disposed on the inter-gate region between gate electrodes G1 and G2 through the fourth resistor 140. In FIG. 5D, both gate electrodes G2 and G3 are connected to a connection node C2 disposed on the inter-gate region between gate electrodes G2 and G3 through the fourth resistors 140 and 141, respectively, and the gate electrode G1 is connected to the connection node C2 through the sixth resistor 160 and the fourth resistor 140. In FIG. 5E, the gate electrode G1 is connected to the source electrode S through the fifth resistor 150, the gate electrode G2 is connected to the source electrode S through the fifth resistor 150 and the sixth resistor 160, and the gate electrode G3 is connected to a connection node C2 disposed on the inter-gate region between gate electrodes G2 and G3 through the fourth resistor 140. In FIG. 5F, the gate electrode G1 is connected to the source electrode through the fifth resistor 150, the gate electrode G2 is connected to a connection node C1 disposed on the inter-gate region between gate electrodes G1 and G2 through the fourth resistor 140, and the gate electrode G3 is connected to a connection node C2 disposed on the inter-gate region between gate electrodes G2 and G3 through the fourth resistor 141. In FIG. 5G, the gate electrode G1 is connected to a connection node C1 disposed on the inter-gate region between gate electrodes G1 and G2 through the fourth resistor 140, and gate electrodes G2 and G3 are connected to a connection node C2 disposed on the inter-gate region between gate electrodes G2 and G3 through the fourth resistors 141 and 142, respectively.

Figure 5H:
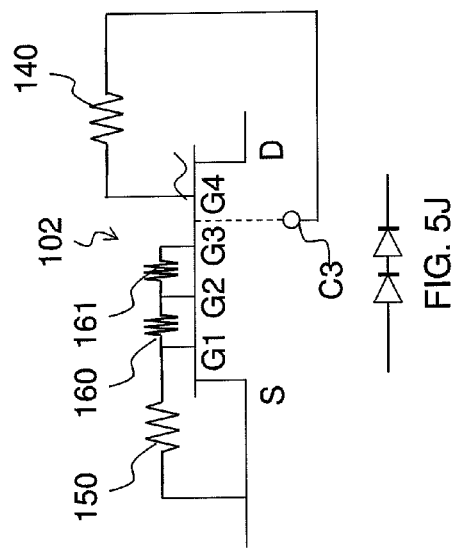
Figure 5I:
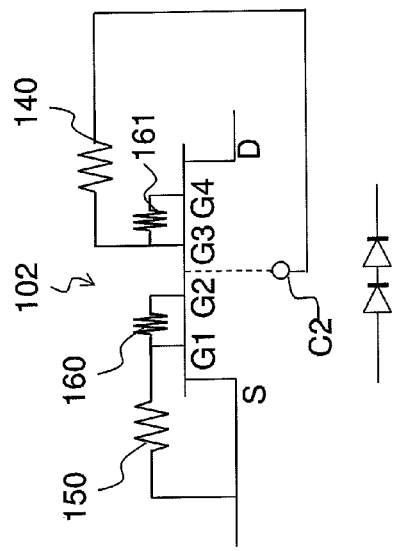
Figure 5J:
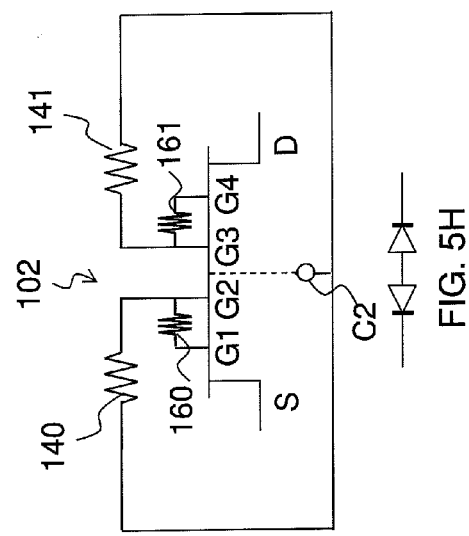
Figure 5K:
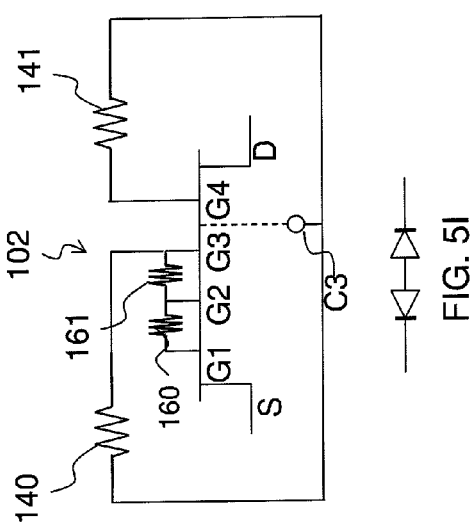

FIG. 5H~5N are circuit diagrams showing embodiments of the type II compound semiconductor ESD protection device using a quadruple-gate E-FET 102 provided by the present invention. In FIG. 5H, gate electrodes G2 and G3 are connected to a connection node C2 disposed on the inter-gate region between gate electrodes G2 and G3 through the fourth resistors 140 and 141, respectively, and gate electrodes G1 and G4 are connected to the connection node C1 by connecting to gate electrodes G2 and G3 through the sixth resistors 160 and 161, respectively. In FIG. 5I, gate electrodes G3 and G4 are connected to a connection node C3 disposed on the inter-gate region between gate electrodes G3 and G4 through the fourth resistors 140 and 141, respectively, and gate electrodes G1 and G2 are connected to the connection node C2 by connecting to the gate electrode G3 through the sixth resistors 160 and 161 and through the sixth resistor 161, respectively. In FIG. 5J, the gate electrode G1 is connected to the source electrode S through the fifth resistor 150, gate electrodes G2 and G3 are connected to the source electrode S by connecting to gate electrode G1 through the sixth resistor 160 and through the sixth resistors 160 and 161, respectively, and the gate electrode G4 is connected to a connection node C3 disposed on the inter-gate region between gate electrodes G3 and G4 through the fourth resistor 140. In FIG. 5K, the gate electrode G1 is connected to the source electrode S through the fifth resistor 150, the gate electrode G2 is connected to the source electrode S by connecting to the gate electrode G1 through the sixth resistor 160, the gate electrode G3 is connected to a connection node C2 disposed on the inter-gate region between gate electrodes G2 and G43 through the fourth resistor 140, and the gate electrode G4 is connected to the connection node C2 by connecting to the gate electrode G3 through the sixth resistor 161. In FIG. 5L, the gate electrodes G1 is connected to a connection node C1 disposed on the inter-gate region between gate electrodes G1 and G2 through the fourth resistor 140, the gate electrodes G2 and G3 are connected to a connection node C2 disposed on the inter-gate region between gate electrodes G2 and G3 through the fourth resistor 141 and 142, respectively, and the gate electrode G4 is connected to a connection node C3 disposed on the inter-gate region between gate electrodes G3 and G4 through the fourth resistor 143. In FIG. 5M, the gate electrode G1 is connected to the source electrode S through the fifth resistor 150, the gate electrode G2 is connected to a connection node C1 disposed on the inter-gate region between gate electrodes G1 and G2 through the fourth resistor 140, the gate electrode G3 is connected to a connection node C2 disposed on the inter-gate region between gate electrodes G2 and G3 through the fourth resistor 141, and the gate electrode G4 is connected to a connection node C3 disposed on the inter-gate region between gate electrodes G3 and G4 through the fourth resistor 142. In FIG. 5N, the gate electrodes G1 is connected to the source electrode S through the fifth resistor 150, the gate electrode G2 is connected to the source electrode S by connecting to the gate electrode G2 through the sixth resistor 160, the gate electrode G3 is connected to a connection node C2 disposed on the inter-gate region between gate electrodes G2 and G3 through the fourth resistor 140, and the gate electrode G4 is connected to a connection node C3 disposed on the inter-gate region between gate electrodes G3 and G4 through the fourth resistor 141.

FIG. 6A~6K show the various implementations of the circuit diagrams selected from FIG. 5A~5N. The scheme of the implementations are similar to that of the implementations of the type I compound semiconductor ESD protection device shown in FIG. 4A, in which the source electrode S and the drain electrode D are multi-finger electrodes with their fingers interposed each other, and the multi-gate electrodes are meandering gate electrodes disposed on the space between each pair of the source and drain electrode fingers. An electrode pad wider than the width of a gate electrode is provided at the end of each of the gate electrodes for the electrical connection to other electrical elements.

Figure 6A:
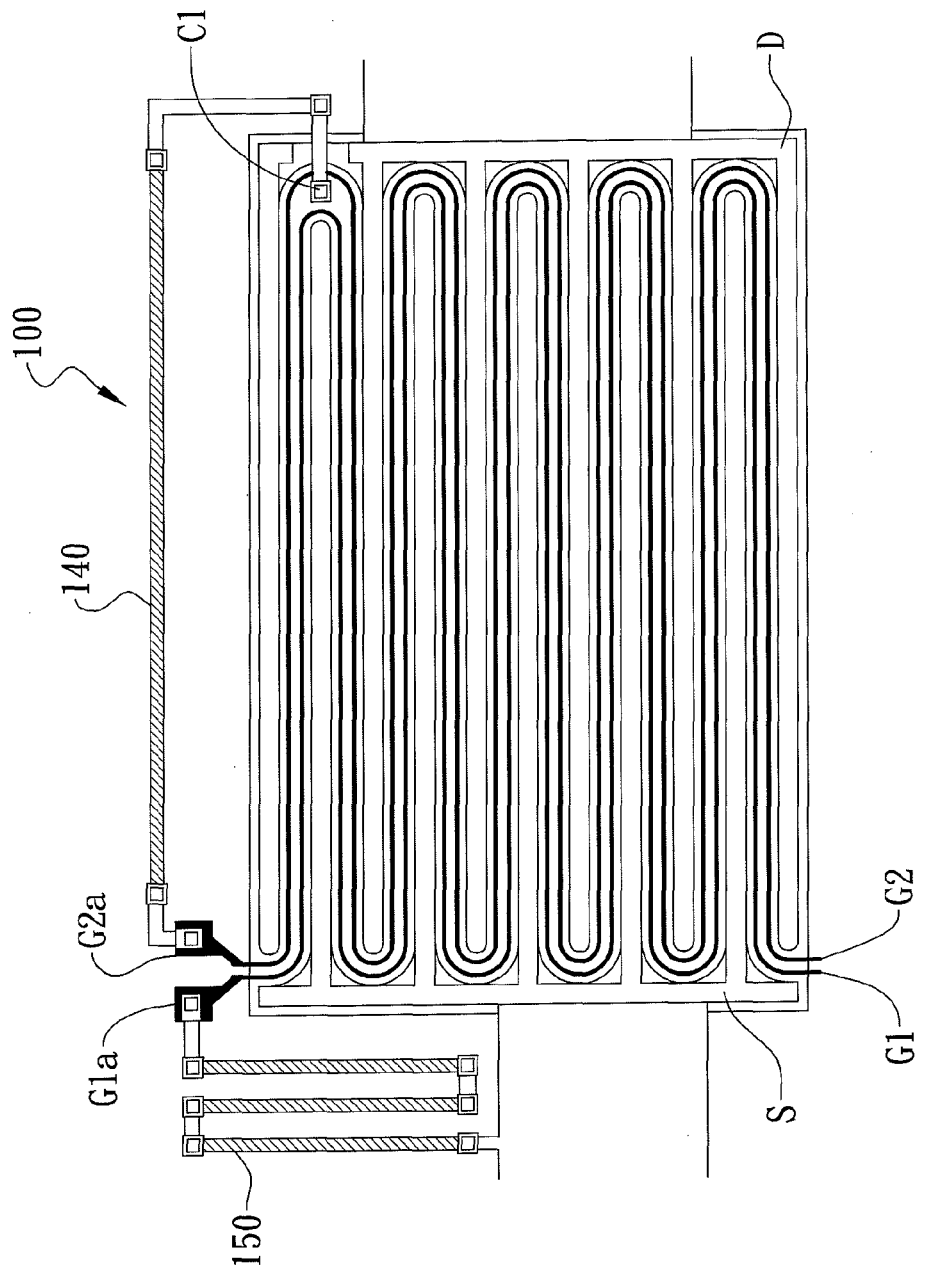
FIG. 6A-6K are schematics showing the plan view of embodiments of the circuit diagrams selected from those shown in FIG. 5A-5N provided by the present invention.
Figure 6B:
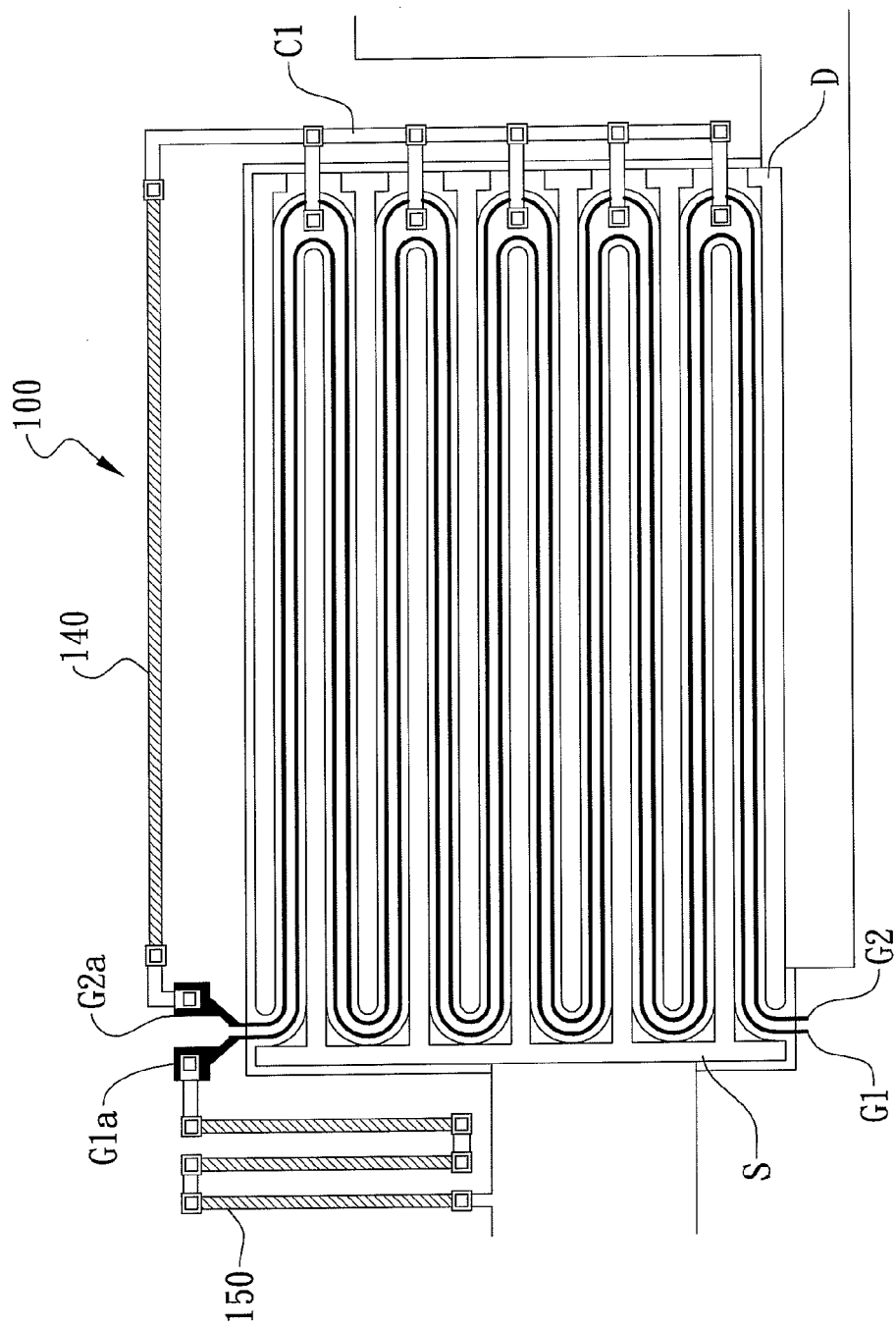

FIGS. 6A and 6B show two implementations of the circuit diagram of FIG. 5A. Gate electrode pads G1a and G2a are disposed at one ends of the gate electrodes G1 and G2, respectively. The connection node C1 is disposed on a turning region of the meandering gate electrodes which is made wider between gate electrodes G1 and G2. The inter-gate space can also be made wider between gate electrodes G1 and G2 at more than one of the turning regions of the meandering gate electrodes to facilitate the installation of multiple connection nodes for electrical connection on the inter-gate region, as shown in FIG. 6B. The fourth resistor 140 is connected between the gate electrode pad G2a and the connection node C1. The fifth resistor 150 is connected between the gate electrode pad G1a and the source electrode S.

Figure 6C:
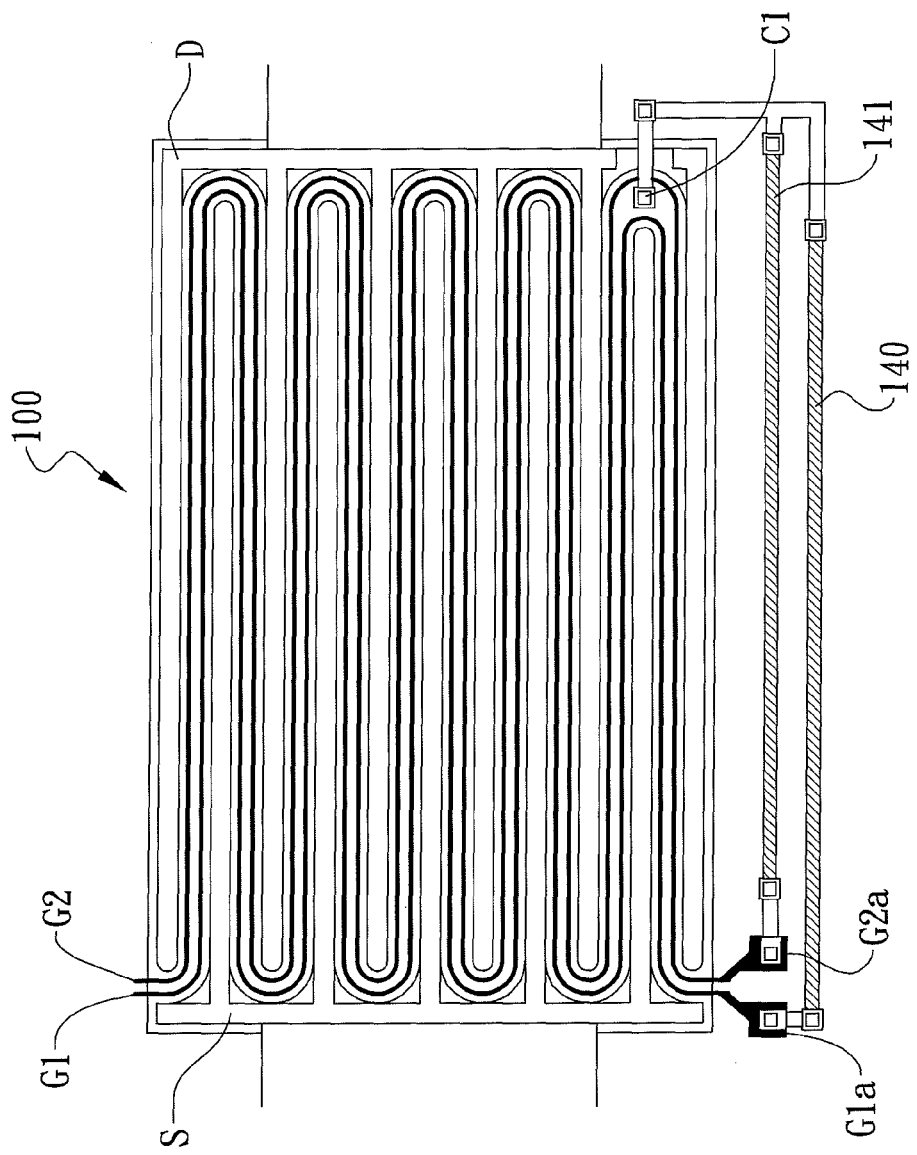
Figure 6D:
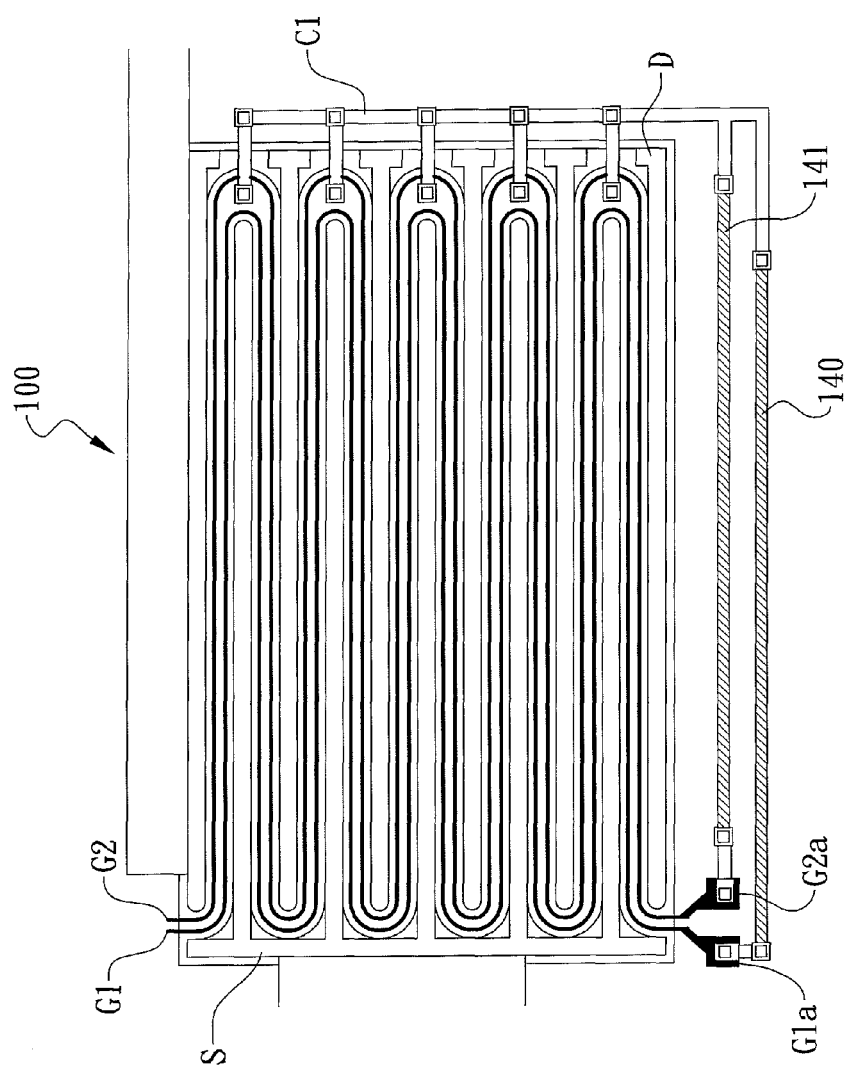

FIGS. 6C and 6D show two implementations of the circuit diagram shown in FIG. 5B. Gate electrode pads G1a and G2a are disposed at one ends of the gate electrodes G1 and G2, respectively. The connection node C1 on the integrate region between gate electrodes G1 and G2 can be disposed on one or more than one turning regions of the meandering gate electrodes which are made wider between gate electrodes G1 and G2, same as the implementations shown in FIGS. 6A and 6B. The fourth resistor 140 is connected between the gate electrode pad G1a and the connection node C1, and the fourth resistor 141 is connected between the gate electrode pad G2a and the connection node C1.

Figure 6E:
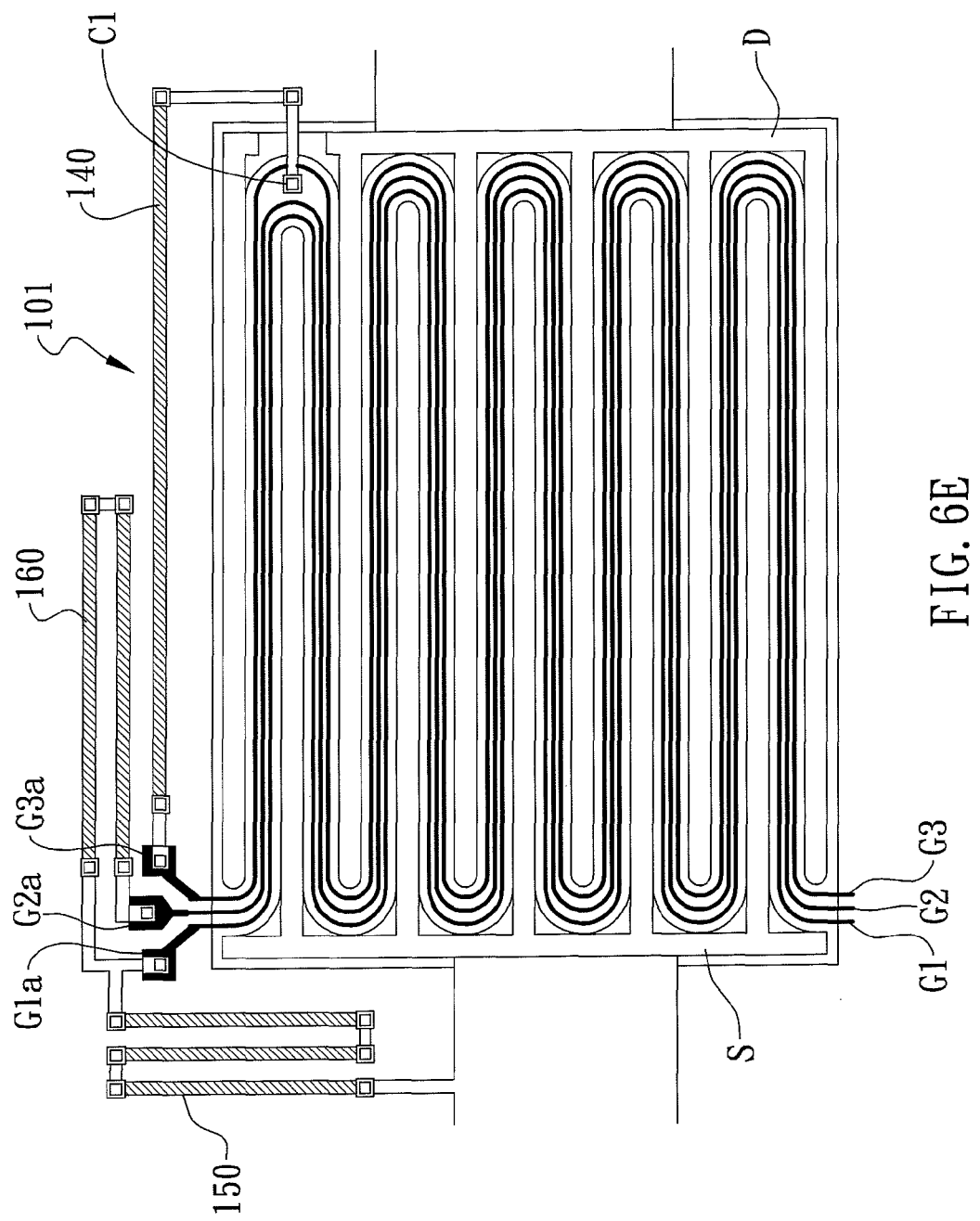

FIG. 6E shows an implementation of the circuit diagram shown in FIG. 5E. Gate electrode pads G1a, G2a and G3a are disposed at one ends of the gate electrodes G1, G2, and G3, respectively. The connection node C2 is disposed on a turning region of the meandering gate electrodes which is made wider between gate electrodes G2 and G3. The fourth resistor 140 is connected between the gate electrode pad G3a and the connection node C2, the fifth resistor 150 is connected between the gate electrode pad G1a and the gate electrode S, and the sixth resistor 160 is connected between the gate electrode pads G2a and G3a.

Figure 6F:
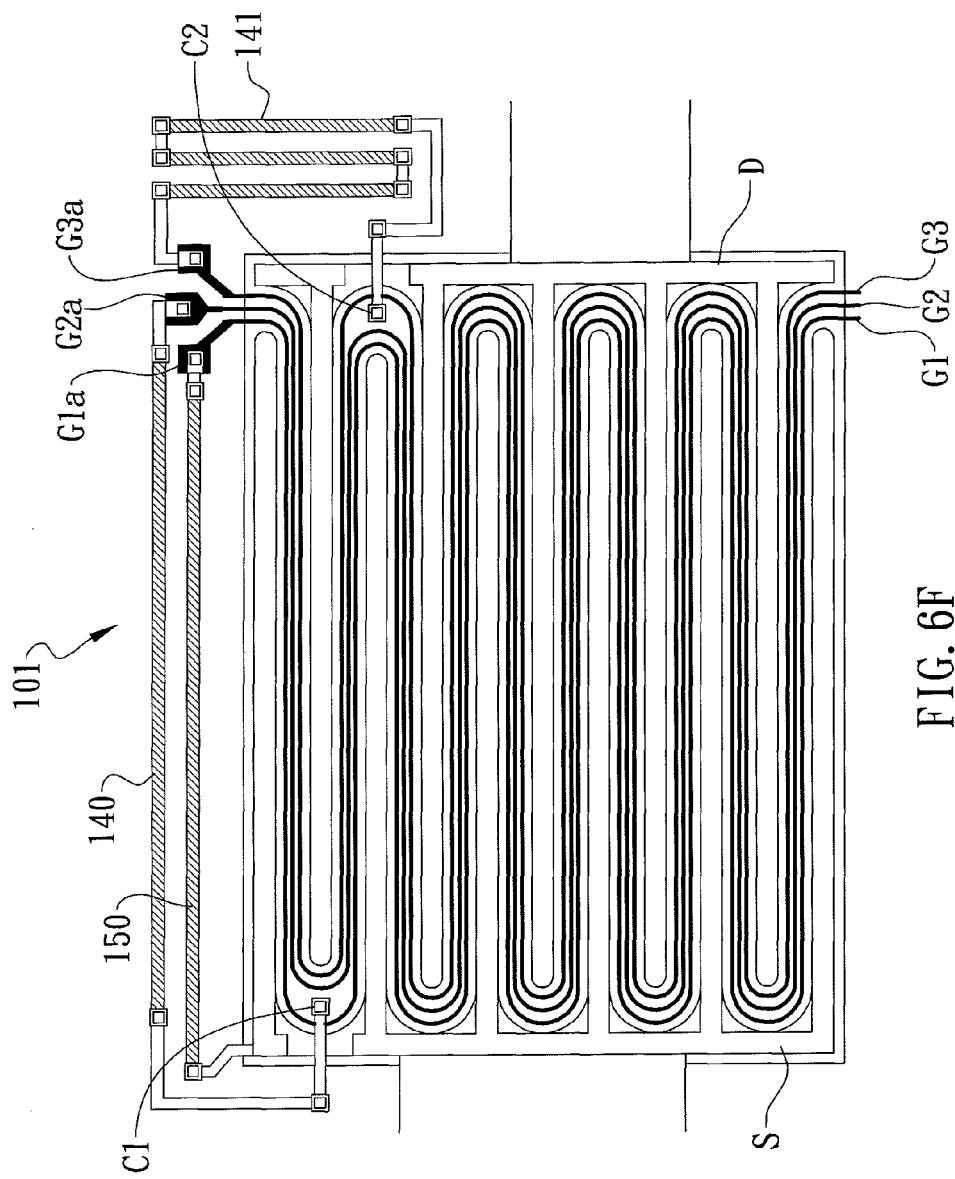
Figure 6G:
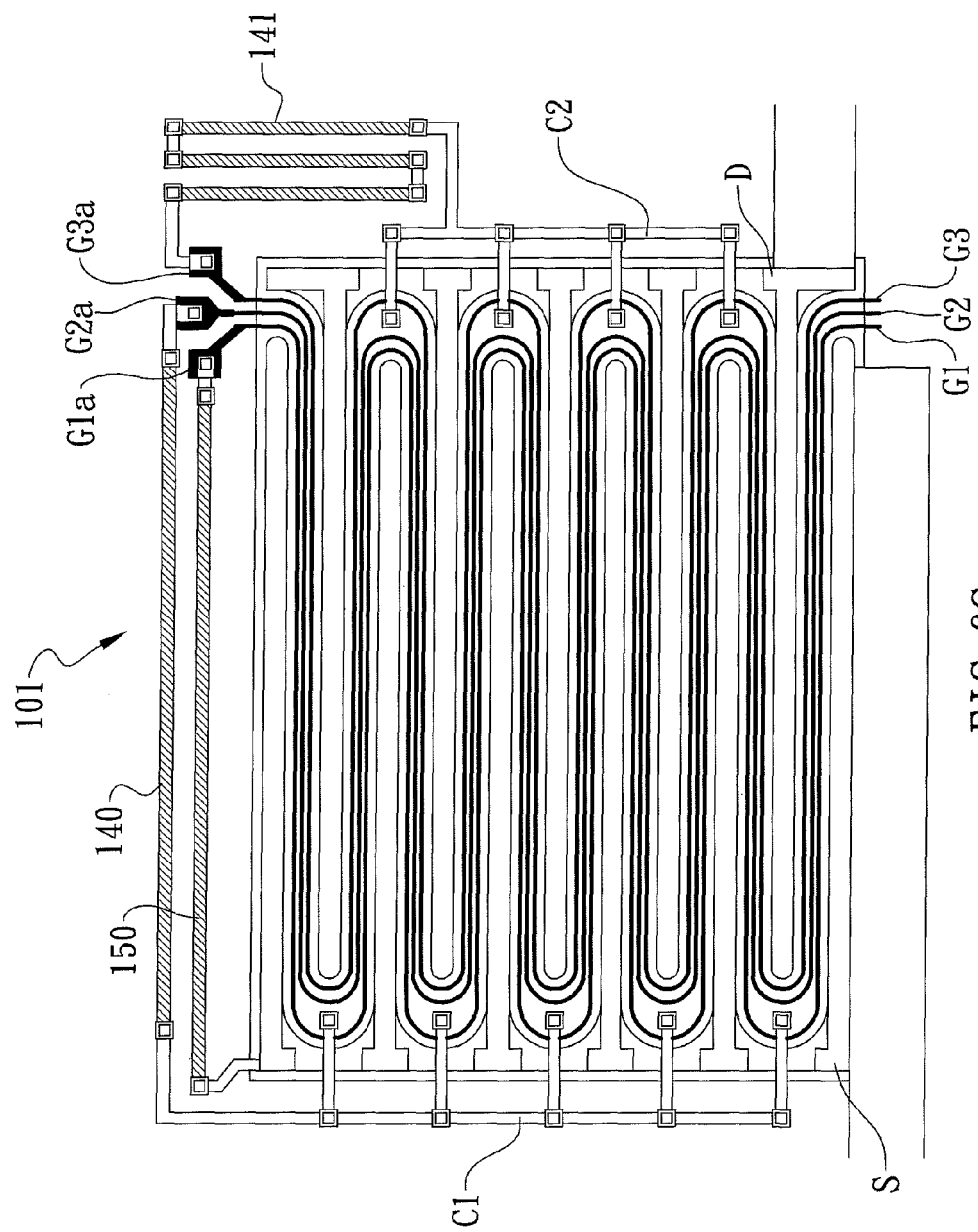

FIGS. 6F and 6G show two implementations of the circuit diagram shown in FIG. 5F. Gate electrode pads G1a, G2a and G3a are disposed at one ends of the gate electrodes G1, G2, and G3, respectively. The connection node C1 can be disposed on one or more than one turning regions of the meandering gate electrodes which are made wider between gate electrodes G1 and G2, and the connection node C2 can also be disposed on one or more than one turning regions of the meandering gate electrodes which are made wider between gate electrodes G2 and G3. The fourth resistor 140 is connected between the gate electrode pad G2a and the connection node C1, the fourth resistor 141 is connected between the gate electrode pad G3a and the connection node C2, and the fifth resistor 150 is connected between the gate electrode pad G1a and the source electrode S.

Figure 6H:
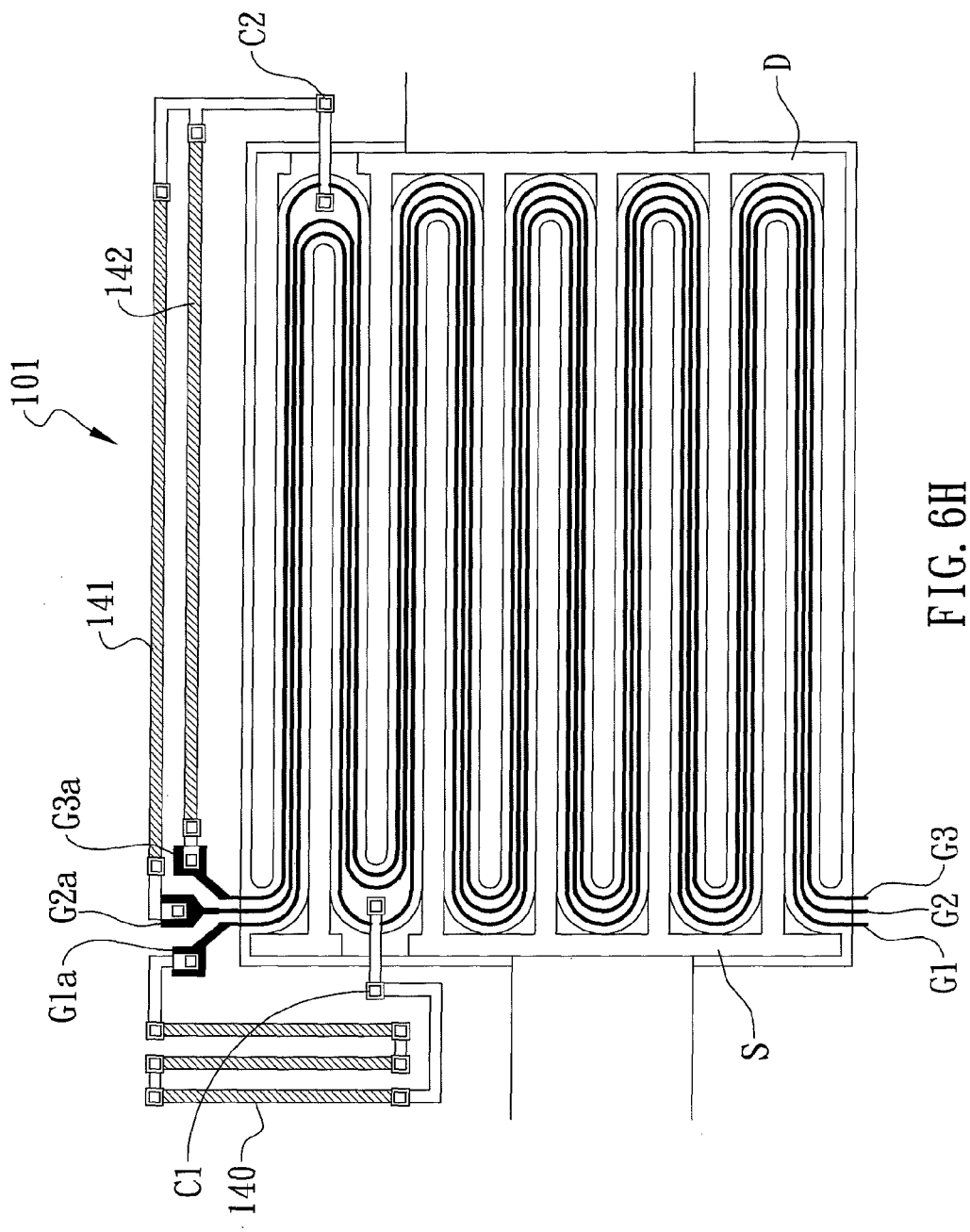
Figure 6I:
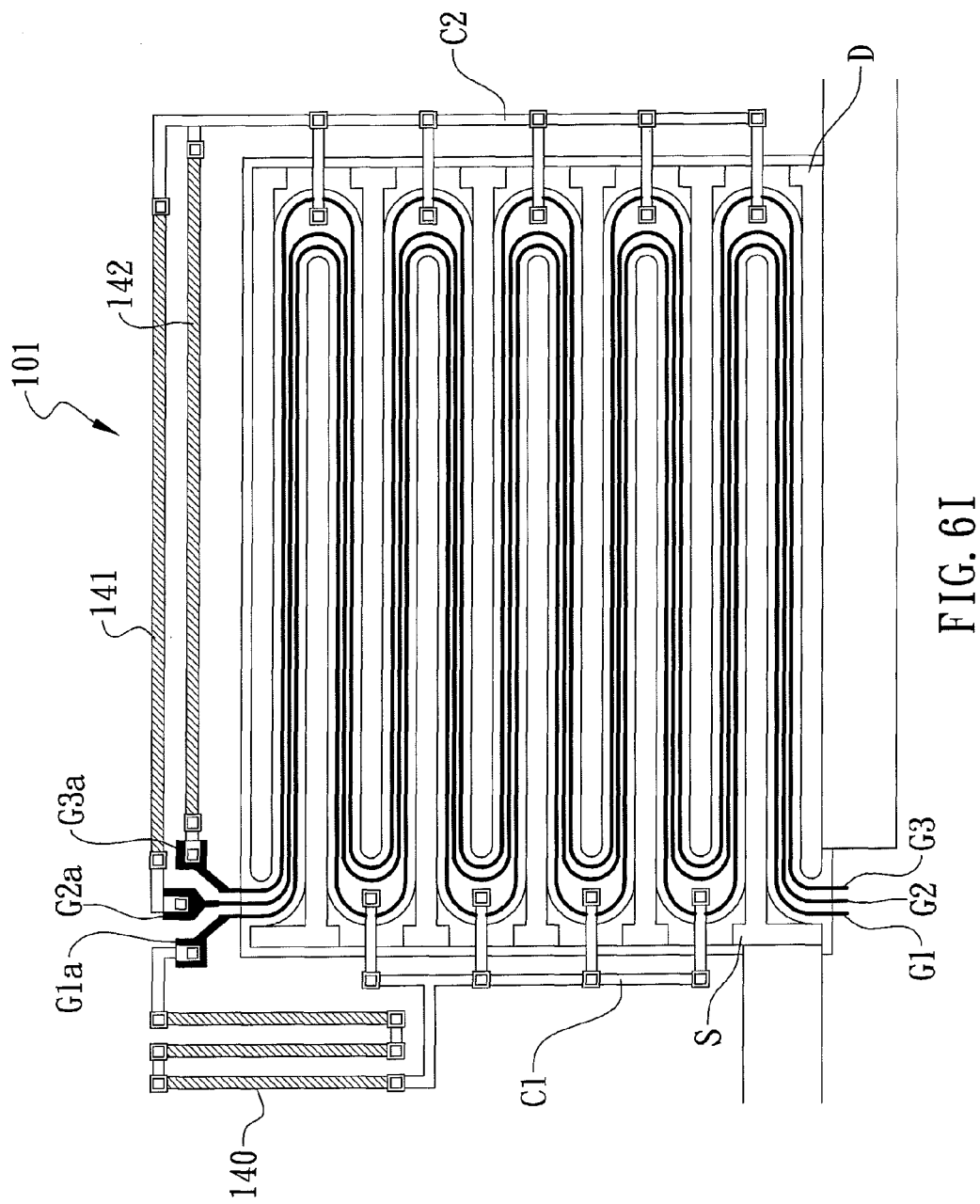

FIGS. 6H and 6I show two implementations of the circuit diagram shown in FIG. 5G Gate electrode pads G1a, G2a and G3a are disposed at one ends of the gate electrodes G1, G2, and G3, respectively. The connection node C1 is disposed on one or more than one turning regions of the meandering gate electrodes which are made wider between gate electrodes G1 and G2, and the connection node C2 is disposed on one or more than one turning regions of the meandering gate electrodes which are made wider between gate electrodes G2 and G3. The fourth resistor 140 is connected between the gate electrode pad G1a and the connection node C1, and the fourth resistor 141 and 142 are connected between the connection node C1 and the gate electrode pad G2a and G3a, respectively.

Figure 6J:
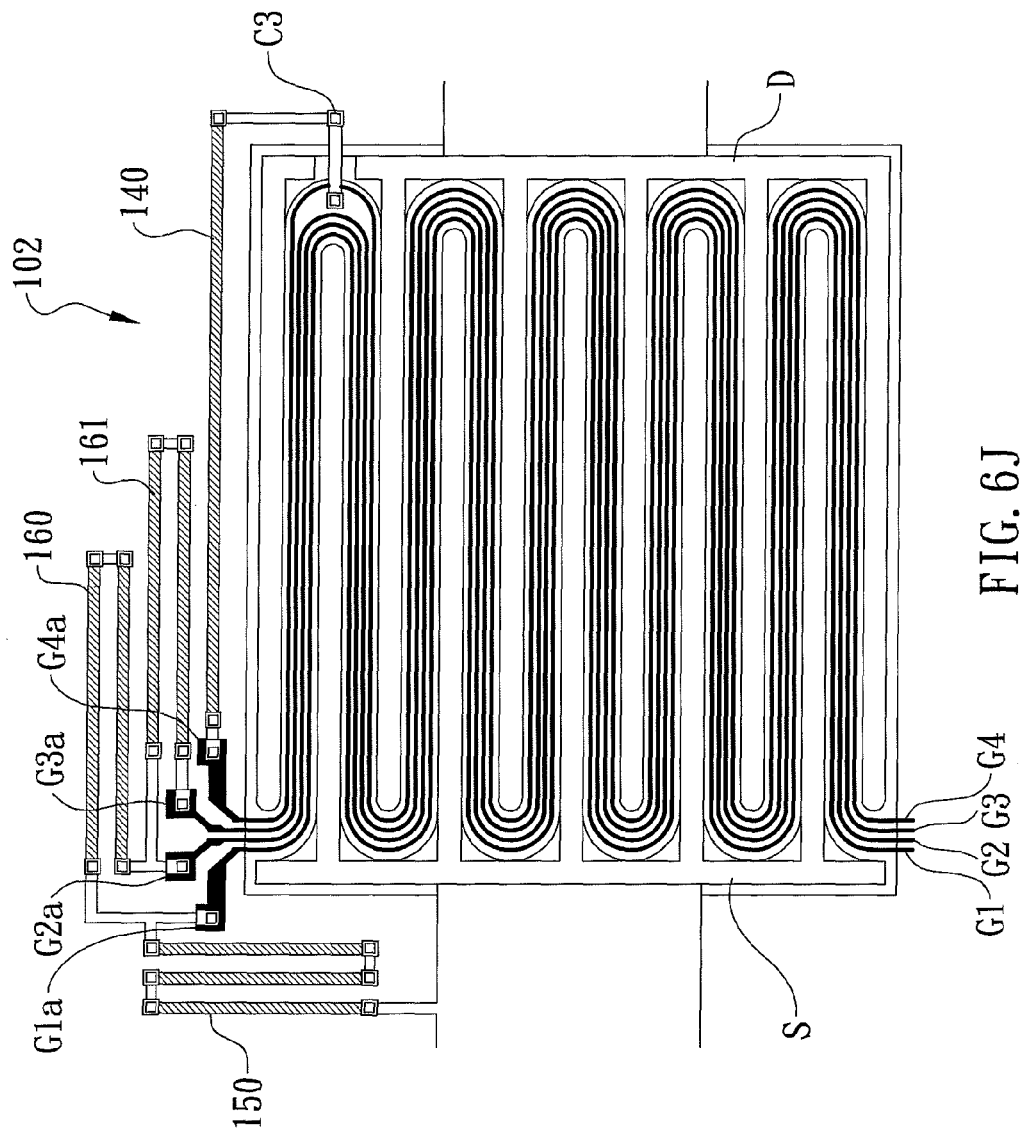

FIG. 6J shows an implementation of the circuit diagram shown in FIG. 5J. Gate electrode pads G1a, G2a, G3a, and G4a are disposed at one ends of the gate electrodes G1, G2, G3, and G4, respectively. The connection node C3 is disposed on a turning region of the meandering gate electrodes which is made wider between gate electrodes G3 and G4. The fourth resistor 140 is connected between the gate electrode pad G4a and the connection node C3, the fifth resistor 150 is connected between the gate electrode pad G1a and the gate electrode S, the sixth resistor 160 is connected between the gate electrode pads G1a and G2a, and the sixth resistor 161 is connected between the gate electrode pads G2a and G3a.

Figure 6K:
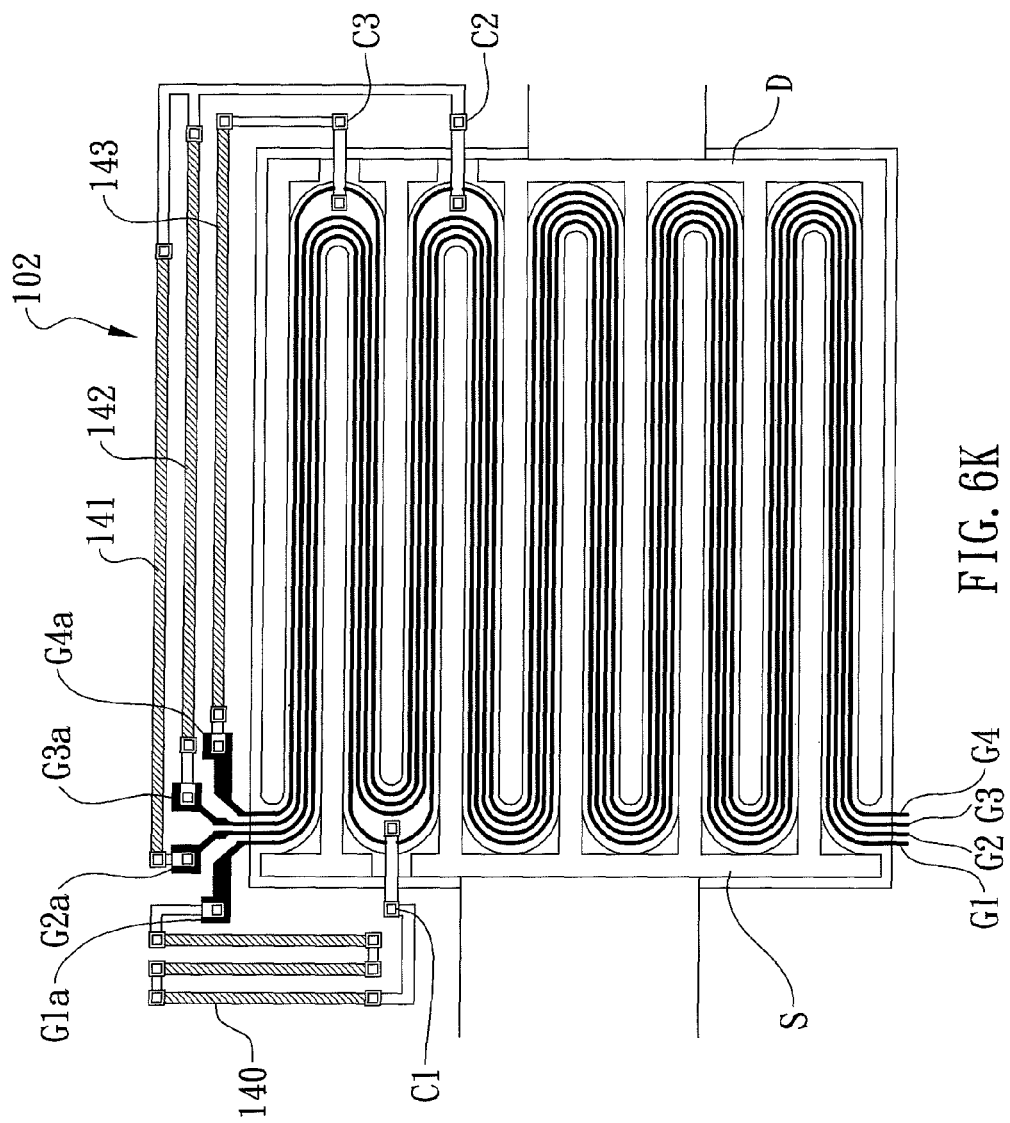

FIG. 6K shows an implementation of the circuit diagram shown in FIG. 5L. Gate electrode pads G1a, G2a, G3a, and G4a are disposed at one ends of the gate electrodes G1, G2, G3, and G4, respectively. The connection nodes C1, C2, and C3 are disposed on a turning region of the meandering gate electrodes which is made wider between gate electrodes G1 and G2, between gate electrodes G2 and G3, between gate electrodes G3 and G4, respectively. The fourth resistor 140, 141, 142, and 143 are connected between the gate electrode pad G1a and the connection node C1, between the gate electrode pad G2a and the connection node C2, between the gate electrode pad G3a and the connection node C2, and between the gate electrode pad G4a and the connection node C3, respectively.

Type III Compound Semiconductor ESD Protection Device

FIG. 7A~7C are circuit diagrams showing embodiments of the type III compound semiconductor ESD protection device provided by the present invention. The type III compound semiconductor ESD protection device comprises a multi-gate E-FET (100~102), at least one seventh resistor 170, and at least one eighth resistor (180~182). The multi-gate E-FET comprises a source electrode S, a drain electrode D, and plural gate electrodes (G1~G4) disposed between the source and drain electrodes. The plural gate electrodes are connected to the source or drain electrodes through the at least one seventh resistor. The multi-gate E-FET with unidirectionally connected gate electrodes acts as a single diode. Each of the one or more eighth resistors (180~182) is connected between two gate electrodes, so that the gate electrode can be connected indirectly through the one or more eighth resistors and a seventh resistor to the source or the drain electrodes. In the embodiments shown in FIG. 7A~7C, the gate electrode G1 is connected to the source electrode S through the seventh resistor 170, and the other gate electrodes are connected to the gate electrode G1 through one or more eighth resistors.

Figure 8A:
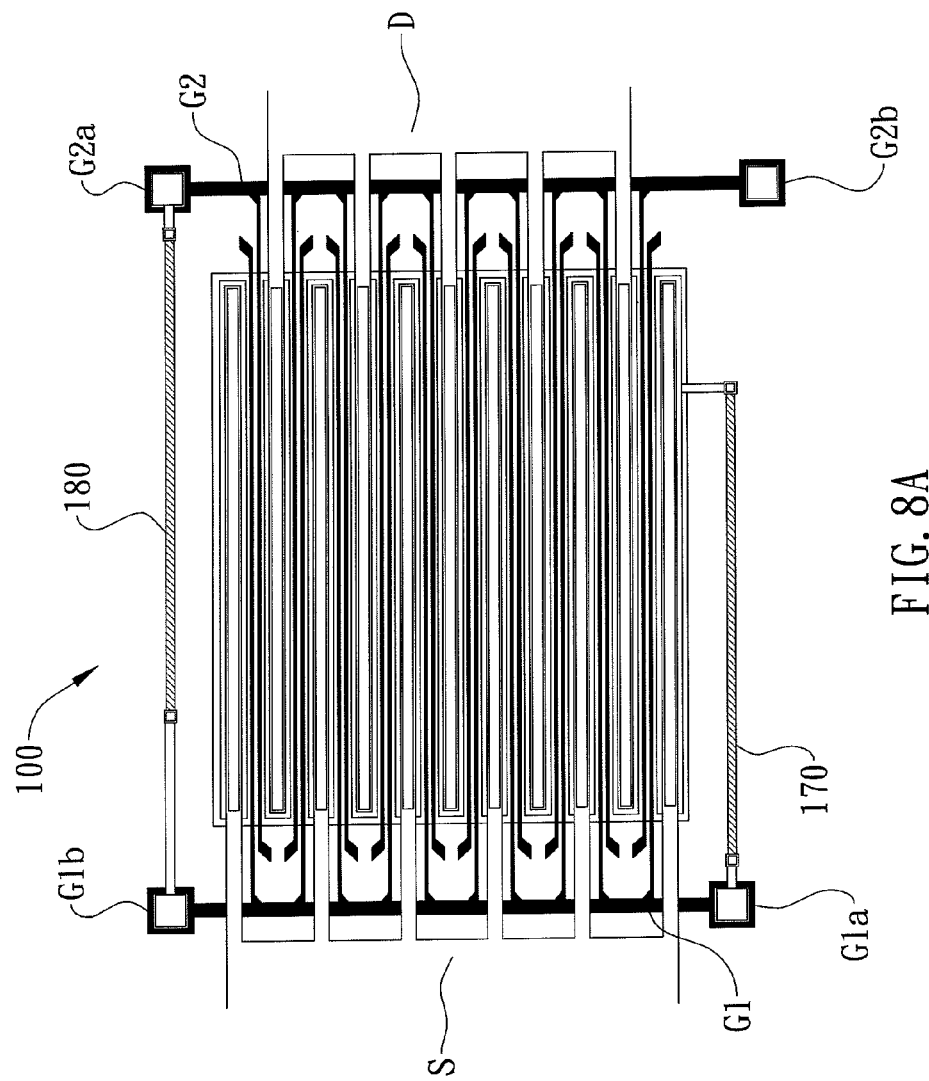
FIG. 8A-8C are schematics showing the plan view of embodiments of the circuit diagrams selected from those shown in FIG. 7A-7C provided by the present invention.
Figure 8B:
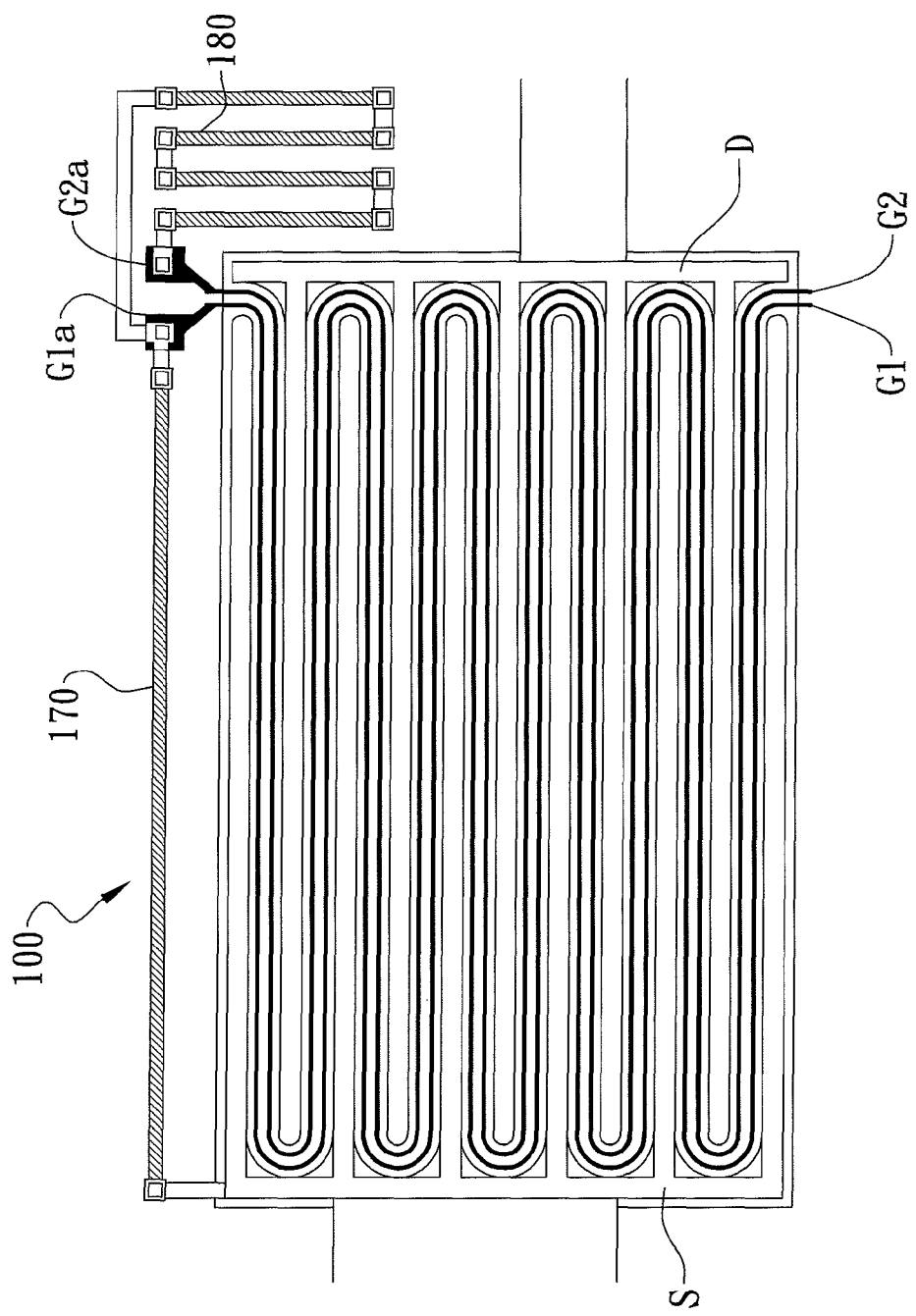

FIGS. 8A and 8B show two implementations of the circuit diagrams shown in FIG. 7A. The scheme of the implementation shown in FIG. 8A is similar to that of the implementations of the type I compound semiconductor ESD protection device shown in FIG. 4C. Gate electrode pads G1a and G1b are provided at one end of the gate electrodes G1, and gate electrode pads G2a and G2b are provided at one end of the gate electrodes G2. The seventh resistor 170 is connected between the gate electrode pad G1a and the source electrode S, and the eighth resistor 180 is connected between the gate electrode pads G1b and G2a. The scheme of the implementation shown in FIG. 8B is similar to that of the implementations of the type I compound semiconductor ESD protection device shown in FIG. 4A. Gate electrode pads G1a and G2a are provided at one end of the gate electrodes G1 and G2, respectively. The seventh resistor 170 is connected between the gate electrode pad G1a and the source electrode S, and the eighth resistor 180 is connected between the gate electrode pads G1a and G2a.

Figure 8C:
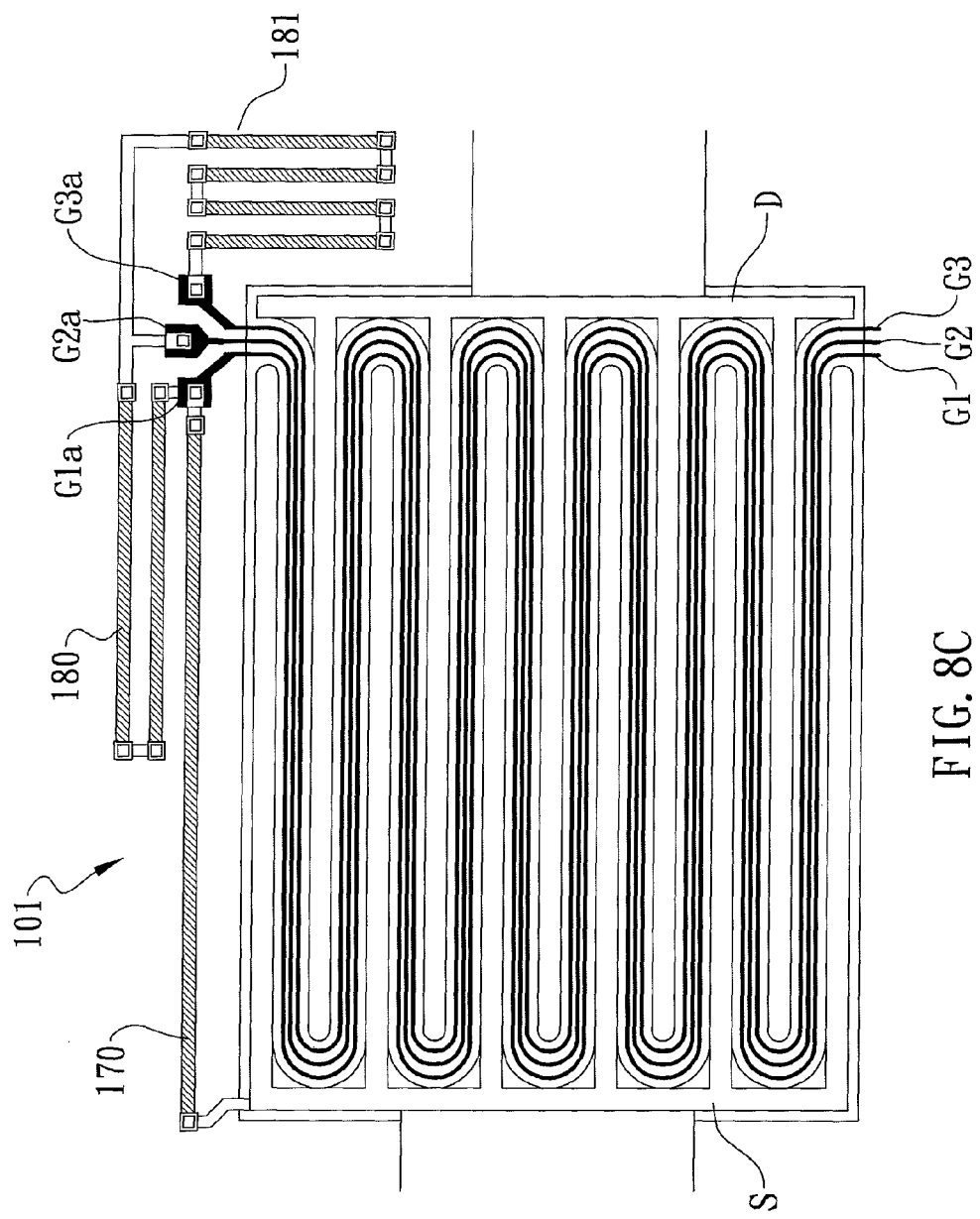

FIG. 8C shows an implementation of the circuit diagrams shown in FIG. 7B. The scheme of the implementation shown in FIG. 8C is also similar to that of the implementations of the type I compound semiconductor ESD protection device shown in FIG. 4A. The seventh resistor 170 is connected between the gate electrode pad G1a and the source electrode S, the eighth resistor 180 is connected between the gate electrode pads G1a and G2a, and the eighth resistor 181 is connected between the gate electrode pads G2a and G3a.

Type IV Compound Semiconductor ESD Protection Device

Figure 9C:
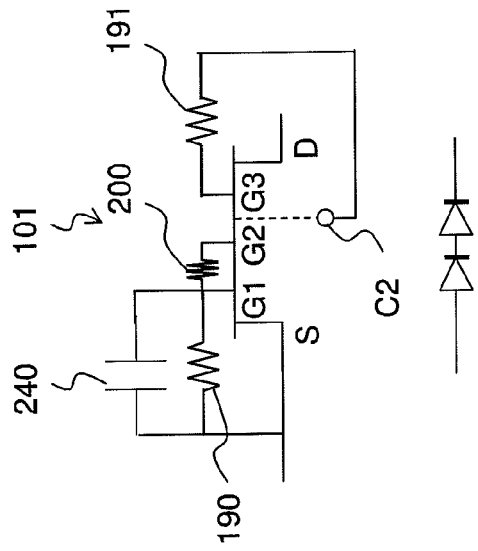
FIG. 9A-9N are circuit diagrams showing embodiments of the type IV compound semiconductor ESD protection device provided by the present invention.
Figure 9D:
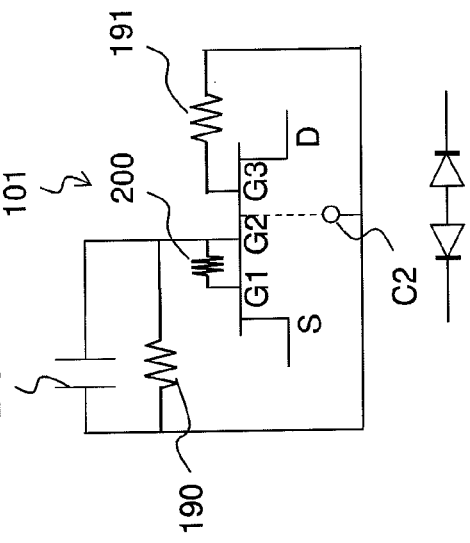
Figure 9E:
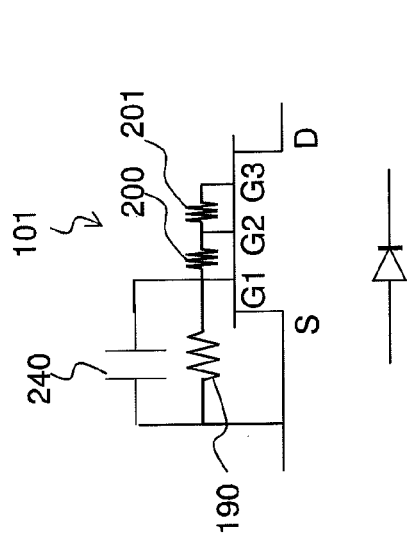
Figure 9F:
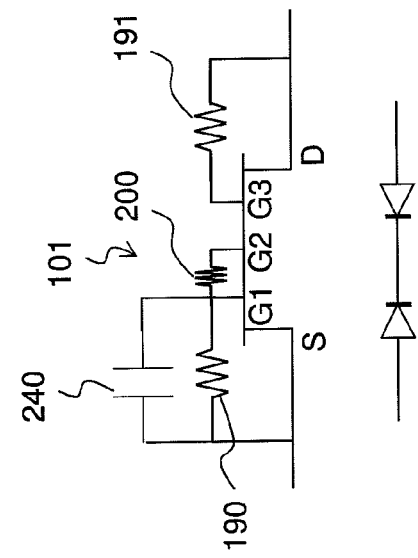
Figure 9G:
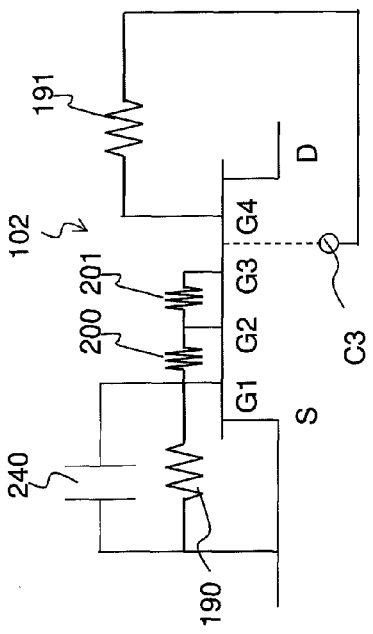
Figure 9H:
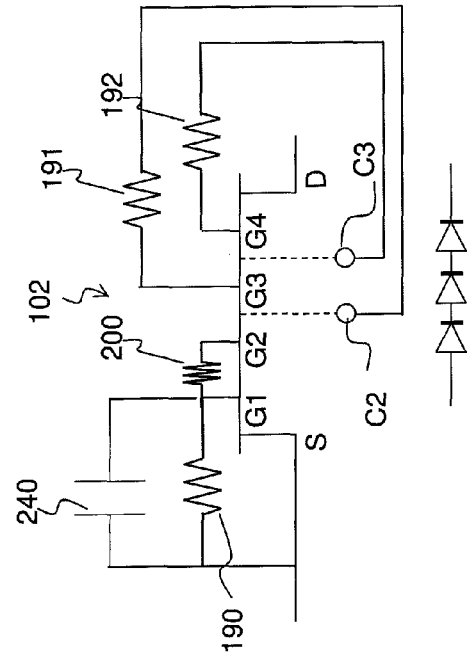
Figure 9I:
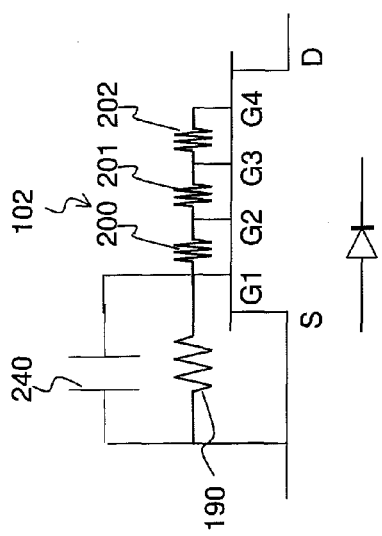
Figure 9J:
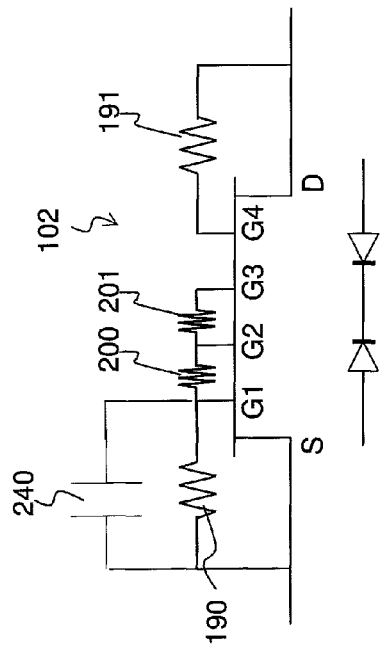
Figure 9L:
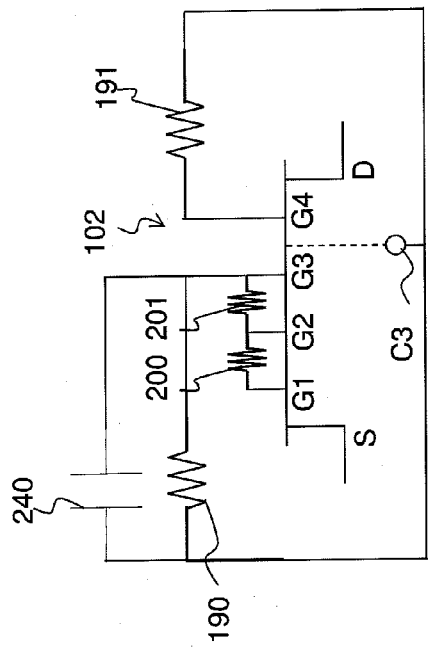
Figure 9N:
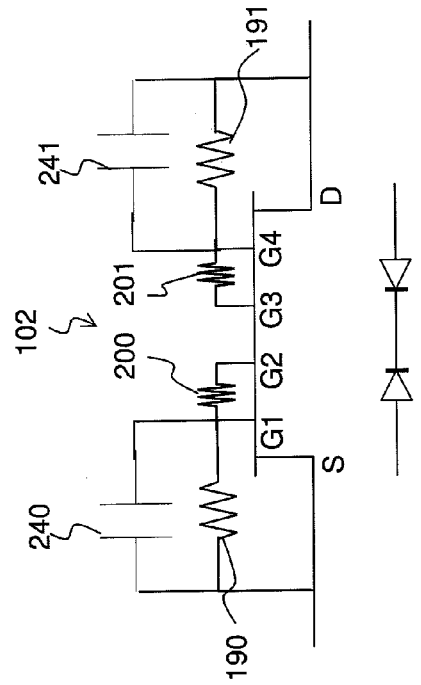

FIG. 9A~9N are circuit diagrams showing embodiments of the type IV compound semiconductor ESD protection device provided by the present invention. An equivalent circuit of diodes is provided at the bottom of each figure. The type IV compound semiconductor ESD protection device comprises a multi-gate E-FET (100~102), at least one ninth resistor (190~192), and at least one gate capacitor (240 and 241). The multi-gate E-FET comprises a source electrode (S), a drain electrode (D), and plural gate electrodes (G1~G4) disposed between the source and drain electrodes. Each of the plural gate electrodes is DC-connected to the source electrode, the drain electrode, or an inter-gate region between two adjacent gate electrodes through the at least one ninth resistor. At least one of the plural gate electrodes is AC-connected to the source electrode, the drain electrode, or an inter-gate region between two adjacent gate electrodes through the at least one gate capacitor. In these embodiments, the ESD protection device may further include one or more tenth resistors (200~202) for connecting two gate electrodes.

FIGS. 9A and 9B are circuit diagrams showing embodiments of a compound semiconductor ESD protection device using a dual-gate E-FET. In FIG. 9A, the gate electrode G1 is DC-connected to the source electrode S through the ninth resistor 190 and AC-connected to the source electrode S through the gate capacitor 240, and the gate electrode G2 is DC-connected to the source electrode S through the tenth resistor 200 and the ninth resistor 190. In FIG. 9B, the gate electrode G1 is DC-connected to the source electrode S through the ninth resistor 190 and AC-connected to the source electrode S through the gate capacitor 240, and the gate electrode G2 is DC-connected to the drain electrode D through the ninth resistor 191 and AC-connected to the drain electrode D through the gate capacitor 241.

Figure 10A:
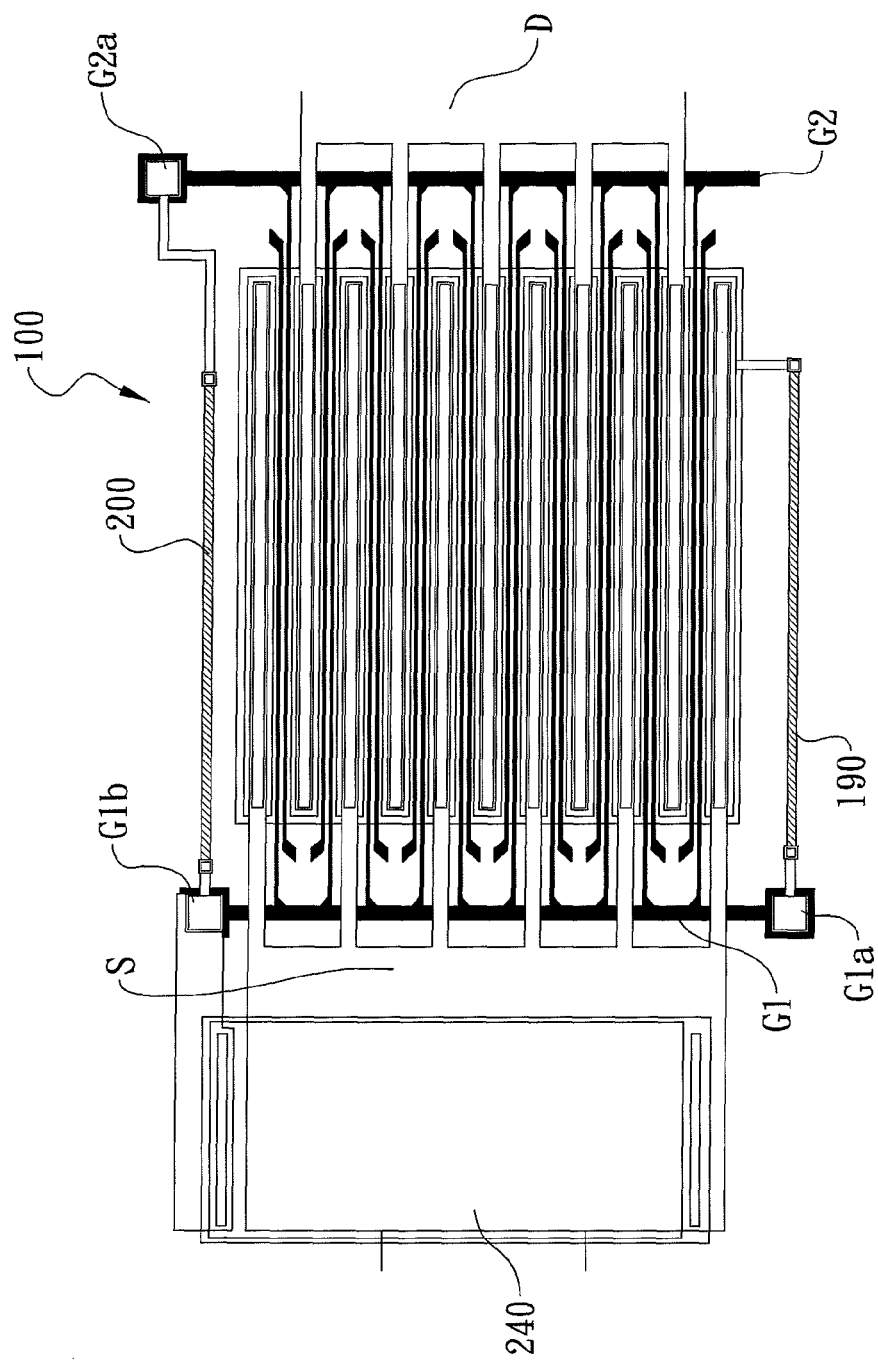
FIG. 10A-10E are schematics showing the plan view of embodiments of the circuit diagrams selected from those shown in FIG. 9A-9N provided by the present invention.

An implementation of the circuit diagram shown in FIG. 9A provided by the present invention is shown in FIG. 10A. In this implementation, the source electrode S and the drain electrode D are multi-finger electrodes with their fingers interposed each other, and dual gate electrodes G1 and G2 are also multi-finger electrodes interposed each other disposed between each pair of a source and a drain electrode fingers. An electrode pad wider than the width of a gate electrode is provided at the end of the gate electrode for the electrical connection to other electrical elements. In this implementation, gate electrode pads G1a and G1b are provided at the two ends of the gate electrode G1 and a gate electrode pad G2a is provided at one of the ends of the gate electrode G2. The gate capacitor 240 is connected to gate electrode pad G1b and the source electrode S. The ninth resistor 190 is connected to the gate electrode pad G1a and the source electrode finger most close to G1a. The tenth resistor 200 is connected between gate electrode pads G1b and G2a.

Figure 10B:
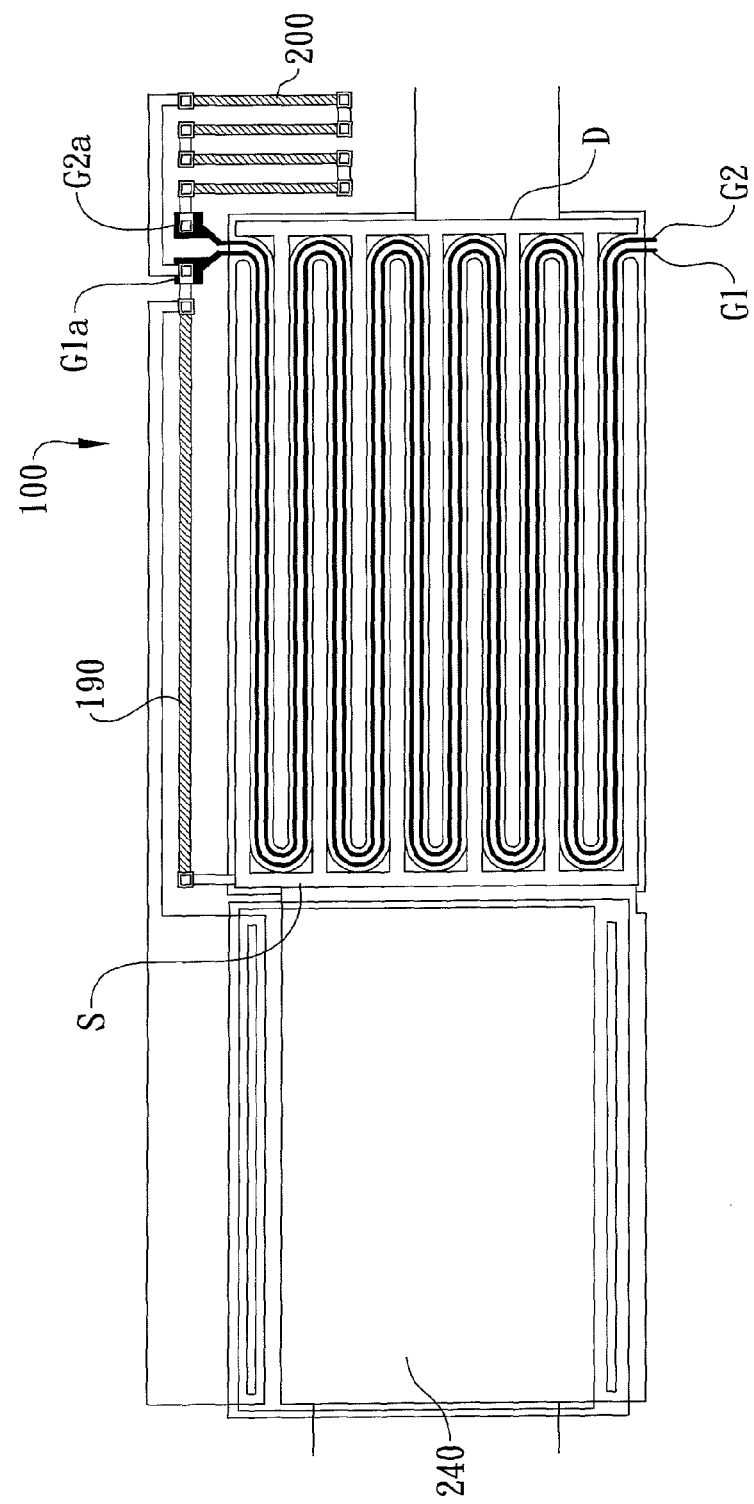

Another implementation of the circuit diagram shown in FIG. 9A provided by the present invention is shown in FIG. 10B. The source electrode S and the drain electrode D are multi-finger electrodes with their fingers interposed each other, and dual gate electrodes G1 and G2 are meandering gate electrodes disposed on the space between each pair of the source and drain electrode fingers. Gate electrode pads G1a and G2a are provided at one end of gate electrodes G1 and G2, respectively. The gate capacitor 240 is connected to the gate electrode pad G1a and the source electrode S. The ninth resistor 190 is connected to the gate electrode pad G1a and the source electrode finger most close to G1a. The tenth resistor 260 is connected between gate electrode pads G1a and G2a.

FIG. 9C~9F are circuit diagrams showing various embodiments of a compound semiconductor ESD protection device using a triple-gate E-FET. In FIG. 9C, all three gate electrodes G1~G3 are DC-connected to the source electrode S through the ninth resistor 190, in which the gate electrode G2 are connected to the ninth resistor 190 through the tenth resistor 200, and the gate electrode G3 are connected to the ninth resistor 190 through tenth resistors 200 and 201. In FIG. 9C, gate electrode G1 is AC-connected to the source electrode S through the gate capacitor 240. In FIGS. 9D and 9E, gate electrodes G1 and G2 are DC-connected to the source electrode S through the ninth resistor 190, in which the gate electrode G2 are connected to the ninth resistor 190 through the tenth resistor 200. In FIGS. 9D and 9E, gate electrode G1 is AC-connected to the source electrode S through the gate capacitor 240. In FIG. 9D, the gate electrode G3 is DC-connected to a connection node C2 disposed on the inter-gate region between G2 and G3 through the ninth resistor 191. In FIG. 9E, the gate electrode G3 is DC-connected to the drain electrode D through the ninth resistor 191. In FIG. 9F, all gate electrodes G1~G3 are DC-connected to the connection node C2 disposed on the inter-gate region between G2 and G3, in which gates G1 and G2 are connected through the ninth resistor 190 and the gate G3 is connected through the ninth resistor 191. Gate G2 is AC-connected to the connection node C2 disposed on the inter-gate region between G2 and G3 through the gate capacitor 240.

Figure 10C:
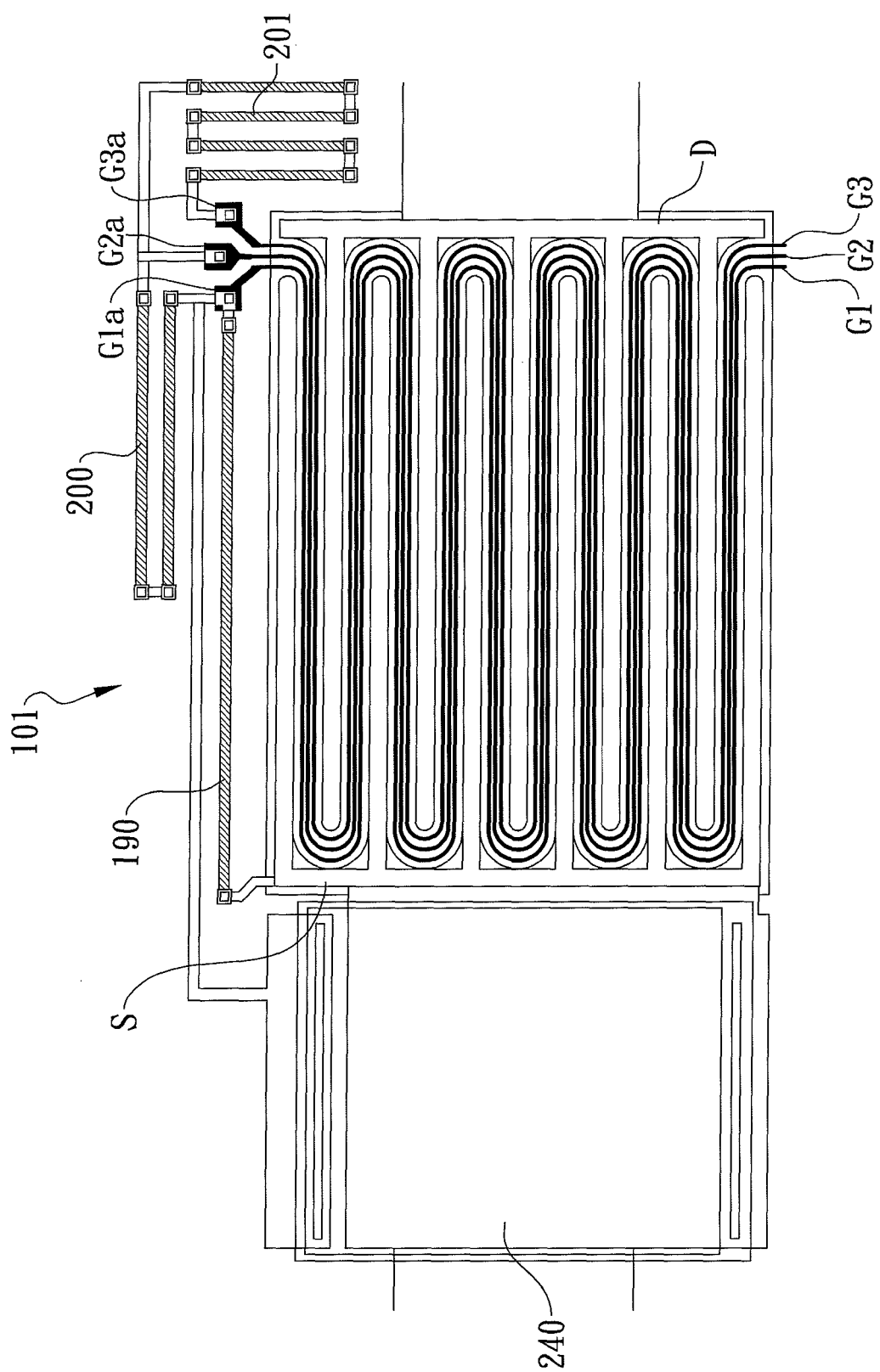

FIG. 10C shows the schematic of an implementation of the circuit diagram shown in FIG. 9C provided by the present invention. The source electrode S and the drain electrode D are multi-finger electrodes with their fingers interposed each other, and the triple gate electrodes G1~G3 are meandering gate electrodes disposed on the space between each pair of the source and the drain electrode fingers. Gate electrode pads G1a~G3a are provided at one end of gate electrode G1~G3, respectively. The gate capacitor 240 is connected to the gate electrode pad G1a and the source electrode S. The ninth resistor 190 is connected to the gate electrode pads G1a and the source electrode S. The tenth resistor 200 is connected to the gate electrode pads G1a and G2a. And the tenth resistor 201 is connected to the gate electrode pads G2a and G3a.

Figure 10D:
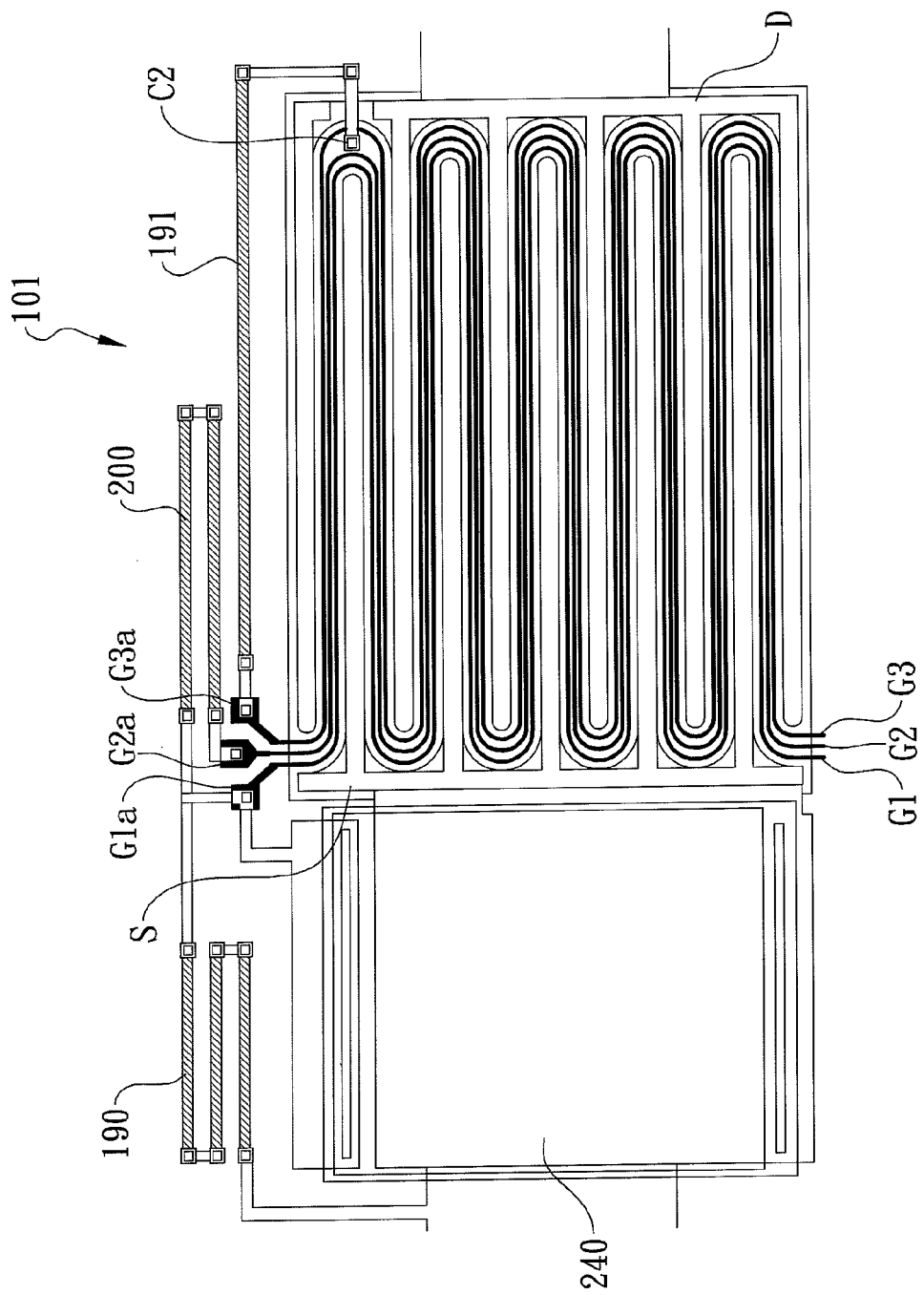

FIG. 10D shows the schematic of an implementation of the circuit diagram shown in FIG. 9D provided by the present invention. The source electrode S and the drain electrode D are multi-finger electrodes with their fingers interposed each other, and the triple gate electrodes G1~G3 are meandering gate electrodes disposed on the space between each pair of the source and drain electrode fingers. Gate electrode pads G1a~G3a are provided at one end of gate electrode G1~G3, respectively. The gate capacitor 240 is connected to the gate electrode pad G1a and the source electrode S. The ninth resistor 190 is connected to the gate electrode pad G1a and the source electrode S. The tenth resistor 200 is connected to gate electrode pads G1a and G2a. The connection node C2 is disposed on a turning region which is made wider between gate electrodes G2 and G3. The ninth resistor 191 is connected to the gate electrode pad G3a and the connection node C2.

Figure 9K:
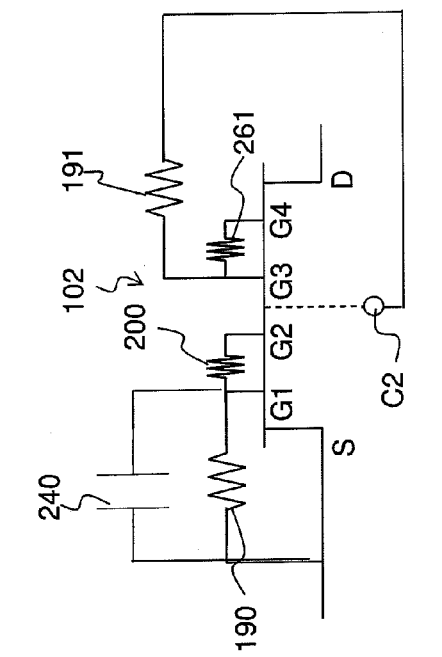
Figure 9M:
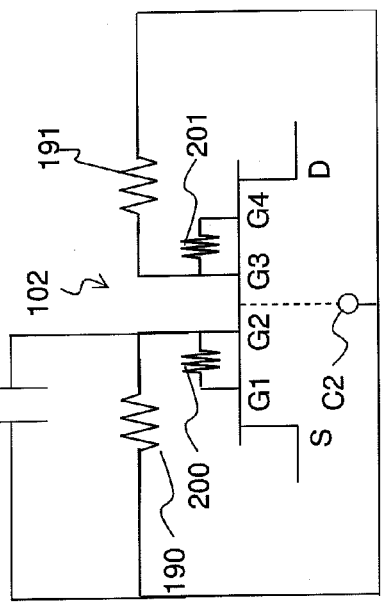

FIG. 9G~9N are circuit diagrams showing embodiments of a compound semiconductor ESD protection device using a quadruple-gate E-FET provided by the present invention. In FIG. 9G all four gate electrodes G1~G4 are DC-connected to the source electrode S through the ninth resistor 190, in which the gate electrode G2 are connected to the ninth resistor 190 through the tenth resistor 200, the gate electrode G3 are connected to the ninth resistor 190 through tenth resistors 200 and 201, and the gate electrode G4 are connected to the ninth resistor 190 through tenth resistors 200, 201, and 202. In FIG. 9G, gate electrode G1 is AC-connected to the source electrode S through gate capacitor 240, In FIGS. 9H and 9I, gate electrodes G1~G3 are DC-connected to the source electrode S through the ninth resistor 190, in which the gate electrode G2 is connected to the ninth resistor 190 through the tenth resistor 200, and the gate electrode G3 is connected to the ninth resistor 190 through tenth resistors 200 and 201. In FIGS. 9H and 9I, gate electrode G1 is AC-connected to the source electrode S through gate capacitor 240. In FIG. 9H, the gate electrode G4 is DC-connected to a connection node C3 disposed on the inter-gate region between G3 and G4 through the ninth resistor 191. In FIG. 9I, the gate electrode G4 is DC-connected to the drain electrode D through the ninth resistor 191. In FIGS. 9J and 9K, gate electrodes G1 and G2 are DC-connected to the source electrode S through the ninth resistor 190, in which the gate electrode G2 is connected to the ninth resistor 190 through the tenth resistor 200. In FIGS. 9J and 9K, gate electrode G1 is AC-connected to the source electrode S through gate capacitor 240. In FIG. 9J, the gate electrode G3 is DC-connected to a connection node C2 disposed on the inter-gate region between G2 and G3 through the ninth resistor 191, and the gate electrode G4 is DC-connected to a connection node C3 disposed on the inter-gate region between G3 and G4 through the ninth resistor 192. In FIG. 9K, gate electrodes G3 and G4 are DC-connected to a connection node C2 disposed on the inter-gate region between G2 and G3 through the ninth resistor 191, in which the gate electrode G4 is connected to the ninth resistor 191 through the tenth resistor 201. In FIG. 9L, gate electrodes G1~G3 are DC-connected to a connection node C3 disposed on the inter-gate region between G3 and G4 through the ninth resistor 190, in which the gate electrode G2 is connected to the ninth resistor 190 through the tenth resistor 201 and gate electrode G1 is connected to the ninth resistor 190 through the tenth resistors 200 and 201, and the gate G4 is DC-connected to the connection node C3 through the ninth resistor 191. In FIG. 9L, gate electrode G3 is DC-connected to a connection node C3 disposed on the inter-gate region between G3 and G4 through gate capacitor 240. In FIG. 9M, gate electrodes G1 and G2 are DC-connected to a connection node C2 disposed on the inter-gate region between G2 and G3 through the ninth resistor 190, in which the gate electrode G1 is connected to the ninth resistor 190 through the tenth resistor 200. Gate electrode G2 is AC-connected to a connection node C2 disposed on the inter-gate region between G2 and G3 through gate capacitor 240. The gate G3 and G4 is DC-connected to the connection node C2 through the ninth resistor 191, in which the gate electrode G4 is connected to the ninth resistor 191 through the tenth resistor 201. In FIG. 9N, gate electrodes G1 and G2 are DC-connected to the source electrode S through the ninth resistor 190, in which the gate electrode G2 is connected to the ninth resistor 190 through the tenth resistor 200. Gate electrodes G1 is AC-connected to the source electrode S through gate capacitor 240. Gate electrodes G3 and G4 are DC-connected to the drain electrode D through the ninth resistor 191, in which the gate electrode G3 is connected to the ninth resistor 191 through the tenth resistor 201. Gate electrode G4 is AC-connected to the drain electrode D through gate capacitor 241.

Figure 10E:
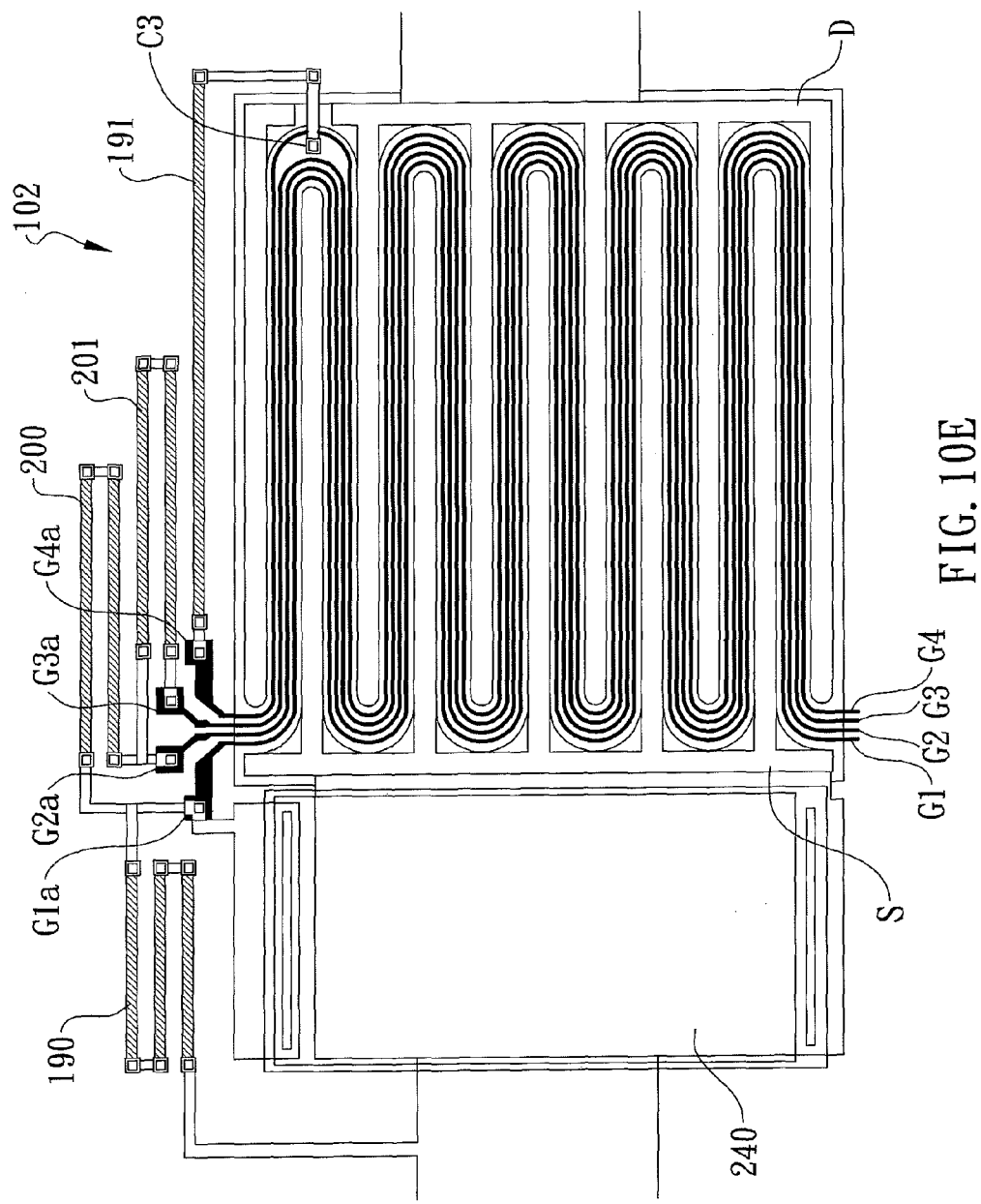
Figure 11B:
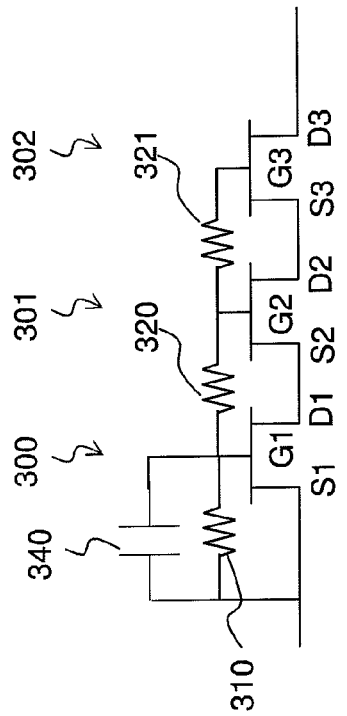
Figure 11C:
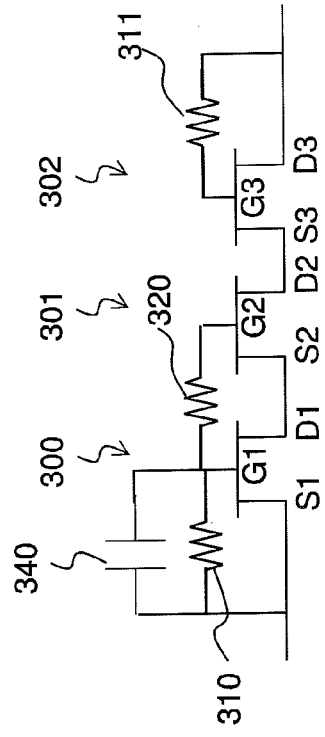
Figure 11A:
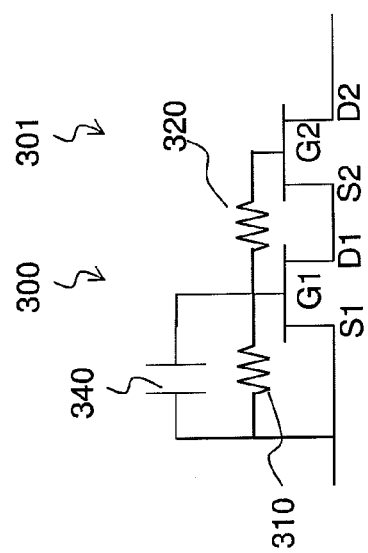
Figure 11G:
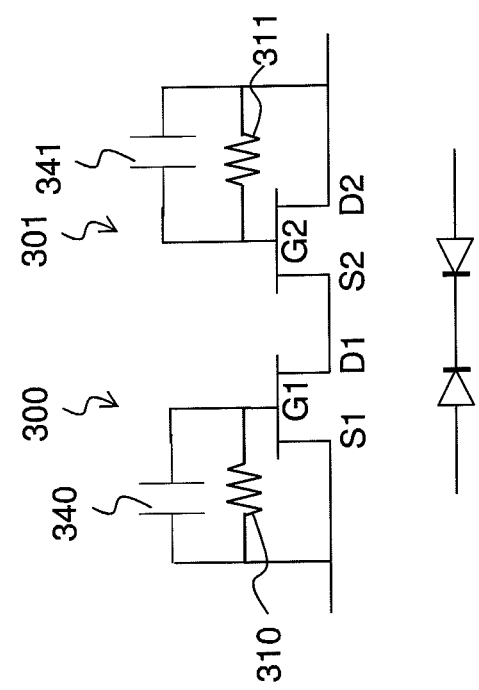

FIG. 10E shows an implementation of the circuit diagram shown in FIG. 9H provided by the present invention. The source electrode S and the drain electrode D are multi-finger electrodes with their fingers interposed each other, and the quadruple gate electrodes G1~G4 are meandering gate electrodes disposed on the space between each pair of the source and the drain electrode fingers. Gate electrode pads G1a~G4a are provided at one end of gate electrode G1~G4, respectively. The gate capacitor 240 is connected to the gate electrode pad G1a and the source electrode S. The ninth resistor 190 is connected to the gate electrode pad G1a and the source electrode S. The tenth resistor 200 is connected to the gate electrode pad G1a and G2a, and the tenth resistor 201 is connected to the gate electrode pad G2a and G3a. The connection node C3 is disposed on a turning region which is made wider between gate electrodes G3 and G4. The ninth resistor 191 is connected to the gate electrode pad G4a and the inter-gate region C3.

Type V Compound Semiconductor ESD Protection Device

FIG. 11A~11G are circuit diagrams showing the embodiments of a compound semiconductor ESD protection device using plural single-gate E-FETs provided by the present invention. An equivalent diode or diodes connection is shown on the bottom of each figure. The ESD protection device comprises plural single-gate E-FETs (300~303), at least one eleventh resistor (310 and 311), and at least one gate capacitor (340 and 341). The ESD protection device may further include at least one twelfth resistor (320~322) for connecting the gate electrodes of two single-gate E-FETs. Each of the plural single-gate E-FETs comprises a source electrode (S), a drain electrode (D), and a gate electrode (G). The plural single-gate E-FETs are connected in series. The drain electrode of a single-gate E-FET is connected to the source electrode of a succeeding single-gate E-FET. The gate electrode of each of the plural single-gate E-FETs is DC-connected the source or the drain electrodes of one of said plural single-gate E-FETs through the at least one eleventh resistor. In FIG. 11A~11G the gate electrode G1 is directly DC-connected to the source electrode S1 through the eleventh resistor 150; in FIG. 11G the gate electrode G2 is directly DC-connected to the source electrode S2 through the eleventh resistor 311; whereas in FIG. 11A~11F, the gate electrode G2 is indirectly DC-connected to the source electrode S1 through the twelfth resistor 320 and the eleventh resistor 310; in FIGS. 11B, 11D, and 11E, the gate electrode G3 is indirectly DC-connected to the source electrode S1 through twelfth resistors 320, 321 and the eleventh resistor 310.

The gate capacitor in Types IV and V compound semiconductor ESD protection devices is connected in parallel with the parasitic gate capacitance (Cgs) of the FET. It reduces the RF bias voltage across the $C_{gs}$ and the nonlinear signal generated by the voltage dependence of $C_{gs}$. The gate capacitor also acts as a feed-forward capacitor. Fraction of the input RF power is fed to the opposite side of the gate and pumps up positive charges at a node between two off-state gates. The gate is negatively biased with respect to the node to the point at which the voltage dependence in the gate capacitance $C_{gd}$ on the opposite side is small. Thus, the nonlinear signal generated from $C_{gd}$ is also reduced.

In case gates adjacent each other are connected to the same source, drain, or the region between two adjacent gates in Types I to V compound semiconductor ESD protection devices, the RF voltage of incoming signal can be sustained by the two gates. Thus, this gate connection topology can also reduce the nonlinear signal generated by $C_{gs}$ and $C_{gd}$.

The single-gate and multi-gate E-FETs described above can be formed by the compound semiconductor materials, such as GaAs or GaN. The GaAs E-FET can be a high electron mobility transistor (HEMT) or a pseudomorphic high electron mobility transistor (pHEMT). The width of each gate electrode of the plural gate electrodes is ranging from 0.1 mm to 10 mm, preferably 1 mm. The resistance of the first to the twelfth resistor is ranging from $2\times10^2$ to $2\times10^5$ ohms, preferably ranging from $1\times10^3$ to $1\times10^5$ ohms. The capacitance of the gate capacitor is ranging from 0.1 to 5.0 pF, preferably ranging from 1.0 to 3.0 pF. The switching elements may comprise at least one depletion type FET or HEMT. Each of the embodiments of the compound semiconductor ESD protection device mentioned above includes a multi-gate E-FET. The compound semiconductor ESD protection device can also include plural multi-gate E-FETs connected in series according to the present invention. The compound semiconductor ESD protection device can also include at least one multi-gate E-FET according to the present invention and at least one conventional single-gate E-FET connected in series.

Figures 12A, 12B:
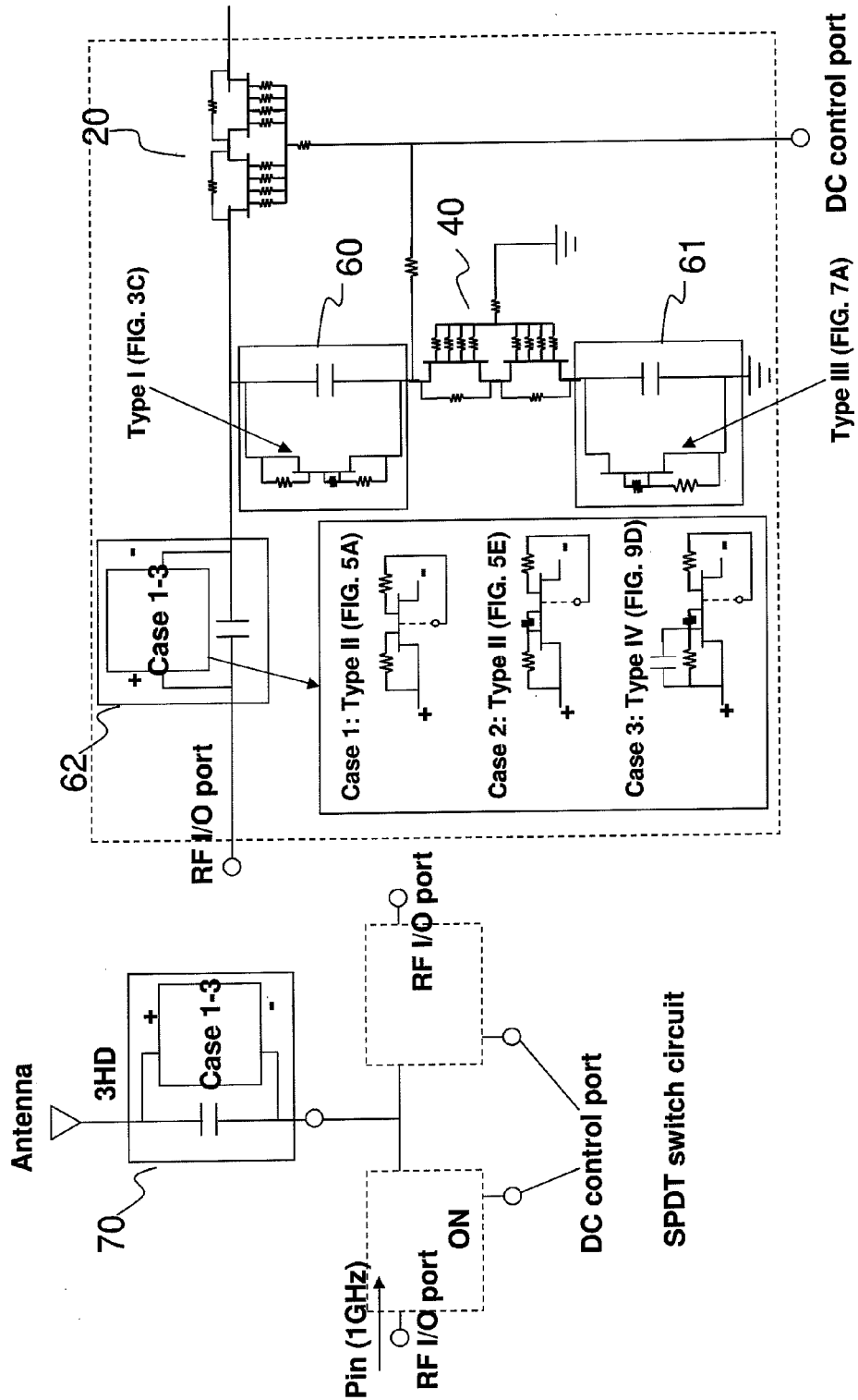
FIGS. 12A and 12B are circuit diagrams showing a SPDT switch circuit and the circuit of each arm in the SPDT switch provided by the present invention.
Figure 13:
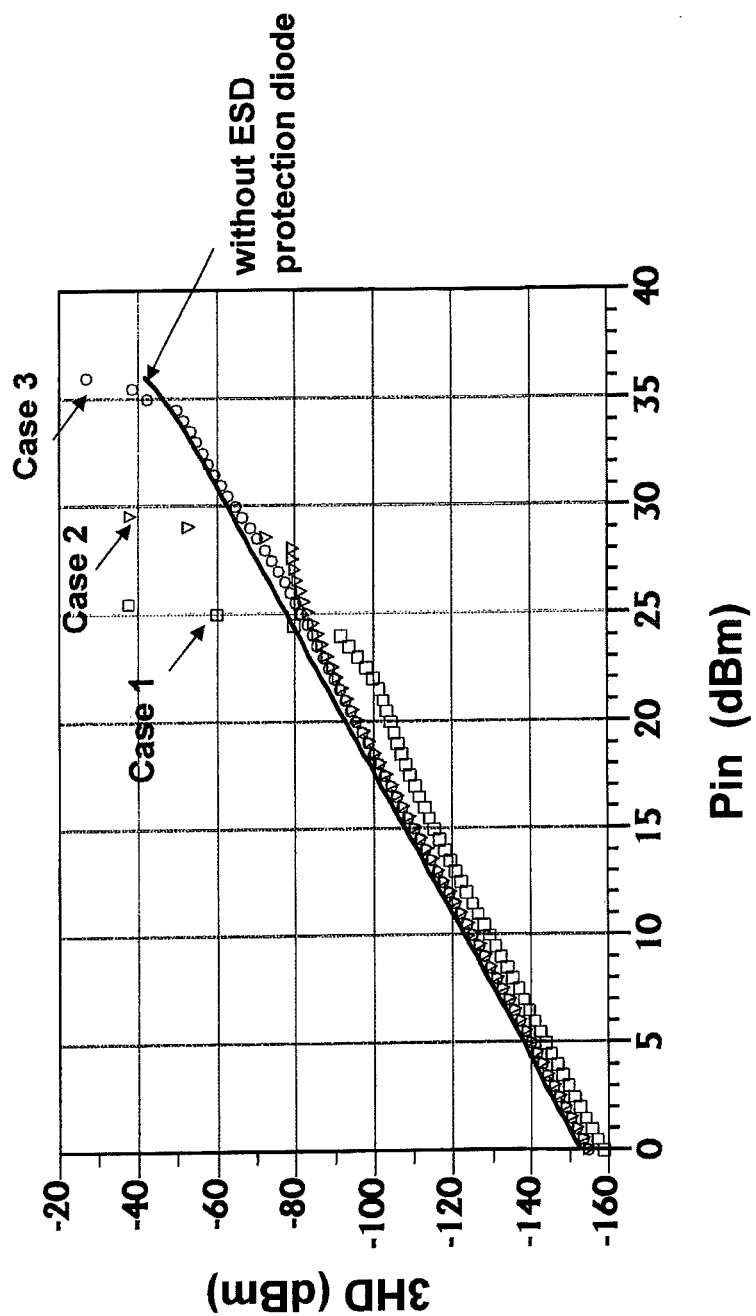
FIG. 13 is a graph showing the third harmonic distortion (3HD) to the power input using different compound semiconductor ESD protection devices in the SPDT switch circuit shown in FIG. 12A.
Figure 14A:
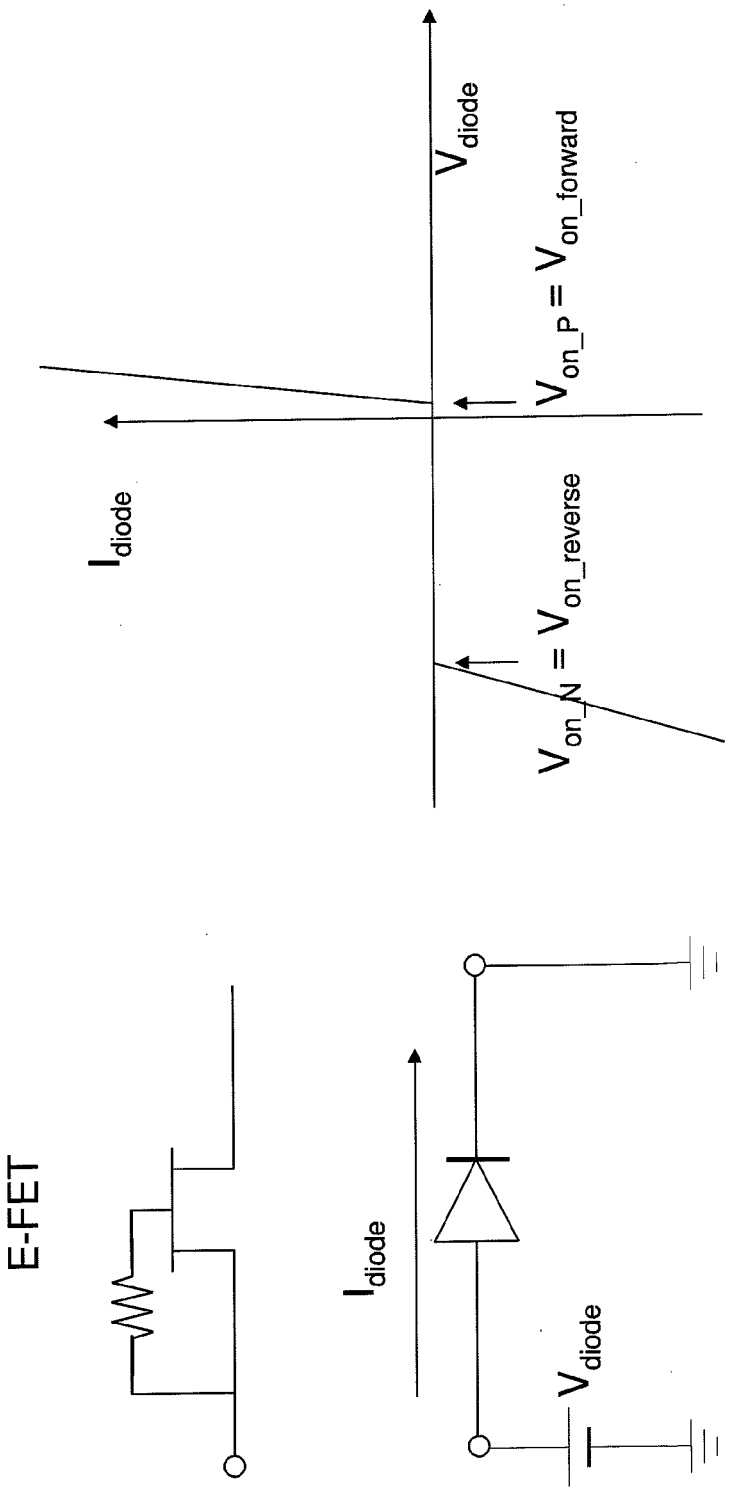
FIG. 14A~14D are schematics showing of ESD protection devices using E-FET diodes and the corresponding I-V curves according to previous technologies.
Figure 14B:
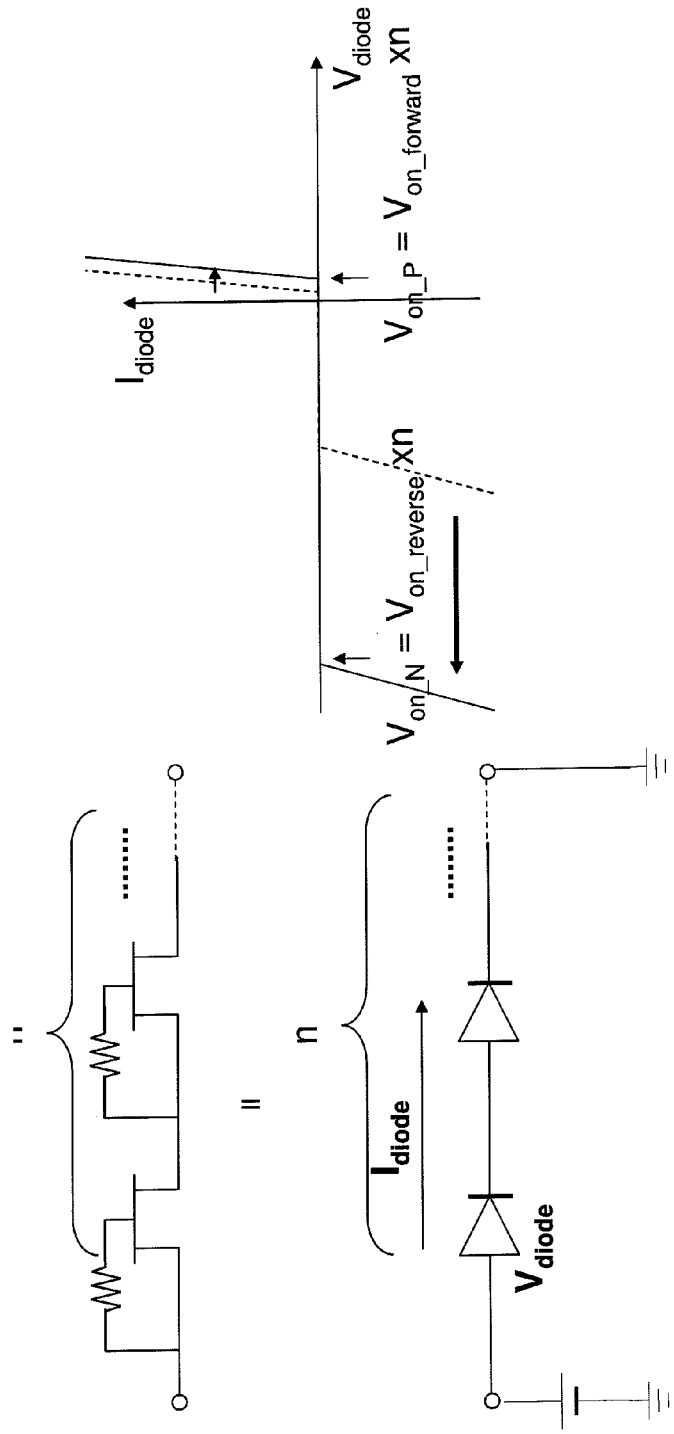
Figure 14C:
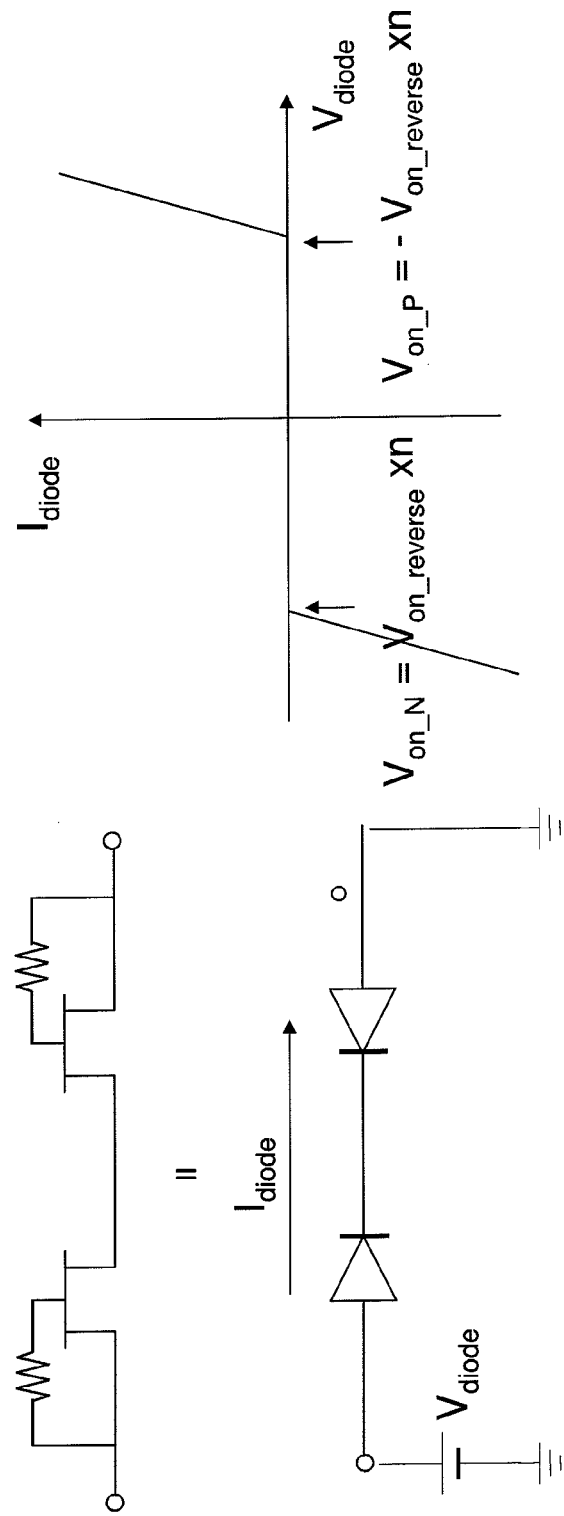
Figure 14D:
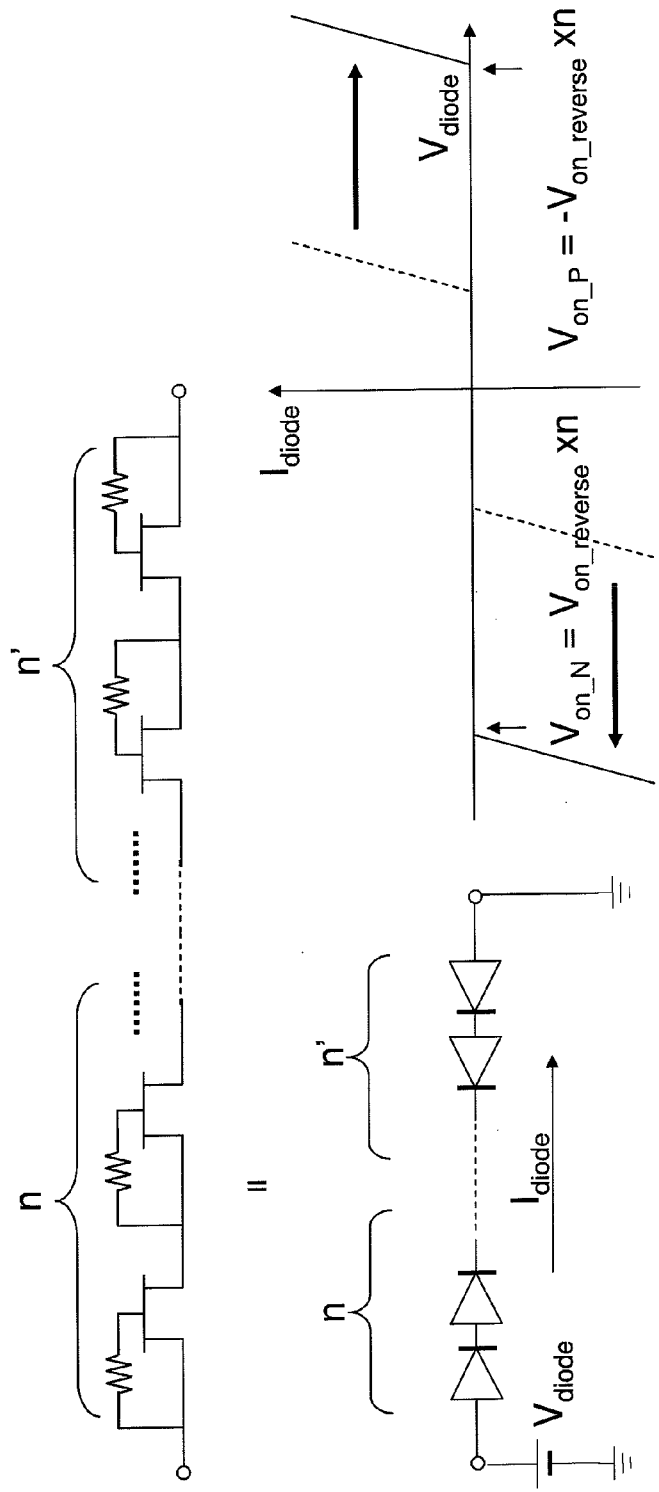

FIG. 12A is a circuit diagram showing an RF switch circuit with an SPDT configuration provided by the present invention. The SPDT switch circuit consists of a left arm and a right arm connected to a center pole. In FIG. 12A, the center pole is connected to an antenna through an ESD protection circuit block 70 provided by the present invention. FIG. 12B is a circuit diagram showing an embodiment of each arm of the SPDT switch circuit shown in FIG. 12A. The basic circuit topology is the same as that shown in FIG. 2. In the shunt branch, the first ESD protection device in the first ESD protection circuit block 60 is a type I compound semiconductor ESD protection device whose circuit diagram is shown in FIG. 3C, and the second ESD protection device in the second ESD protection circuit block 6I is a type III compound semiconductor ESD protection device whose circuit diagram is shown in FIG. 7A. The number of gates and their connection are designed so that the ESD devices remain in the off-state and produce negligible nonlinear signals during the RF operation. The third ESD protection device in the third ESD protection circuit block 62 between the I/O port and the branch node in FIG. 12B and the ESD protection device in the ESD protection circuit block 70 in FIG. 12A comprise a compound semiconductor ESD protection device shown as Case 1 to 3 in FIG. 12B. In Case 1, a Type II ESD protection device with a dual gate FET (FIG. 5A) is used. The device is equivalent to two diode in the same direction connected in series. Case 2 also uses a Type II ESD protection device, but the device is a triple-gate FET with the first and second gates connected to the source (FIG. 5E). In this case, the RF voltage of the input signal applied to the first equivalent diode is sustained by the two gate, and the nonlinear signal produced by the voltage-dependent gate capacitance ($C_{gs}$, $C_{gd}$) is reduced compared with Case 1 where only one gate sustains the RF voltage, In Case 3, a gate capacitor is further added between the source and the first gate (Type IV, FIG. 9D). The gate capacitor reduces the RF voltage across $C_{gs}$, thereby reducing the nonlinear signal generated from $C_{gs}$. The gate capacitor also acts as a feed-forward capacitor that increases the off-state bias voltage applied to $C_{gd}$ on the side opposite to $C_{gs}$, thereby reducing the nonlinear signal generated from $C_{gd}$ as well. The third harmonic distortion (3HD) measured at the antenna port for an RF signal entering into the ON-state arm of the SPDT switch is shown in FIG. 13 as a function of the input power (Pin). The data shown in FIG. 13 are for the case in which 0.5 um gate depletion mode pseudomorphic HEMTs are used for the high frequency circuit 20 and the switching element 40, and 0.5 um gate enhancement mode pseudomorphic HEMTs are used for the compound semiconductor ESD protection devices in the ESD protection circuit blocks 60, 61, 62, and 70. GaAs is used as a substrate for the whole circuit. For Case 1 compound semiconductor ESD protection device, the 3HD increases suddenly at Pin around 24 dBm. In Case 2, in which two gates on the input side in the triple gate are connected together with a resistor, the Pin at which the 3HD sharply rises shifts to 28 dBm. For Case 3 compound semiconductor ESD protection device, in which a feed-forward capacitor is further added, the 3HD becomes stable up to Pin equal to 34 dBm.

To sum up, the present invention can indeed get its anticipated objective to provide compound semiconductor ESD protection devices accomplished. The present invention has the following advantages:
1. The ESD protection circuits provided by the present invention give ESD protection to compound semiconductor high frequency circuits while minimizing the generation of unwanted nonlinear signals from the ESD protection devices.
2. The integrated circuits with compound semiconductor ESD protection devices can be integrated in the same compound semiconductor high frequency circuit chip to reduce the overall module size.
3. The ESD protection circuit block comprising a DC blocking capacitor connected in parallel with an ESD protection device can be use as a building block in an integrated circuit for providing ESD protection. The overall nonlinear signals generated as a result of ESD protection can be reduced. Furthermore, DC blocking and ESD protection can be achieved at the same time, thereby providing more flexibility in the design of an integrated circuit.
4. Multi-gate E-FETs can be used for the ESD protection devices. The total device area for ESD protection circuit can be made smaller, and thereby the chip size of the high frequency circuit can be reduced.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. An integrated circuit, comprising a high frequency circuit, a switching element, a first ESD protection circuit block, and a second ESD protection circuit block, wherein
    the high frequency circuit is connected between a first terminal and a second terminal for inputting or outputting the radio frequency signals;
    each of the first and second ESD protection circuit block comprises a DC blocking capacitor connected between a first point and a second point, and at least one compound semiconductor ESD protection device connected between the first point and the second point in parallel with the DC blocking capacitor;
    the first point of the first ESD protection circuit block is connected to a branch node between the first terminal and the high frequency circuit and the second point of the first ESD protection circuit block is connected to one terminal of the switching element; and
    the first point of the second ESD protection circuit block is connected to the other terminal of the switching element and the second point of the second ESD protection circuit block is connected to the ground.

2. The integrated circuit according to claim 1 further comprising a third ESD protection circuit block, wherein the first point of the third ESD protection circuit block is connected to the first terminal and the second point of the third ESD protection circuit block is connected to the branch node between the first terminal and the high frequency circuit.

3. An integrated circuit, comprising at least one electrostatic discharge (ESD) protection circuit block, which comprises
    a DC blocking capacitor connected between a first point and a second point, and
    at least one compound semiconductor ESD protection device connected between the first point and the second point in parallel with the DC blocking capacitor, wherein at least one compound semiconductor ESD protection device comprises
    a compound semiconductor multi-gate enhancement-mode field effect transistor (E-FET), which comprises a source electrode, a drain electrode, and plural gate electrodes disposed between the source and drain electrodes,
    at least one first resistor, through which the source electrode is connected to at least one of the plural gate electrodes,
    at least one second resistor, through which the drain electrode is connected to at least one of the plural gate electrodes, and
    wherein two gate electrodes among the plural gate electrodes are connected by a third resistor.

4. An integrated circuit, comprising at least one electrostatic discharge (ESD) protection circuit block, which comprises
    a DC blocking capacitor connected between a first point and a second point, and
    at least one compound semiconductor ESD protection device connected between the first point and the second point in parallel with the DC blocking capacitor, wherein at least one compound semiconductor ESD protection device comprises a compound semiconductor multi-gate enhancement-mode field effect transistor (E-FET), which comprises a source electrode, a drain electrode, and plural gate electrodes disposed between the source and drain electrodes, at least one first resistor, through which the source electrode is connected to at least one of the plural gate electrodes, at least one second resistor, through which the drain electrode is connected to at least one of the plural gate electrodes, and wherein the source and drain electrodes are multi-finger electrodes interposed each other, and the plural gate electrodes are meandering gate electrodes disposed between the source and drain electrodes.

5. An integrated circuit, comprising at least one electrostatic discharge (ESD) protection circuit block, which comprises a DC blocking capacitor connected between a first point and a second point, and at least one compound semiconductor ESD protection device connected between the first point and the second point in parallel with the DC blocking capacitor, wherein at least one compound semiconductor ESD protection device comprises a compound semiconductor multi-gate E-FET, which comprises a source electrode, a drain electrode, and plural gate electrodes disposed between the source and drain electrodes, and at least one fourth resistor, through which at least one of the plural gate electrodes is connected to at least one of the inter-gate regions between two adjacent gate electrodes.

6. The integrated circuit according to claim 5, wherein the plural gate electrodes are connected to the source or drain electrodes through at least one fifth resistor.

7. The integrated circuit according to claim 6, wherein two gate electrodes among the plural gate electrodes are connected by a sixth resistor.

8. The integrated circuit according to claim 5, wherein two gate electrodes among the plural gate electrodes are connected by a sixth resistor.

9. The integrated circuit according to claim 5, wherein the source and drain electrodes are multi-finger electrodes interposed each other, and the plural gate electrodes are meandering gate electrodes disposed between the source and drain electrodes.

10. An integrated circuit, comprising at least one electrostatic discharge (ESD) protection circuit block, which comprises a DC blocking capacitor connected between a first point and a second point, and at least one compound semiconductor ESD protection device connected between the first point and the second point in parallel with the DC blocking capacitor, wherein at least one compound semiconductor ESD protection device comprises a compound semiconductor multi-gate E-FET, which comprises a source electrode, a drain electrode, and plural gate electrodes disposed between the source and drain electrodes, at least one seventh resistor through which at least one of the plural gate electrodes is connected to the source or drain electrodes, and two gate electrodes among the plural gate electrodes are connected by an eighth resistor.

11. The integrated circuit according to claim 10, wherein the source and drain electrodes are finger electrodes interposed each other, and the plural gate electrodes are multi-finger electrodes interposed each other disposed between the source and drain electrodes.

12. The integrated circuit according to claim 10, wherein the source and drain electrodes are multi-finger electrodes interposed each other, and the plural gate electrodes are meandering gate electrodes disposed between the source and drain electrodes.

13. An integrated circuit, comprising at least one electrostatic discharge (ESD) protection circuit block, which comprises a DC blocking capacitor connected between a first point and a second point, and at least one compound semiconductor ESD protection device connected between the first point and the second point in parallel with the DC blocking capacitor, wherein at least compound semiconductor ESD protection device comprises a compound semiconductor multi-gate E-FET, which comprises a source electrode, a drain electrode, and plural gate electrodes disposed between the source and drain electrodes, at least one ninth resistor, through which each of the plural gate electrodes is DC-connected to the source electrode, the drain electrode, or an inter-gate region between two adjacent gate electrodes, and at least one gate capacitor, through which at least one of the plural gate electrodes is AC-connected to the source electrode, the drain electrode, or an inter-gate region between two adjacent gate electrodes.

14. The integrated circuit according to claim 13, wherein two gate electrodes among the plural gate electrodes are connected by a tenth resistor.

15. The integrated circuit according to claim 13, wherein the source and drain electrodes are multi-finger electrodes interposed each other, and the plural gate electrodes are multi-finger electrodes interposed each other disposed between the source and drain electrodes.

16. The integrated circuit according to claim 13, wherein the source and drain electrodes are multi-finger electrodes interposed each other, and the plural gate electrodes are meandering gate electrodes disposed between the source and drain electrodes.

17. An integrated circuit, comprising at least one electrostatic discharge (ESD) protection circuit block, which comprises a DC blocking capacitor connected between a first point and a second point, and at least one compound semiconductor ESD protection device connected between the first point and the second point in parallel with the DC blocking capacitor, wherein at least one compound semiconductor ESD protection device comprises plural compound semiconductor single-gate E-FETs connected in series, each comprises a source electrode, a drain electrode, and a gate electrode, wherein the drain electrode of a single-gate E-FET is connected to the source electrode of a succeeding single-gate E-FET, at least one eleventh resistor, through which the gate electrode of each of the plural single-gate E-FETs is DC-connected to the source or the drain electrodes of one of the plural single-gate E-FETs, and at least one gate capacitor, through which the gate electrode of at least one of the plural single-gate E-FETs is AC-connected to the source or the drain electrodes of one of the plural single-gate E-FETs.

18. The integrated circuit according to claim 17, wherein the gate electrodes of two single-gate E-FETs among the plural single-gate E-FETs are connected by a twelfth resistor.

19. The integrated circuit according to claim 1, wherein the switching element comprises at least one depletion mode FET or HEMT.

20. The integrated circuit according to claim 1, wherein the high frequency circuit comprises an RF switching circuit.

* * * * *